United States Patent [19]
Gregory et al.

[11] Patent Number: 5,748,488
[45] Date of Patent: May 5, 1998

[54] METHOD FOR GENERATING A LOGIC CIRCUIT FROM A HARDWARE INDEPENDENT USER DESCRIPTION USING ASSIGNMENT CONDITIONS

[75] Inventors: Brent L. Gregory, Sunnyvale; Russell B. Segal, Mountain View, both of Calif.

[73] Assignee: Synopsys, Inc., Mountain View, Calif.

[21] Appl. No.: 478,068

[22] Filed: Jun. 7, 1995

Related U.S. Application Data

[63] Continuation of Ser. No. 632,439, Dec. 21, 1990, abandoned.

[51] Int. Cl.$^6$ .................................................. G06F 17/50
[52] U.S. Cl. ................................................................ 364/490
[58] Field of Search ............................ 395/800; 364/489, 364/490

[56] References Cited

U.S. PATENT DOCUMENTS

| | | | |
|---|---|---|---|
| 3,458,240 | 7/1969 | Hanson | 328/92 |
| 4,342,093 | 7/1982 | Miyoshi | 364/578 |
| 4,677,587 | 6/1987 | Zemany, Jr. | 364/900 |
| 4,703,435 | 10/1987 | Darringer | 364/489 |
| 4,725,971 | 2/1988 | Doshi et al. | 364/578 |

(List continued on next page.)

OTHER PUBLICATIONS

Russell B. Segal, *BDSYN: Logic Description Translator, BDSIM: Switch–level Simulator* 1–90, Electronics Research Laboratory, University of California, Berkeley, CA (May 21, 1987).

Laung–Terng Wang et al., *SSIM: A Software Levelized Compiled–Code Simulator* 2–8, 24th ACM/IEEE Design Automation Conference, Paper 2.1 (1987).

D.E. Thomas et al., *The System Architect's Workbench* 337–343, 25th ACM/IEEE Design Automation Conference, Paper 23.2 (1988).

(List continued on next page.)

*Primary Examiner*—Eric Coleman
*Attorney, Agent, or Firm*—Skjerven, Morrill, MacPherson, Franklin & Friel; Forrest E. Gunnison

[57] ABSTRACT

A method and system are provided for generating a logic network using a hardware independent description means. A logic circuit synthesizer, in response to a user description specifying only signals and the circumstances under which the signals are produced, generates a logic network that generates the signals specified in the user description, e.g., a net list of logic elements, such as logic gates, high impedance drivers, level sensitive latches and edge sensitive flip-flops along with the interconnections of the logic elements. In one embodiment, the logic circuit synthesizer includes a preprocessor means and a logic circuit generator means. The preprocessor means, in response to the user description, converts signals and conditions in the user description into a structure having nodes interconnected by edges. The edges include an edge condition under which the edge is traversed. The logic circuit generator, using the structure and the edge conditions, creates a logic network that generates the signals specified in the user description.

14 Claims, 25 Drawing Sheets

Microfiche Appendix Included
(3 Microfiche, 205 Pages)

U.S. PATENT DOCUMENTS

| | | | |
|---|---|---|---|
| 4,725,975 | 2/1988 | Sasaki | 364/900 |
| 4,792,909 | 12/1988 | Serlet | 364/491 |
| 4,792,913 | 12/1988 | Buckland | 364/602 |
| 4,833,619 | 5/1989 | Shimizu | 364/489 |
| 4,882,690 | 11/1989 | Shinsa | 364/489 |
| 4,896,272 | 1/1990 | Kurosawa | 364/490 |
| 4,922,445 | 5/1990 | Mizoue et al. | 364/578 |
| 4,924,429 | 5/1990 | Kurashita | 364/578 |
| 5,007,018 | 4/1991 | Rutherford | 395/183.13 |
| 5,029,102 | 7/1991 | Drumm et al. | 364/489 |
| 5,055,718 | 10/1991 | Galbraith et al. | 307/465 |
| 5,067,091 | 11/1991 | Nakazawa | 364/490 |
| 5,068,812 | 11/1991 | Schaefer et al. | 364/578 |
| 5,095,441 | 3/1992 | Hopper et al. | 364/489 |
| 5,126,966 | 6/1992 | Hafeman et al. | 364/500 |
| 5,128,871 | 7/1992 | Schmitz | 364/490 |
| 5,146,583 | 9/1992 | Matsunaka | 395/500 |
| 5,150,308 | 9/1992 | Hooper et al. | 364/489 |
| 5,175,814 | 12/1992 | Anick et al. | 395/161 |
| 5,189,629 | 2/1993 | Kohnen | 364/490 |
| 5,197,016 | 3/1993 | Sugimoto | 364/489 |
| 5,198,705 | 3/1993 | Galbraith et al. | 307/465 |
| 5,222,030 | 6/1993 | Dangelo et al. | 364/489 |
| 5,237,513 | 8/1993 | Kaplan | 364/490 |
| 5,243,538 | 9/1993 | Okuzawa et al. | 364/489 |
| 5,253,363 | 10/1993 | Hyman | 395/800 |
| 5,257,201 | 10/1993 | Berman | 364/489 |
| 5,259,006 | 11/1993 | Price et al. | 375/107 |
| 5,274,793 | 12/1993 | Kuroda | 395/500 |
| 5,291,612 | 3/1994 | Sosic et al. | 395/800 |
| 5,359,537 | 10/1994 | Saucier et al. | 364/489 |
| 5,359,539 | 10/1994 | Matsumoto | 364/489 |
| 5,377,122 | 12/1994 | Werner et al. | 364/488 |
| 5,392,227 | 2/1995 | Hiserote | 364/578 |
| 5,437,037 | 7/1995 | Furuichi | 395/700 |
| 5,461,574 | 10/1995 | Matsunaga | 364/489 |
| 5,526,277 | 6/1996 | Dangelo et al. | 364/489 |
| 5,544,066 | 8/1996 | Rostoker et al. | 364/489 |

OTHER PUBLICATIONS

Raul Camposano, *Design Process Model in the Yorktown Silicon Compiler* 489–494, 25th ACM/IEEE Design Automation Conference, Paper 32.3 (1988).

G. Colon–Bonet et al. *On Optimal Extraction of Combinational Logic and Don't Care Sets from Hardware Description Languages* 308–311, IEEE Design & Test (1989).

A.J. Van Der Hoeven et al., *A Model for the High–Level Description and Simulation of VLSI Networks* 41–48, IEEE Design & Test of Computers (Aug. 1990).

Peter M. Maurer et al., *Techniques For Unit–Delay Compiled Simulation* 480–484, 27th ACM/IEEE Design Automation Conference, Paper 27.1 (1990).

Zhicheng Wang et al., *LECSIM: A Levelized Event Driven Compiled Logic Simulator* 491–496, 27th ACM/IEEE Design Automation Conference, Paper 27.3 (1990).

J. Bhasker et al., *An Optimizer For Hardware Synthesis* 20–36, IEEE Design & Test of Computers (Oct. 1990).

Giovanni De Micheli, *High–Level Syntheses of Digital Circuits* 6–7, IEEE Design & Test of Computers (Oct. 1990).

R. Camposano, *From Behavior to Structures: High–Level Synthesis* 8–19, IEEE Design & Test of Computers (Oct. 1990).

Giovanni De Micheli et al., *The Olympus Syntheses System* 37–53, IEEE Design & Test of Computers (Oct. 1990).

Roger Lipsett, *VHDL–The Language* 28–41, IEEE Design & Test (Apr. 1986).

Alfred S. Gilman, *HDL–The Designer Environment* 42–47, IEEE Design & Test (Apr. 1986).

Elementary Pascal by H. Ledgard, et al. 1st Ed., Vintage Books, Feb. 1982, pp. 46–48, 66–75.

METHOD FOR GENERATING A LOGIC CIRCUIT FROM A HARDWARE INDEPENDENT USER DESCRIPTION USING ASSIGNMENT CONDITIONS

This application is a continuation of application Ser. No. 07/632,439, filed Dec. 21, 1990, now abandoned.

CROSS REFERENCE TO MICROFICHE APPENDIX

Appendix A, which is a part of the present disclosure, is a microfiche appendix consisting of 3 sheets of microfiche having a total of 205 frames. Microfiche Appendix A is a listing of computer programs and related data for one embodiment of the logic synthesizer of this invention, which is described more completely below.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates generally to methods and systems used to convert a hardware language description to a logic circuit and in particular to a method and system for synthesizing a logic circuit from a user description with conditional assignments of values to logic variables and no hardware specific descriptions.

2. Prior Art

The automated design of application specific integrated circuits as well as the programming of either programmable logic devices or programmable gate arrays requires specification of a logic circuit by the user. Historically, a user was required typically to supply either a logic schematic diagram for use in the automated design process or a set of boolean equations that specified the function of the logic network. The automated logic design system used this information to produce a user specific circuit.

However, many designers had neither a specific schematic diagram nor general boolean logic equations to describe the desired logic operations of the circuit. Hardware description language (HDL) was developed to assist such designers. A hardware description language provided the designer with a means for describing the operation of the desired logic circuit: that was at least one level of abstraction removed from a schematic diagram or a set of boolean logic equations. Also, HDL is a more compact representation of a circuit than the net lists that were historically used to represent circuits. Another significant advantage of HDL is that the HDL circuit description is technology independent. In a net list, logic gates from a particular vendor's library are used. With a HDL description, the description is not at the logic gate level.

Ideally, HDL would permit the user to describe only the desired operation of the logic circuit, i.e., the signals generated by the logic circuit. The automated logic design system would then translate the described operation into a logic circuit that was subsequently used in the automated logic design process.

Unfortunately, hardware description language generally permitted only an operational description of simple circuit elements. For many circuit elements, such as high impedance drivers, level sensitive latches and edge sensitive flip-flops, the designer was required first to specify the specific circuit element and then the desired connection of that element using the HDL. Thus, while HDL purportedly allowed a higher level of abstraction in the specification of the logic circuit, HDL descriptions still required detailed logic knowledge for most practical circuits.

Thus, only designers that have knowledge of both the use and operation of logic elements and the desired operational features of the logic circuit can use HDL successfully. An automated logic design system with a logic circuit element independent HDL that required only knowledge of the desired operational features of the logic circuit would greatly enhance the productivity and versatility obtained with automated logic design systems, because such a system could be used by designers with limited logic knowledge. The advantages of automated logic design would be available to a far greater number of users. In spite of the general recognition of this dilemma, a system with a logic circuit element independent HDL is currently unavailable.

SUMMARY OF THE INVENTION

According to the principles of this invention, a method and system are provided for generating a logic network using a hardware independent description means. A logic circuit synthesizer, in response to a user description specifying only signals and the circumstances under which the signals are produced, generates a logic network that generates the signals specified in the user description, e.g., a net list of logic elements, such as logic gates, high impedance drivers, level sensitive latches and edge sensitive flip-flops along with the interconnections of the logic elements.

In one embodiment, the logic circuit synthesizer includes a preprocessor means and a logic circuit generator means. The preprocessor means, in response to the user description, converts signals and other information in the user description into a structure having nodes interconnected by edges. The edges include an edge condition under which the edge is traversed. The logic circuit generator, using the structure and the edge conditions, creates a logic network that generates the signals specified in the user description.

The user description is a sequence of statements that specify how the desired digital hardware operates. Specifically, the user description describes values assigned to logic variables and the conditions under which those values are assigned wherein each logic variable assigned a value represents a signal. Specification of any specific logic element, such as a flip-flop, or any connections between logic elements to generate the desired signals is not required in the user description.

Consequently, the synthesizer of this invention creates the logic network not as in the prior art systems where the choice of logic components was stated at least partially explicitly, but rather where the choice of logic components is implied by the signals and structure specified by the user. Such descriptions are easier to produce, understand, and maintain than the typical prior art description so that the user realizes significant savings in the cost of designing digital hardware.

In one embodiment, the preprocessor includes a control flow graph generating means for creating the structure having nodes and edges. The control flow graph generator creates a control flow graph, which consists of nodes and edges, and in particular split nodes, join nodes, and operation nodes. The control flow graph may include edges that go from one node in the graph to any other subsequent node in the graph. The ability to jump from one node to any subsequent node in the graph represents a significant enhancement in the capability of the control flow graph to represent a wide variety of user descriptions.

The preprocessor also includes an edge condition generating means for determining edge conditions for an edge in the control flow graph. The edge condition generator within the preprocessor generates the condition under which a node in the control flow graph is reached. Specifically, for each edge in the control flow graph, the conditions that must be satisfied to reach that edge in the graph are determined and assigned to the edge. The condition generated is an "activation condition" in one embodiment and a "mux condition" in another embodiment.

The logic circuit generator, using the edge activation conditions, or alternatively the mux conditions, and information associated with the nodes of the control flow graph converts the control flow graph into a logic network. In one embodiment, an assignment condition generator in the logic circuit generator first determines a set of assignment conditions for each variable assigned a value in the control flow graph, i.e., each signal specified by the user. The assignment conditions for a set of hardware description functions, are subsequently used by a hardware generator to create the a logic network that generates the signals represented by the logic variables in the control flow graph.

Hence, according to the principles of this invention, the hardware generator creates a logic circuit for each variable that is assigned a value in the user description, i.e., each signal specified by the user, and interconnects the logic circuits to form the logic network that generates the specified signals under the conditions specified by the user.

In one embodiment, the assignment condition generator determines an assignment condition for each function in a set of functions for each variable that is assigned a value in the user description. Herein, a function is a means to differentiate between the hardware elements that are required in the logic network that is synthesized. Specifically, the set of functions are hardware description functions that in combination with the assignment conditions, which are the values of the hardware description functions, define the logic elements that comprise the logic network.

In one embodiment the set of hardware description functions includes a group of asynchronous functions and a group of synchronous functions. If the assignment conditions for the group of synchronous functions are all zero, the asynchronous functions and assignment conditions are used by the hardware generator to create logic circuits that include logic nodes such as AND and OR gates and invertors as well as complex logic elements such as three-state drivers and level sensitive latches.

Similarly, if the assignment conditions for the group of asynchronous functions are all zero, the synchronous functions and assignment conditions are used by the hardware generator to create logic circuits that include logic nodes such as AND and OR gates and invertors as well as complex logic elements such as three-state drivers and edge-triggered flip-flops. When the assignment conditions include non-zero assignment conditions for both the synchronous and asynchronous functions, the hardware generator creates logic circuits that may include logic nodes such as AND and OR gates and invertors as well as complex logic elements such as three-state drivers, and edge-triggered flip-flops. Also, in this case, the edge-triggered flip-flops may include a clear-direct terminal and a set-direct terminal.

Hence, the hardware generator synthesizes a logic network based upon the information provided by the assignment condition generator. However, the hardware generator preferably boolean minimizes the assignment conditions prior to creation of the logic circuit. In addition, the hardware description functions may include a "don't care" function (don't care function) such that when the user assigns a value of don't care to a variable, an assignment condition is generated for the don't care function. The hardware generator uses the don't care function assignment condition to boolean minimize the logic circuit that is created.

In one embodiment, the hardware description functions include an asynchronous load function, an asynchronous data function, an asynchronous high impedance function, a synchronous load function, a synchronous data function, a synchronous high impedance function, and a "don't care" function. The asynchronous load function tells the condition under which a variable has been asynchronously assigned any value. The asynchronous data function tells the condition under which a variable has been asynchronously assigned the value one. The "don't care" function tells the condition under which a variable has been assigned a value of "don't care" by the user. Assigning the value don't care to a variable means that the variable may be assigned either a logic one or logic zero value. Thus, the "don't care" function tells the condition where the value of a variable is not important. The asynchronous high impendance function tells the condition under which a variable has been asynchronously assigned the value of a high impedance state. Thus, the asynchronous high impedance function tells the conditions where the value of a variable is high impedance.

The synchronous load function tells the condition under which a variable has been assigned any value on a clock edge. The synchronous data function tells the condition under which a variable has been assigned the value one on a clock edge. The synchronous high impendance function tells the condition under which a variable has been synchronously assigned the value of a high impendance state. Thus, the synchronous high impedance function tells the conditions where the value of a variable is high impendance.

In this embodiment, the value of the synchronous data function is only important when the synchronous load function is TRUE. Thus, the synchronous data function is preferably boolean minimized with the NOT of the value of the synchronous load function as a don't care condition by the hardware generator. Also, in this embodiment, the values of asynchronous data, don't care and asynchronous high impendance functions are only important when the asynchronous load function is TRUE. Thus, asynchronous data, don't care, and asynchronous high impendance functions are preferably boolean minimized with the NOT of the value of the asynchronous load function as a don't care condition by the hardware generator.

The hardware generator creates the logic elements necessary to generate the signal represented by each assignment condition. Thus, in the following description of the operation of the hardware generator, the steps necessary to create logic elements for a set of assignment conditions are not repeated. When an assignment condition simply is described as driving a particular logic element or line, an earlier description was provided on the hardware necessary to generate that assignment condition.

For a variable where the assignment conditions for the synchronous functions are all zero, the assignment condition for the asynchronous load function is a logic one, and the assignment condition for the asynchronous data function is non-zero, the logic nodes necessary to generate the asynchronous data function assignment condition are interconnected to form the logic circuit for the variable by the hardware generator.

For a variable where the assignment conditions for the synchronous functions are all zero, the assignment condition for the asynchronous load function is not a constant, and the assignment condition for the asynchronous data function is non-zero, the hardware generator creates a level sensitive latch. The asynchronous data function assignment condition (constructed as described above) drives the input terminal of the level sensitive latch and the asynchronous load function assignment condition drives the gate terminal of the latch. The signal on the output line of the latch is the value of the variable.

For a variable where the assignment conditions for the synchronous functions are all zero, the assignment condition for the asynchronous high impendance function and the asynchronous load function are not constants, and the assignment condition for the asynchronous data function is non-zero, the hardware generator creates two level sensitive latches and a three-state driver. The asynchronous data function assignment condition drives the input terminal of a first level sensitive latch and the asynchronous load function assignment condition drives the gate terminal of the latch. The signal on the output line of the first latch drives the input line of the three-state driver, sometimes referred to a three-state element. The asynchronous high impendance assignment condition drives the input line of a second level sensitive latch and the asynchronous load function assignment condition drives the gate terminal of the latch. The signal on the output line of the second latch drives an invertor which in turn drivers the data enable line of the three-state driver.

For a variable where the assignment conditions for the synchronous functions are all zero, the assignment condition for the asynchronous high impendance function is not a constant, the asynchronous load function is a logical one, and the assignment condition for the asynchronous data function is non-zero, the hardware generator creates only a logic circuit that generates the asynchronous data function assignment condition and a three-state driver. The asynchronous data function assignment condition drives the input line of the three-state driver. The asynchronous high impendance assignment condition drives an invertor which in turn drives the data enable line of the three-state driver.

For a variable where the assignment conditions for the asynchronous functions are all zero, the assignment condition for the synchronous load function is a logic one, and the assignment condition for the synchronous data function is non-zero, an edge sensitive flip-flop is created by the hardware generator. The synchronous data function assignment condition drives the input line of the flip-flop. The clock associated with the synchronous functions drives the clock terminal of the flip-flop. The signal on the output line of the flip-flop is the value of the variable.

For a variable where the assignment conditions for the asynchronous functions are all zero, the assignment condition for the synchronous load function is not a constant, and the assignment condition for the synchronous data function is non-zero, a two-to-one multiplexer and an edge sensitive flip-flop are created by the hardware generator. The synchronous data function assignment condition drives a first input terminal of the two-to-one feedback multiplexer. The synchronous load function assignment condition drives the data input select line of the multiplexer. The signal on the output line of the multiplexer drives the input line of an edge-triggered flip-flop. The clock associated with the synchronous functions drives the clock terminal of the flip-flop. The signal on the output line of the flip-flop is fedback to a second input terminal of the multiplexer. The value of the variable is the signal on the output line of the flip-flop.

For a variable where the assignment conditions for the asynchronous functions are all zero, the assignment condition for the synchronous high impendance function is not a constant, the synchronous load function is a logic one, and the assignment condition for the synchronous data function is non-zero, the hardware generator creates two edge triggered flip-flops and a three-state driver. The synchronous data function assignment condition drives the input terminal of the first edge-triggered flip-flop. The signal on the output line of the first flip-flop drives the input line of the three-state driver. The synchronous high impendance assignment condition drives the input line of a second edge-triggered flip-flop. The signal on the output line of the second flip-flop drives an invertor which in turn drives the data enable line of the three-state driver. The clock associated with the synchronous functions drives the clock terminal of the first flip-flop and the second flip-flop.

For a variable where the assignment conditions for the asynchronous functions are all zero, the assignment condition for the synchronous high impendance function is not a constant, the synchronous load function is not a constant, and the assignment condition for the synchronous data function is non-zero, the logic circuit created by the hardware generator is the same as when the synchronous load assignment condition is a logic one, except two feedback multiplexers are added to the circuit. One feedback multiplexer is inserted in the input line to the first flip-flop, as was previously described, and the other feedback multiplexer is similarly inserted in the input line of the second flip-flop.

For a variable where the assignment condition for the asynchronous load function is non-zero, the asynchronous data function assignment condition is zero, and the assignment conditions for the synchronous load function and the assignment condition for the synchronous data function are non-zero, a edge-triggered flip-flop is created by the hardware generator. The flip-flop has a clear-direct terminal that is driven by the assignment condition of the asynchronous load function assignment condition.

For a variable where the assignment conditions for the asynchronous load function, synchronous load function, and synchronous data function are non-zero, and the assignment condition for the asynchronous data function is a logic one, a edge-triggered flip-flop is again created by the hardware generator. The flip-flop has a set-direct terminal that is driven by the assignment condition of the asynchronous load function assignment condition.

For a variable where the assignment condition for the asynchronous load function is non-zero, the asynchronous data function assignment condition is not a constant, and the assignment conditions for the synchronous load function and the assignment condition for the synchronous data function are non-zero, a edge-triggered flip-flop is also created by the hardware generator. The flip-flop has a set-direct terminal and a clear-direct terminal. Logic is created by the hardware generator such that the asynchronous assignment conditions drive the set-direct and clear-direct terminals so that the appropriate signal is applied to the output line of the flip-flop.

When the asynchronous load function assignment condition is non-zero and the synchronous functions' assignment conditions are non-zero, the assignment conditions for the synchronous functions are boolean minimized by the hardware generator with the asynchronous load function assignment condition as a don't care condition. Thus, the hardware generator is a logic circuit generating means that creates a specific logic element for predetermined assignment conditions.

According to the principles of this invention, a method is provided for synthesizing a logic circuit from a user description that includes only operational characteristics of the logic circuit, e.g., signals and the circumstances under which those signals are generated. The method includes the steps of (i) generating a structure having nodes interconnected by edges where in the structure, variables representing signals are assigned values in the nodes and the edges are assigned conditions under which the edge is reached; and (ii) generating a logic network using the structure and edge conditions.

In one embodiment, the structure generating step includes (i) generating a control flow graph having nodes and edges wherein a variable is assigned a value in a node and the edges define the paths between nodes; and (ii) generating an edge condition for edges in the control flow graph where an edge condition is the condition under which a variable in the node associated with that edge is assigned a value.

The logic network generating step also may include (i) generating a set of assignment conditions for each variable assigned a value in the flow control graph; and (ii) generating a logic circuit for each set of assignment conditions where the interconnected logic circuits form the logic network. As explained above the assignment conditions, in one embodiment are the values of a set of hardware description functions. In this method, the hardware description functions, the hardware created for the various predetermined assignment conditions, and the boolean optimizations, as described above and incorporated herein by reference, are utilized in the logic network generating step.

BRIEF DESCRIPTION OF THE DRAWINGS

FIG. 2 illustrates the control flow graph created by graph generator 132 of this invention for the user description in able 46.

DETAILED DESCRIPTION

According to the principles of this invention, a method and system are provided for generating a logic network, sometimes referred to as a logic circuit, using a hardware independent description means, sometimes called a hardware description language. Unlike, the prior art methods that required at least a detailed knowledge of the characteristics and operations of complex logic elements such as high impendance drivers, level sensitive latches and edge sensitive flip-flops, only a knowledge of the desired operation of the resulting logic network is required to generate the logic network according to the principles of this invention.

Figure 1:
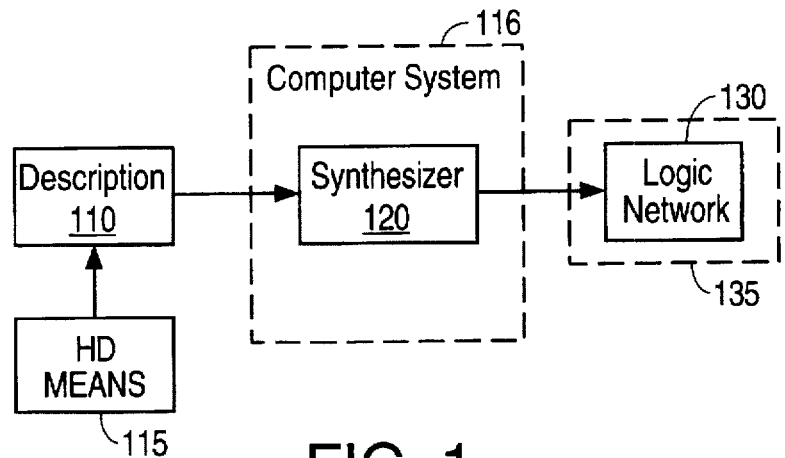
FIG. 1 is a block diagram of the hardware description language synthesizer 120 of this invention.

Thus, the system and method of this invention allow a user with minimal knowledge of specific logic elements to generate a logic network that may be subsequently mapped and optimized using any automated logic design system. The system and method of this invention are operable in a computer system that includes a data input device, such as a keyboard, a processing unit, and an output display device. In one embodiment, the user provides a description 110 (FIG. 1) of the operation of the logic network using hardware description means 115. Description 110 is a sequence of statements that specify how the desired digital hardware operates, i.e., the signals generated by the hardware. Specifically, description 110 describes values assigned to logic variables and the circumstances under which those values are assigned, i.e., description 110 specifies the signals and the circumstances under which those signals are produced. Specification of any specific logic element, such as a flip-flop, or any connections between logic elements so as to create the desired signals are not required in user description 110. Typically, the user provides description 110 using the computer system data input device.

With hardware description means 115, the user expresses the operations, i.e., production of signals, by the logic circuit in description 110. For example, to express a high impendance state for a variable, hardware description means 115 instructs the user to set the variable equal to the character "Z". Similarly, if the user does not care about the logic state of a variable, hardware description means 115 instructs the user to set the variable equal to the character "X". Hardware description means 115 requires no specific knowledge about the operation or structure of any logic circuit element. Rather, hardware description means 115, as described more completely below, requires only a knowledge of the desired circuit's operation and a general knowledge of the use of HDL(Hardware Description Language). Herein, a variable represents a signal desired by the user in the logic circuit.

Hardware description language synthesizer 120, in response to description 110, converts hardware independent description 110 into a logic network 130. Synthesizer 120 is loaded in computer system 116 using techniques known to those skilled in the art. Synthesizer 120 independently determines the logic elements required and the interconnections of the logic elements based upon the operational characteristics specified in description 110. The user does not include any hardware specific limitations in description 110.

Consequently, HDL synthesizer 120, sometimes referred to as logic network synthesizer 120, creates logic network 130, not as in the prior art systems where the choice of logic components for the synthesis was stated at least partially explicitly, but rather where the choice of logic components is implied by the signals and circumstances specified in description 110. Such descriptions are easier to produce, understand, and maintain than the typical prior art description so that the user realizes significant savings in the cost of designing digital hardware. Synthesizer 120 generates logic network 130 on output display device 135 of computer system 116.

In one embodiment, the computer programs presented in Microfiche Appendix A were used in a workstation such as the SUN-4 computer system available from Sun Microsystems of Palo Alto, Calif. The computer programs were processed using the UNIX operating system SUN OS 4.0.3, the compiler, and linker provided with the SUN-4 computer system. The particular computer language and the computer system used are not an essential aspect of this invention. In view of this disclosure, those skilled in the art can implement the invention using a different computer language and/or a different computer system.

Figure 2:
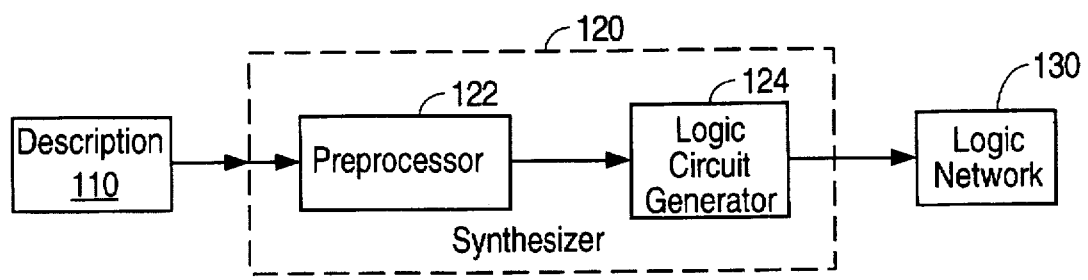
FIG. 2 is a more detailed block diagram of the hardware description language synthesizer 120 of this invention showing preprocessor 122 and logic circuit generator 124.

In one embodiment, synthesizer 120 (FIG. 1) includes a preprocessor 122 and a logic circuit generator 124 (FIG. 2). Preprocessor 122 receives the signal information specified in description 110. Preprocessor 122 first parses description 110. Preprocessor 122 converts the parsed description into a specific structure, a control flow graph, described more completely below, which consists of nodes and edges.

Subsequently, preprocessor 122 determines edge conditions for each edge in the control flow graph. The edge conditions and the information at the nodes of the control flow graph, i.e., the signals specified in user description 110 and the circumstances under which the signals are generated, are input information for logic circuit generator 124. Using only this information, logic circuit generator 124 automatically creates logic network 130. Logic network 130 is specified typically as a net list. Alternatively, the net list may be converted to a schematic logic diagram. The important aspect is that description 110, which included only operational results in the form of signal levels and the conditions under which those signal levels are generated, is converted to the specific logic network 130 wherein all the logic elements, including complex logic elements such as high impendance drivers, level sensitive latches, and edge sensitive flip-flops, are specified along with the inter-connection of the logic elements so that the user is provided with functional logic network 130 that may be implemented in an integrated circuit or other such devices by the user.

More specifically, description 110 (FIG. 1) includes two general types of statements, directive statements and flow control statements. A directive statement assigns a specified value to a particular variable, i.e., a signal is set at a specified level. For example, the statement $$x := p \qquad (1)$$

assigns the value of the variable "p" to the variable x. The value of the variable "p" may either have been previously defined or be an input signal. A directive statement is any statement that contains arithmetic operators (+, −, *, /), boolean operations, (e.g. AND, OR, XOR, NOT), or any operation that combines or manipulates data values. Herein, variable "p" or a similar notation is a shorthand expression for the right hand side of a directive statement and as such may represent either a single variable or a more general set of operations that manipulate data values.

A flow control statement, as the name suggests, controls the processing of statements in the set of statements that constitute description 110. For example, in the C programming language flow control statements include "IF," "WHILE," "SWITCH," "RETURN," "BREAK," "FOR," and "GOTO." In this embodiment, hardware description means 115 includes "IF" and "GOTO" flow control statements. As is known to those skilled in the art, other flow control statements may be expressed in terms of only these two flow control statements.

Herein, the characterization of statements as "directive" and "flow control" statements is for ease of description only. Similarly, the specific operations performed by such statements are illustrative only. The important aspect of the invention is that preprocessor 122 (FIG. 2) operates on two different types of statements that are used in description 110 to specify the operation of a user defined logic network. Therefore, the particular names assigned to these statements and the nature of the statements are illustrative only of the principles of this invention and are not intended to limit the invention to the particular names and embodiments described herein.

Figure 3A:
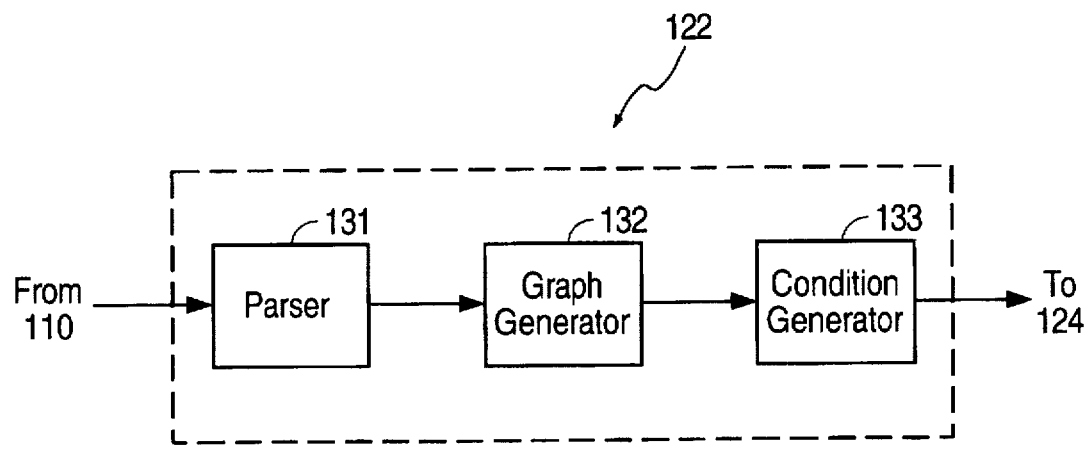
FIG. 3A is a more detailed block diagram of preprocessor 122 of this invention showing graph generator 132 and condition generator 133.

In this embodiment, preprocessor 122 (FIG. 2) includes parsing means 131, graph generator means 132 and edge condition generator means 133 (FIG. 3A). Parsing statements is well-known to those skilled in the art. For example see, A. Aho, R. Sethi, and J. Ullman, *Compilers: Principles, Techniques and Tools*, Addison-Wesley, Reading, Mass. (1986). In one embodiment, a lexical analysis is first performed using a tool entitled "lex" which is a UNIX tool described in the book of A. Aho et al., which is incorporated herein by reference. After the lexical analysis, parsing is performed using a, tool entitled "yacc" which is another UNIX tool described in the book of A. Aho et al., which is also incorporated herein by reference.

After parsing means 131 of preprocessor 122 parses a statement in description 110, the parsed statements are stored in a parse tree and symbol table (also described in Aho et al. (1986)). Parsing means 131 is not an essential aspect of this invention. Any parsing means may be used to generate the parse tree and symbol table. One embodiment of the parse tree and symbol table suitable for use with this invention is described in Aho et al. (1986), which is incorporated herein by reference. Hence, parsing means 131 processes user description 110 and generates a parse tree and symbol table having a format such as that given in Aho et al. (1986).

Using the parse tree and symbol table, graph generating means 132 constructs a control flow graph, as described more completely below. A graph is a collection of vertices, sometimes referred to herein as nodes, and edges. Vertices are objects that can have a name and other properties. An edge is a connection between two vertices. In general, as described below, nodes are classified as operation nodes, split nodes, and join nodes. Edges in a control flow graph represent the flow of control between directive statements. In a control flow graph, a directive statement is represented by an operation node that has a single edge entering and a single edge leaving the node. Within the operation node is an assignment that corresponds to an operation specified by the user in a directive statement in description 110.

A flow control statement results in a more complex structure in the control flow graph than the directive statement. Typically, in the control flow graph, a split node associated with a flow control statement has one or more edges leaving the node. However, the precise representation depends upon the flow control statement. For example, in this embodiment, a GOTO statement may result in only an edge connecting two nodes. The important aspect is that a flow control node defines the condition or conditions whereby subsequent nodes in the control flow graph are accessed.

Figure 4:
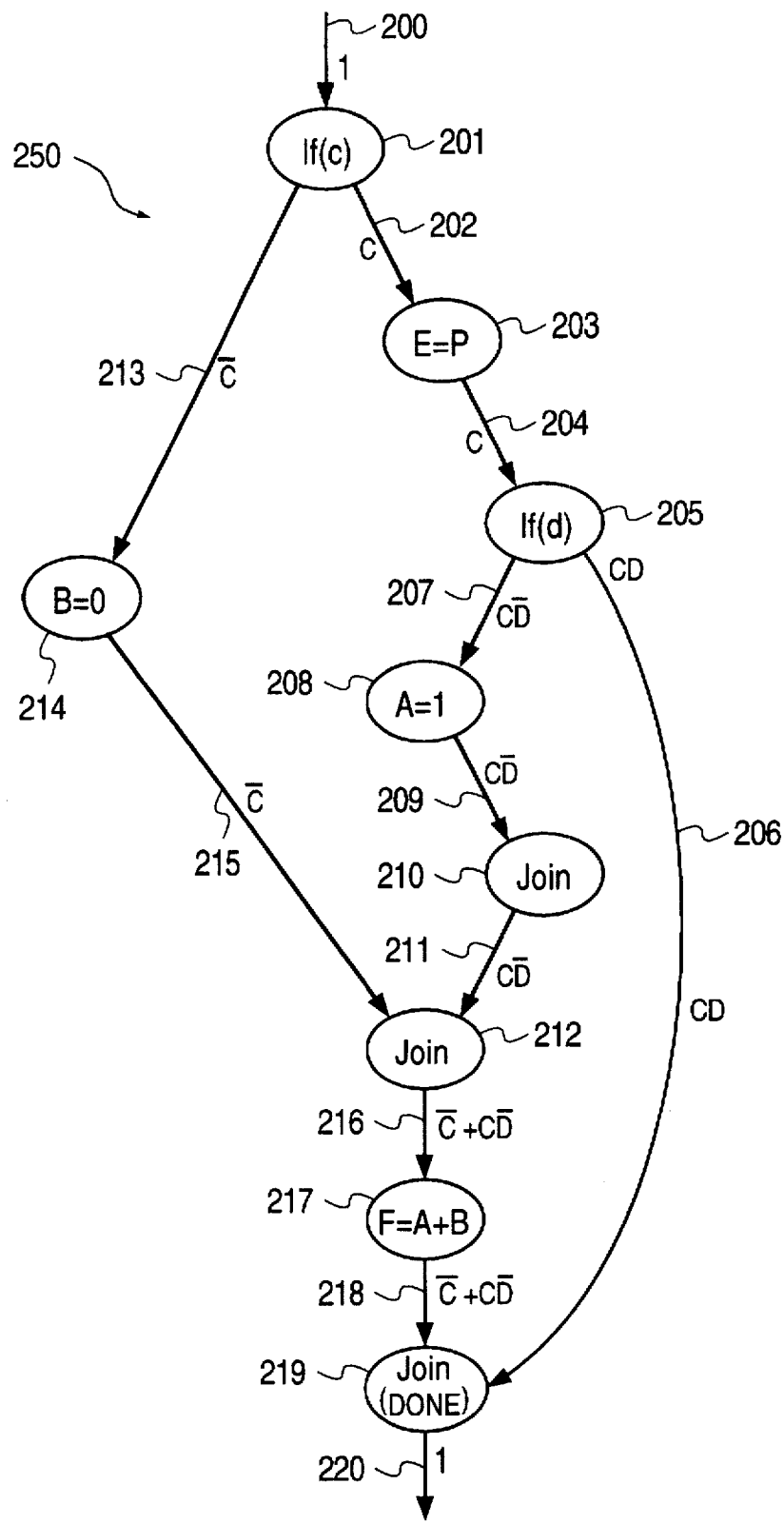
FIG. 4 is an example of a control flow graph that is generated by graph generator 132 of this invention.

An example of a simple control flow graph is illustrated in FIG. 4. A data structure representing control flow graph 250 is created by graph generator means 132, typically in random access memory (RAM) of computer 116 (FIG. 1), for the statements in user description 110 (TABLE 1).

TABLE 1

A Portion of a Typical User Description 110

| | | |
|---|---|---|
| 301 | if ( C ) | |
| 302 | | E := P |
| 303 | | if ( D ) |
| 304 | | goto done |
| 305 | | else |
| 306 | | A := 1 |
| 307 | | endif |
| 308 | else | |
| 309 | | B := 0 |
| 310 | endif | |
| 311 | F := A + B | |
| 312 | done: | |

In this embodiment, when the argument of the "if" statement in TABLE 1 is true, the sequence of statements immediately following the "if" statement are processed. When the "else" statement is encountered, processing passes to the corresponding "endif" statement. Conversely, if the argument of the "if" statement is false, the sequence of statements following the "else" statement for that "if" statement are processed. Again, processing passes to the corresponding "endif" statement. In a control flow graph, the node at which the two branches of an "if" statement converge, i.e., the node corresponding to the "endif" statement, is a "join" node. In general, a join node is any node were two or paths in the control flow graph converge, but, as explained below, a join node may have only a single input edge in some cases.

Control flow graph 250 has nine nodes 201, 203, 205, 208, 210, 212, 214, 217 and 219 and twelve edges 200, 202, 204, 206, 207, 209, 211, 213, 215, 216, 218 and 220. Edge 200 is the source for control flow graph 250. Split node 201 represents flow control statement 301 of TABLE 1. Edge 202 connects node 201 to node 203. Node 203 represents directive statement 302 (TABLE 1) and is referred to as a directive node or an operation node. Edge 202 is traversed only if condition "C" is true. (Herein, variables within a flow control statement are referred to as conditions and not variables.) In FIG. 4, the letter(s) or the arithmetic statement that is adjacent to an edge represents the condition that must be satisfied to traverse that edge. A bar over a letter is used to represent the "not" logic state of the condition represented by the letter. Similarly, two letters written side by side represent the logic "AND" function of the two conditions while two letters connected by a plus sign represents the logic "OR" function of the two conditions. This notation is used consistently to represent a condition associated with an edge of a control flow graph.

Edge 213, which is traversed when the condition "C" is not true, connects node 201 to node 214. Node 214 represents directive statement 309 (TABLE 1). Edge 204 connects node 203 to node 205. Split node 205 represents flow control statement 303 (TABLE 1). Edge 204 is traversed only if condition "C" is true. Edge 206 connects node 205 to join node 219. Edge 206 represents flow control statement 304 (TABLE 1) and is traversed only if both condition "C" and condition "D" are true.

Edge 207 connects split node 205 to operation node 208. Node 208 represents directive statement 306 (TABLE 1). Edge 207 is traversed when condition "C" is true and condition "D" is not true. Edge 209 connects node 208 and join node 210. The condition for traversal of edge 209 is the same as edge 207. Notice that join node 210 only has edge 209 into the node because the GOTO statement directed flow out of the "then" branch of the if statement. Edge 211 connects node 210 to join node 212 and edge 211 has the same condition for traversal of the edge as edge 209.

Edge 215 connects node 214 to join node 212. Edge 215 is traversed when the condition "C" is not true. Edge 216 connects join node 212 to operation node 217. Node 217 represents directive statement 311 (TABLE 1). There are two paths to node 217. Node 217 is reached either if condition "C" is not true, or condition "C" is true and condition "D" is not true. Similarly, edge 218 that connects nodes 217 and 219 is reached either if condition "C" is not true, or condition "C" is true and condition "D" is not true. Node 219 is a join node that represents statement 312 (TABLE 1). Edge 220 from join node 219 is the sink for control flow graph 250.

There are several aspects of control flow graph 250 that are important. The condition for an edge leading into a directive node, e.g., node 203, and the condition from the directive node are the same. Hence, as described below, only the condition on the edge exiting a directive node is used. Also, in graph 250, each directive node contains only an assignment for a single variable, but in a more general case, one directive node may correspond to one or more directive statements.

Graph generator 132 (FIG. 3A) only creates control flow graph 250 (FIG. 4). The conditions associated with an edge of graph 250 are provided here to assist in associating statements 301 through 311 of TABLE 1 with graph 250, but, as described more completely below, these conditions are an important aspect of the invention.

While control flow graph 250 is a rather simple example, graph 250 illustrates one of the important features of this invention. Graph 250 does not consist of only series and parallel paths. Typically, in prior art control flow graphs, only series and parallel paths were permitted, i.e, the only permitted flow control statements were "if" statements or statements that could be represented in terms of "if" statements. In such prior art control flow graphs, the two branches of the "if" statement generated parallel paths while nodes and edges connecting the join node of one "if" statement to the head node of another "if" statement formed a series path. Within one side of a parallel path, multiple buried "if" statements were permitted, but a path from one of the "if" statements to outside the "if" statement was not available.

Thus, such prior art control flow graphs could not be used to represent an edge such as edge 206, that represents the "GOTO" flow control statement. The embodiment of preprocessor 122 that allows the more general control flow graph 250 is a significant advance. Elimination of the parallel series restriction permits generation of more complex and useful control flow graphs, as described more completely below.

Condition generator 133 (FIG. 3A) within preprocessor 122 generates the condition under which a node in the control flow graph is reached. Specifically, in one embodiment, for each edge in the control flow graph exiting from a directive node, the conditions that must be satisfied to reach that edge in the graph are determined and assigned to the edge. The condition generated is an "activation condition" in one embodiment and a "mux condition" in another embodiment. The determination of these conditions by condition generator 133 is described more completely below. In FIG. 4, for example, the activation condition for edge 218 of control flow graph function. In FIG. 4, the activation condition is given next to each edge.

In another embodiment, a "mux condition" is determined for the edges in the control flow graph by condition generator 133 (FIG. 3A). The mux condition, as illustrated more completely below, has several advantages over activation conditions.

Condition generator 133 determines a mux condition for each edge 211, 215 feeding into join node 212 and for each edge 206, 218 feeding into join node 219. The mux condition for an edge is the boolean minimization of the activation condition for that edge with a don't care condition. The don't care condition is the NOT of the activation condition of the edge leaving the join node. (For a more general discussion of don't care conditions, see for example, R. K. Brayton, G. D. Hachtel, C. T. McMullen, and A. L. Sangioranni, *Logic Minimization Algorithms for VLSI Synthesis*, Kluwer Academic Publishers, Hingham, Mass. (1984), which is incorporated herein by reference.)

For example, the mux condition for edge 211 into join node 212, is activation condition "C AND (not D)" minimized with the don't care condition, i.e, the NOT of activation condition "(not C) OR (C AND (not D))" for edge 216 leaving join node 212, which is :

$$\text{not}((\text{not C}) \text{ OR } (\text{C AND } (\text{not D}))) \tag{2}$$

Boolean minimization of the mux condition for edge 211 results in the mux condition "C". (Herein, parenthesis are used as an aid in understanding the logic operations within the condition. Thus, "(not C)" and "not C" are the same value.) Note the mux condition is simpler than the activation condition for edge 211.

The mux condition for an edge is true only when the join node was reached via that edge. The mux condition for an edge may have any value if the join node is not reached. The freedom of the mux condition for an edge to take on any value when the join node is not reached distinguishes mux conditions from activation conditions. The activation condition for an edge is always false when the join node is not reached via that edge. Hence, the mux condition for an edge is simpler than the activation condition because a mux condition is not required to be false when the join node is not reached. The generation of the edge conditions in the control flow graph completes the operation of condition generator 133 and consequently the operation of preprocessor 122.

Logic circuit generator 124 (FIG. 2) converts the edge conditions (activation or mux conditions) and the nodes of the control flow graph into assignment conditions, as described more completely below, which are in turn used to generate a logic circuit that performs the operations that were specified by the user in description 110, i.e., the circuit generates the signals specified by the user.

Prior to considering the operation of logic circuit generator 124 in more detail, the specific hardware description means used with synthesizer 120 of this invention is described. Hardware description means 115 (FIG. 1) provides a means for expressing the possible logic function signals and the condition under which those logic function signals are obtained. In this embodiment, hardware description means 115 includes specifying logic variables which have a logic value of zero, one, "X" or "Z." A value of "X" for a variable means the user does not care about the logical value of that variable. A value of "Z" means the signal represented by the variable is in a high impedance state. Also, the user may specify logic input variables, i.e., logic input signals.

In addition to specification of values for variables, the user may specify the conditions under which a variable takes on a particular value. For example, in this embodiment, the user may specify either a predetermined condition that must be satisfied, or a clock edge condition. Thus, the user needs to know only the timing relationship between the signals or other conditions upon which generation of the signals depend. No knowledge concerning the operation of specific logic devices, such as latches or flip-flops, is required. Hence, unlike the prior art systems described above, which required specification of operation and connections for complex logic elements, synthesizer 120 of this invention generates logic network 130 from an operational description only and does not require specification of any hardware details in user description 110.

Figure 3B:
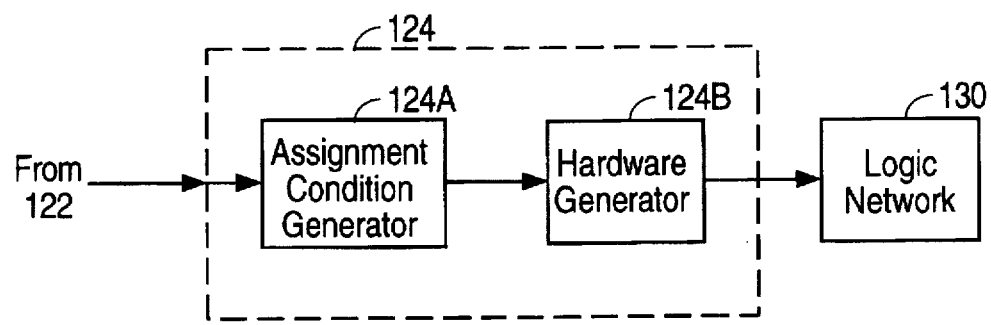
FIG. 3B is a more detailed block diagram of logic circuit generator 124 of this invention showing assignment condition generator 124A and hardware generator 124B.

Logic circuit generator 124 (FIG. 3), using the edge activation conditions, or alternatively the mux conditions, and information associated with the nodes of the control flow graph converts the control flow graph into a logic circuit. In one embodiment, logic circuit generator 124 first determines assignment conditions, as described more completely below, for each variable assigned a value in the control flow graph. The assignment conditions in conjunction with a set of hardware description functions, also described more completely below, are subsequently used to generate logic network 130 (FIG. 1) which provides the signals represented by the logic variables in the control flow graph.

More specifically, assignment condition generator 124A (FIG. 3B) uses the conditions from condition generator 133 and the control flow graph from graph generator 132 to generate an assignment condition matrix. Each row of the matrix is a set of assignment conditions for a variable that is assigned a value in user description 110.

Hardware generator 124B generates a logic circuit for each row of the assignment condition matrix. In one embodiment, hardware generator 124B first boolean minimizes the set of assignment conditions and then generates the logic circuit for the optimized set of assignment conditions. Thus, logic network 130 includes one or more logic circuits. The logic circuits are interconnected as required by the assignment conditions to form logic network 130.

Logic circuit generator 124 uses a set of hardware description functions that represent specific operations that are implemented with specific hardware. Thus, rather than requiring the user (i) to understand the operation of hardware and (ii) to provide a specific description of that hardware in description 110, logic circuit generator 124, in this embodiment, determines an assignment condition for each variable and each of the functions in the set of hardware description functions. An "assignment condition" is the condition under which the hardware description function is true for a particular variable.

Herein, the notation "F( )" represents hardware description function "F" and the notation "F(v)" represents the assignment condition for the hardware description function "F" and variable "v". In one embodiment, the hardware description functions (HDFs) are characterized as either synchronous or asynchronous functions. Synchronous HDFs apply to assignments made to variables only on clock edges. Asynchronous HDFs apply to all other assignments made to variables. In this embodiment, six different HDFs are used.

Asynchronous load function AL( ) tells the condition under which a variable has been asynchronously assigned any value. Asynchronous data function AD( ) tells the condition under which a variable has been asynchronously assigned the value one. Herein, logic one, one, and "1" are used interchangeably to represent the logic state "TRUE". Similarly, logic zero, zero, and "0" are used interchangeably to represent the logic state "FALSE".

Don't care function DC( ) tells the condition under which a variable has been assigned the value "X". Assigning the value "X" to a variable means that the variable may be assigned either a logic one or logic zero value. Thus, function DC( ) tells the condition where the value of a variable, i.e., the signal level is not important.

High-impendance function Z( ) tells the condition under which a variable has been assigned the value "Z". Assigning the value "Z" to a variable means that the variable is to take on a high impendance value. Thus, function Z( ) tells the conditions where the value of a variable is high impendance. In another embodiment, high-impendance function Z( ) is replaced by an asynchronous high impendance function AZ( ) and synchronous high impendance function SZ( ).

In this embodiment, the values of functions AD( ), and Z( ) are only important when function AL( ) is TRUE. Thus, functions AD( ), and Z( ) are preferably boolean minimized with "not function AL( )" as a don't care condition, as described more completely below.

Synchronous load function SL( ) tells the condition under which a variable has been assigned any value on a clock edge. Synchronous data function SD( ) tells the condition under which a variable has been assigned the value one on a clock edge. In this embodiment, the value of function SD( ) is only important when function SL( ) is TRUE. Thus, function SD( ) is preferably boolean minimized with "not function SL( )" as a don't care condition, as described more completely below.

The specific names of the hardware description functions are not important. Rather, the important aspect is to define a set of functions that represent all variable types that the user may specify, and the conditions under which a particular variable type takes on a particular value. In other embodiments, additional functions may be defined, or alternatively, subsets of the functions described above may be used.

Herein, a positive clock edge is associated with synchronous functions SL( ) and SD( ). However, the use of a positive clock edge for the synchronous functions is illustrative only of the principles of this invention and is not intended to limit the invention to only such a clock edge. As is known to those skilled in the art, a wide variety of clock edges are used in combinational logic networks. Synchronous functions SL( ) and SD( ) in logic circuit generator 124 (FIG. 3B) are applicable, in general, for any of the wide variety of clock edges. In view of this disclosure, the use of another clock edge will be apparent to those skilled in the art.

The generation of assignment conditions using the edge conditions (either "mux conditions" or "activation conditions") and the nodes of the control flow graph corresponding to the directive statements is described more completely below in terms of specific examples. Each hardware description function is a boolean expression that may have a logic zero, a logic one, or some combination of logic values from a circuit.

In this embodiment, logic circuit generator 124, in particular, assignment condition generator 124A, creates an assignment condition matrix that is subsequently used in the generation of logic network 130 by hardware generator 124B. Each column of the matrix represents one hardware description function. Thus, in this embodiment, the matrix has six columns. Each row of the assignment condition matrix represents one of the variables that are assigned a value in description 110 (FIG. 2), i.e., a signal that is specified by the user. The entries in a row are the assignment conditions for that variable and are used to generate logic circuit elements that generate the output signal for that variable. Hence, logic circuit elements are generated for each row of the assignment condition matrix. The logic circuit elements for each row and related rows are interconnected as necessary by hardware generator 124B.

The function of the assignment condition matrix is more clearly illustrated by first considering the method used by logic circuit generator 124 to determine the assignment conditions for each of the hardware description functions and then considering the interpretation of the possible permutations and combinations of assignment conditions within a row of the matrix. The generation of assignment conditions using activation conditions is considered first and then the generation of assignment conditions using mux conditions is described.

Figure 5A:
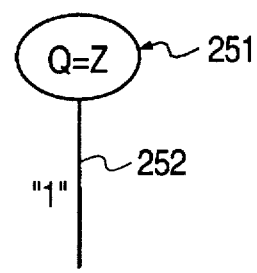
FIGS. 5A and 5B, illustrate an operation node and an edge from an operation node used by the assignment condition generator 124 in logic circuit generator 124.

For high impendance function Z( ), assignment condition Z(v) is the logical OR function of all the activation conditions under which variable v is assigned high impendance value "Z". If variable v is never assigned value "Z", assignment condition Z(v) is zero. For example, consider a node 251 (FIG. 5A) in the control flow graph which specifies Q:="Z" and activation condition "1" for edge 252 leaving node 251. Since for the purposes of this example this is the only node in the control flow graph that assigns the high impendance state to the variable Q, the logic OR function of the activation conditions is just "1" so assignment condition Z(Q) is "1".

Figure 5B:
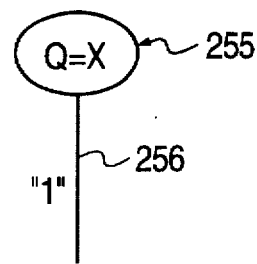

For don't care function DC( ), assignment condition DC(v) is also the logic OR function of all the activation conditions that result in variable v being assigned don't care value "X". If variable v is never assigned value "X", assignment condition DC(v) is zero. For this example, there is only one node 255 (FIG. 5B) in the control flow graph which specifies Q:="X" and the activation condition for edge 256 exiting that node is "1". Thus, the logic OR function of all the activation conditions is "1" so that assignment condition DC(Q) is "1".

For asynchronous load function AL( ), the assignment condition for a variable is the logic OR function of the activation conditions for all edges exiting from directive nodes in the control flow graph where that variable is asynchronously assigned a value.

Figure 6A:
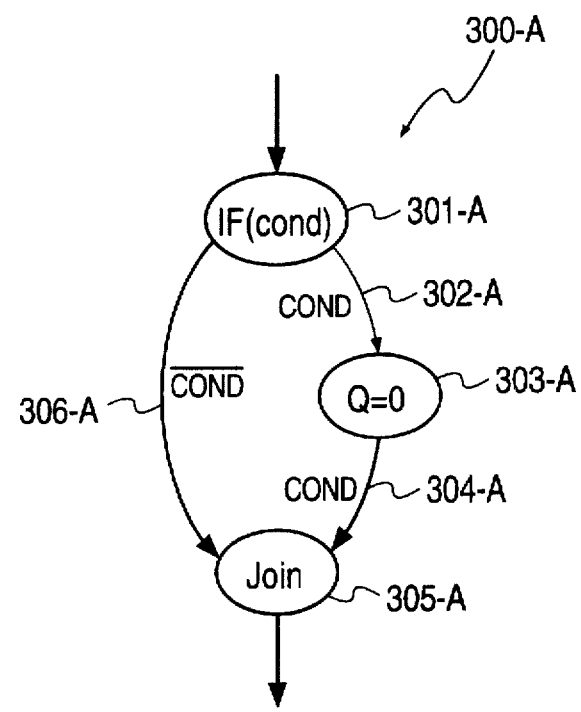
FIG. 6A is a control flow graph generated by graph generator 132 of this invention for user description 110 in Table 2.

Consider the following user instructions (TABLE 2), which are illustrated in FIG. 6A as a control flow graph 300-A.

TABLE 2

An Example of User Description 110 if ( COND )
   Q := 0
else
endif.

The activation condition for edge 304-A from directive node 303-A is "COND". Since this is the only node in which variable Q is assigned a value, assignment condition AL(Q) for function AL( ) is also "COND."

The operation of asynchronous data function AD( ) is more complex than the operation of asynchronous load function AL( ). A logic variable Q may asynchronously take on a logic zero value, e.g., Q:=0, a logic one value, e.g., Q:=1, or an unknown logic value, e.g., Q:=B, where B is another user defined logic variable, input variable, or a logic expression.

In general, assignment condition AD(v) for variable v is the logic OR function of all conditions under which variable v was assigned a logic one value. Notice that in contrast to the definition of assignment condition AL(v), the assignment condition AD(v) is not limited to just activation conditions. When the variable is simply assigned the constant logic one value, the activation condition is the condition used in evaluation of the logical OR function. When variable v is assigned a constant logic zero value, the condition used in evaluation of the logic OR function is a logic zero. When variable v is assigned a specific but unknown logic value, the condition used in the logic OR function is equal to the logic AND function of the activation condition where variable v was assigned that value with the unknown value assigned to variable v. Hence, the conditions used in evaluation of the logic OR function may be more complex than just the activation condition.

Figure 7A:
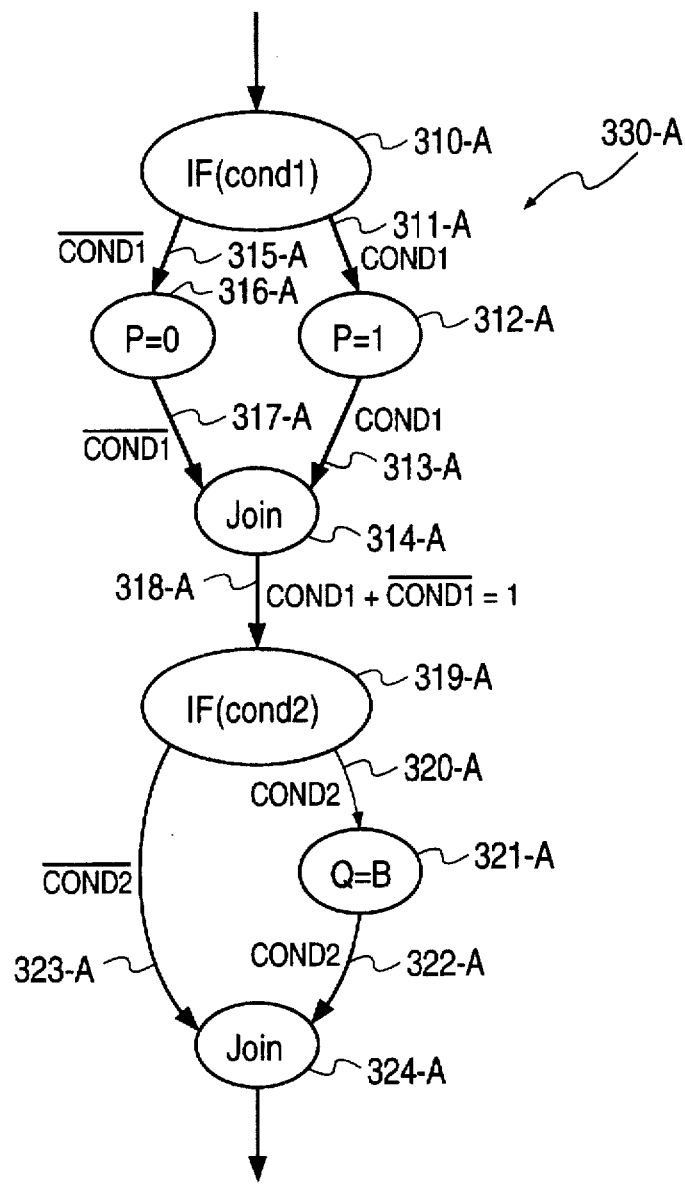
FIG. 7A is a control flow graph that is generated by graph generator 132 of this invention for the user description in Table 3.

To demonstrate the generation of rows in the assignment condition matrix for asynchronous functions AL( ) and AD( ), consider the following user instructions (TABLE 3), which are illustrated in FIG. 7A as control flow graph 330-A.

TABLE 3

An Example of User Description 110 if ( COND1 )
   P := 1
else
   P := 0
endif
if ( COND2 )
   Q := B
else
endif.

The activation condition of edge 313-A from node 312-A where variable P is assigned the value "1" is "COND1". The activation condition of edge 317-A from node 316-A where variable P is assigned the value "0" is "not COND1". Thus, using the above rules for the assignment conditions, assignment condition AL(P) for function AL( ) is the logic OR function of all the activation conditions from all the directive nodes where variable P is assigned a value, i.e. nodes 312-A and 316-A. The logic OR function is:

$$COND1 + \overline{COND1} = 1 \qquad (3)$$

Therefore, assignment condition AL(P) for function AL( ) is "1." The assignment condition AD(P) for function AD( ) is the logic OR function of the conditions under which variable P is asynchronously assigned the value of "1" i.e., node 312-A. Thus, assignment condition AD(P) for function AD( ) is "COND1". Therefore, the row in the assignment condition matrix for variable P is as shown in TABLE 4 below.

Again, the same rules are used to determine assignment conditions AL(Q) and AD(Q). The activation condition for edge 322-A from node 321-A where variable Q is asynchronously assigned a value is "COND2". Thus, variable Q is asynchronously loaded if activation condition "COND2" is true. Since in this example, node 321-A is the only directive node where variable Q is assigned a value, assignment condition AL(Q) for asynchronous load function AL( ) is "COND2". Therefore, the entry in the assignment condition matrix in row Q and column AL( ) is "COND2".

At node 321-A, variable Q is driven to a logic one value only if variable B has the value "1". Thus, the two step process is used to determine the assignment condition for function A(Q). The condition under which variable Q is assigned a logic one value is the Logical AND of the value of variable B (i.e., the value assigned to variable Q) and COND2 (the activation condition for the assignment), i.e., the condition is "B*COND2". The assignment condition AD(Q) is the logic OR function of all conditions under which variable Q was assigned a logic one value. Since there is only one condition, assignment condition AD(Q) is "B*COND2".

TABLE 4

| Variable | Assignment Conditions | | | | | |
|---|---|---|---|---|---|---|
| | AL() | AD() | SL() | SD() | DC() | Z() |
| P | 1 | COND1 | 0 | 0 | 0 | 0 |
| Q | COND2 | COND2*B | 0 | 0 | 0 | 0 |

The assignment conditions for synchronous load function SL( ) and synchronous function SD( ) are analogous to the asynchronous functions described above. For synchronous load function SL( ), assignment condition SL(v) is the logical OR function of the activation conditions for all edges exiting from nodes of the control flow graph (i) where variable v is assigned a value and (ii) where the activation condition includes a clock edge. In the assignment conditions for the synchronous functions, the variable representing the clock edge (see "pos_e" below) is replaced with a logic one.

Figure 6B:
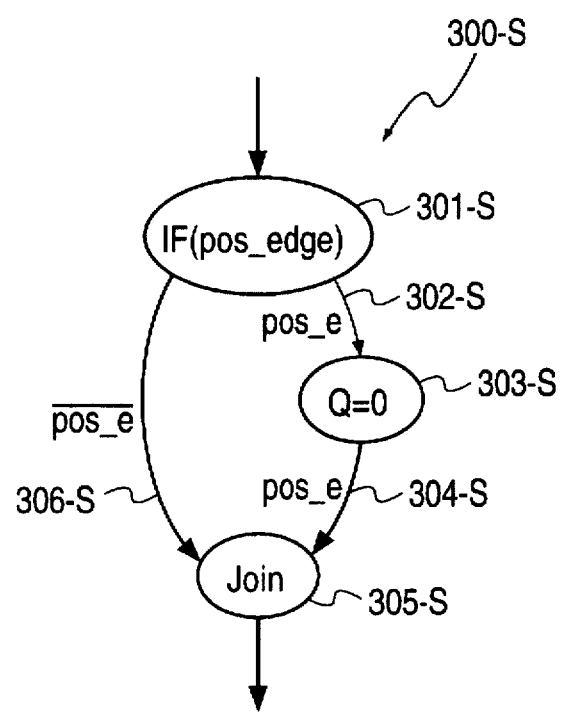
FIG. 6B is a control flow graph generated by graph generator 132 of this invention for user description 110 in Table 5.

Consider the following user instructions, which are illustrated in FIG. 6B as control flow graph 300-S.

TABLE 5

An Example of User Description 110 if ( positive_edge(CLOCK) )
   Q := 0
else
endif.

The activation condition for edge 304-S from node 303-S is "positive_edge(CLOCK)." (In the FIGS. and herein, "positive_edge(CLOCK)" is also represented by "pos_e".) Since this is the only nodes in which variable Q is assigned a value where the activation condition contains a clock edge, the assignment condition is for function SL(Q) is "1".

The operation of synchronous data function SD( ) is more complex than the operation of synchronous load function SL( ). On a clock edge, a logic variable Q may synchronously take on a logic zero value, e.g., Q:=0, a logic one value, e.g., Q:=1, or an unknown logic value, e.g., Q:=B, where B is another user defined logic variable, input variable, or a logic expression.

Assignment condition SD(v) for variable v is the logic OR function of all conditions under which variable v was assigned a logic one value and the activation condition includes a clock edge. Notice that in contrast to the definition of assignment condition SL(v), assignment condition SD(v) is not limited to just the logic OR function of activation conditions. When variable v is simply assigned the constant logic one value on a clock edge, the activation condition is the condition used in evaluation of the logical OR function. When variable v is assigned a constant logic zero value on a clock edge, the condition used in evaluation of the logic OR function is a logic zero. When variable v is assigned a specified but unknown logic value on a clock edge, the condition used in the logic OR function is equal to the logical AND function of the activation conditions where variable v was assigned with the unknown value assigned to variable v. Hence, the conditions used in evaluation of the logic OR function may be more complex than just the activation condition.

Figure 7B:
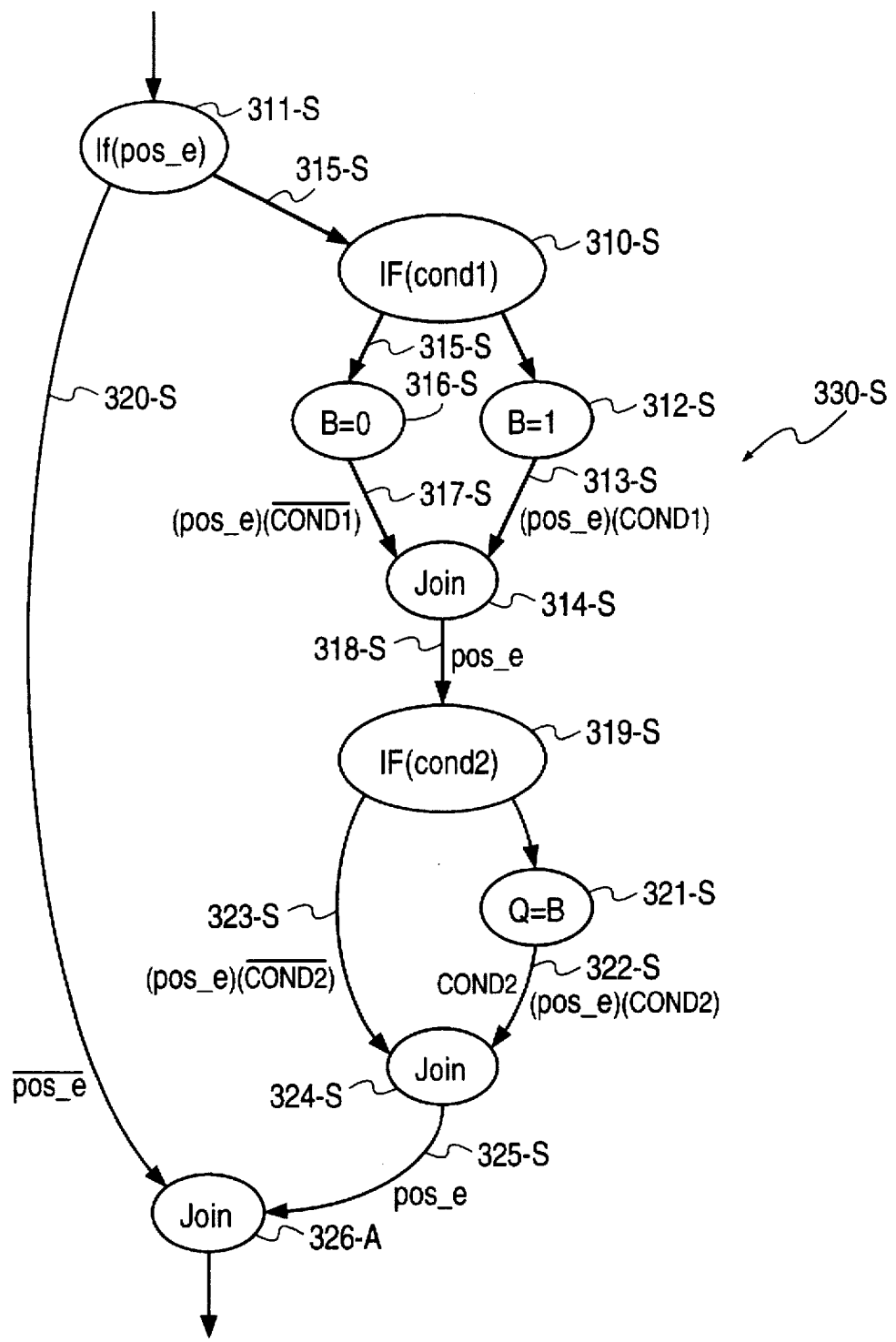
FIG. 7B is a control flow graph generated by graph generator 132 of this invention for the user description in Table 6.

To demonstrate the generation of rows in the assignment condition matrix for synchronous functions SL( ) and SD( ) consider the following user instructions (TABLE 6), which are illustrated in FIG. 7B as control flow graph 330-S.

TABLE 6

An Example of User Description 110 if ( positive_edge(CLOCK) )
   if (COND1)
      B := 1
   else
      B := 0
   endif
   if (COND2)
      Q := B
   else
   endif.
else
endif.

The activation condition of edge 313-S from node 312-S where variable B is assigned the value "1" is "COND1*positive_edge(CLOCK)". The activation condition of edge 317-S from node 316-S where variable B is assigned the value "0" is "(not COND1)*positive_edge (CLOCK)."

Thus, using the above rules for the assignment conditions, assignment condition SL(B) for function SL( ) is the logic OR function of all the activation conditions from all the directive nodes where variable P is assigned a value on a clock edge, i.e. node 312-S and 316-S. The logic OR function is just "COND1*positive_edge(CLOCK))+((not COND1)*positive_edge (CLOCK))" but by definition for a synchronous function "positive_edge(CLOCK)" equals "1" because a synchronous function takes on a non-zero value only under this condition. Therefore, assignment condition SL(B) for function SL( ) is "(not COND1)+COND1", which is "1". Assignment condition SD(B) for function SD( ) is the logic OR function of the conditions under which variable B is synchronously assigned the value of "1", i.e., node 312-S. Thus, assignment condition SD(B) for function SD( ) is "COND1", the activation condition for edge 313-S. Therefore, the row in the assignment condition matrix for variable B is as shown in TABLE 7 below.

Again, the same rules are used to determine the assignment conditions for variable Q and synchronous functions SL( ) and SD( ). The activation condition for edge 322-S from node 321-S where variable Q is synchronously assigned a value is "COND2 * positive_edge(CLOCK)". Thus, variables Q is synchronously loaded on a clock edge. Since in this example, node 321-S is the only directive node where variable Q is assigned a value on a clock edge, assignment condition SL(Q) for asynchronous load functions SL( ) is "COND2" because, as described above, "positive_edge(CLOCK)" is replaced with a logic one. Therefore, the entry in the assignment condition matrix in row Q and columns SL( ) is "COND2".

At node 321-S, variable Q is driven to a logic one value on the clock edge only if variable B has the value "1". Thus, the two step process is used to determine the assignment condition SD(Q) for function SD( ). The condition where variable Q is assigned a logic one value is the logical AND of the value assigned to variable B and the activation condition "COND2*pos_e" for that assignment, i.e., the activation condition for edge 322-S so that the condition is "B*(COND2*pos_e)". Assignment condition SD(Q) is the logical OR function of all conditions under which variable Q takes on a logic one value on a clock edge with the clock edge replaced by a logic one. Since there is only one such condition in control flow graph 330-S, assignment condition SD(Q) is "B*COND2".

TABLE 7

| Variable | Assignment Conditions | | | | | |
|---|---|---|---|---|---|---|
| | AL() | AD() | SL() | SD() | DC() | Z() |
| B | 0 | 0 | 1 | COND1 | 0 | 0 |
| Q | 0 | 0 | COND2 | COND2*B | 0 | 0 |

The previous examples were simple examples that demonstrated generation of entries in the assignment condition matrix by assignment condition generator 124A. The next step is generation of a logic circuit for each row of the assignment condition matrix. Specifically, the following examples demonstrate the possible combinations within a row of the assignment condition matrix and the hardware that is generated for that row by logic circuit generator 124 (FIG. 2). Each example illustrates a set of predetermined assignment conditions that are used by hardware generator 124B to create specific logic elements. Hence, whenever hardware generator 124B encounters the predetermined assignment conditions, the logic elements described are created.

With respect to function AL( ), consider a variable Q and the assignment condition matrix row given in TABLE 9 for variable Q. TABLE 9 is associated with the following user description (TABLE 8):

TABLE 8

An Example of User Description 110

If( COND )
    Q := D
else
endif

"COND" is a condition.

TABLE 9

| Variable | Assignment Conditions | | | | | |
|---|---|---|---|---|---|---|
| | AL() | AD() | SL() | SD() | DC() | Z() |
| Q | COND | COND*D | 0 | 0 | 0 | 0 |

For asychronous load function AL( ), variable Q must retain the assigned value until a subsequent assignment occurs. The operation of the asynchronous load function AL( ) is just the operation of a flow through latch where the assignment condition AD(Q) is the signal on the latch data input line and the value of the variable Q is the signal on the latch output line. The flow through latch is gated with assignment condition AL(Q). Thus, if assignment condition AL(Q) is "1", the input signal is transferred directly to the output line of the latch. If assignment condition AL(Q) has an unknown value, the input signal is transferred to the output line only when the assignment condition is true, i.e., takes on a logic one value.

Figure 8A:
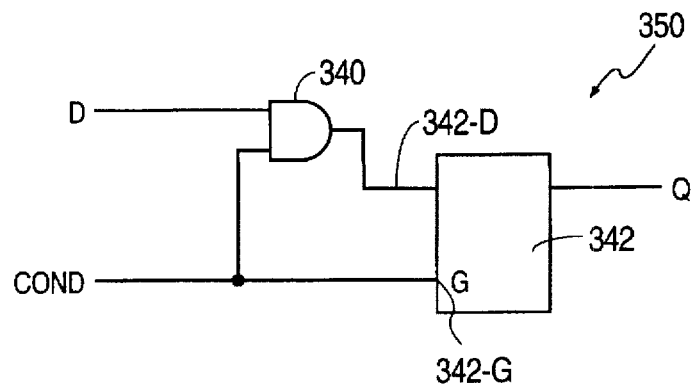
FIG. 8A is a logic circuit created by one embodiment of logic circuit generator 124 for the user description in Table 8.

Logic circuit 350 (FIG. 8A) generates the signals specified by user description 110 as defined in TABLE 8 above. Specifically, AND gate 340 has a first input signal that is the value assigned to variable D and a second input signal that is activation condition "COND." Output signal "D*COND" of AND gate 340 is activation condition AD(Q) and is the signal on data input line 342-D of latch 342. Activation condition "COND" is also the signal on gate terminal 342-G of latch 342. The signal on the output line of latch 342 is the value of variable Q. While circuit 350 provides the operation specified by the user description, circuit 350 may be improved.

Figure 8B:
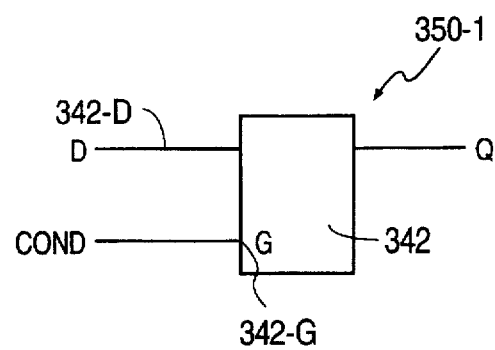
FIG. 8B is a logic circuit created by a preferred embodiment of logic circuit generator 124 of this invention for the user description in Table 8.

Latch 342 does not use the value on data input line 342-D whenever the signal on gate terminal 342-G is zero. Thus, the logic circuit created by hardware generator 124B to generate assignment condition AD(Q) for the data input line 342-D is, in one embodiment, boolean minimized with "not assignment condition AL(Q)" as a don't care condition. When assignment condition AD(Q), which is "COND *D" is boolean minimized with a don't care of "not COND," the function "D" is the result. Circuit 350-1 (FIG. 8B) is an improved result because fewer logic elements are required to produce the results specified by the user description in TABLE 8. Hence, circuit 350-1 is created by hardware generator 124B for the row in TABLE 9.

Thus, in more general terms, for a row in the assignment condition matrix for a variable v with assignment conditions AL(v) and AD(v), the logic circuit generated for these assignment conditions by hardware generator 124B is the boolean minimization of assignment condition AD(v) with the don't care condition of "not assignment condition AL(v)." If the value of boolean minimized assignment condition AD(v) is a boolean constant, the logic circuit is further simplified from that described above.

Consider the following user description (TABLE 10).

TABLE 10

An Example of User Description 110 if (COND)
    Q := 1
else
endif

The row of the assignment condition matrix for variable Q is given in TABLE 11.

TABLE 11

| Variable | Assignment Conditions | | | | | |
|---|---|---|---|---|---|---|
| | AL() | AD() | SL() | SD() | DC() | Z() |
| Q | COND | COND*1 | 0 | 0 | 0 | 0 |

Figure 8C:
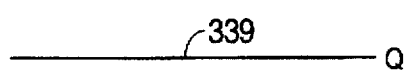
FIG. 8C is the logic circuit generated by logic circuit generator 124 of this invention for the user description in Table 10.

Boolean minimization of assignment condition AD(Q), i.e., "COND * 1" with the don't care condition of "not assignment condition AL(Q)", i.e., "not COND" gives an assignment condition AD(Q) of "1". The logic circuit generated to produce the signal represented by the value of variable Q (TABLE 11) is a wire 339 (FIG. 8C).

If the value of assignment condition AL(v) for variable v is a boolean constant, the generated logic circuit is simplified in comparison to that described above for FIG. 8B. If the value of assignment condition AL(v) is 0, no hardware is generated because variable v was never asynchronously assigned a value. If the value of assignment condition AL(v) is "1", the value of variable v is simply assignment condition AD(v) so that again a latch is not needed. Therefore, hardware is built to generate assignment condition AD(v). Consider the following user description (TABLE 12).

TABLE 12

An Example of User Description 110

```
if (COND)
  Q := D
else
  Q := E
endif
```

The row of the assignment condition matrix for variable Q is given in TABLE 13.

TABLE 13

| Variable | Assignment Conditions | | | | | |
|---|---|---|---|---|---|---|
| | AL() | AD() | SL() | SD() | DC() | Z() |
| Q | 1 | D*COND + E*COND | 0 | 0 | 0 | 0 |

Figure 8D:
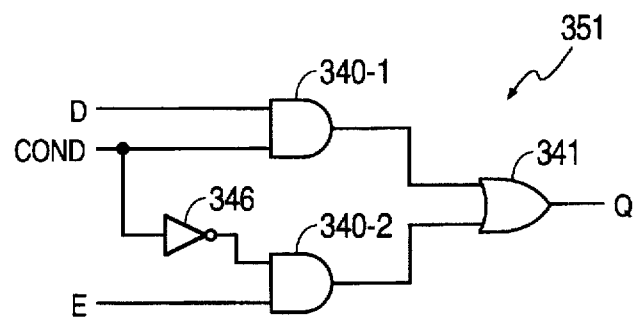
FIG. 8D is a logic circuit created by logic circuit generator 124 of this invention for the user description in Table 12.

Since the value of variable Q is simply assignment condition AD(Q), a logic circuit 351 consisting of the logic nodes required to generate the signal represented by assignment condition AD(Q) is built as shown in FIG. 8D. AND gate 340-1, in response to signals "D" and "COND," feeds OR gate 341 a first input signal "D * COND." Similarly, AND gate 340-2, in response to signals "E" and "not COND," feeds OR gate 341 a second input signal "E * (not COND)." Hence, the output signal Q of OR gate 341 is just activation condition AD(Q).

With respect to function Z(v), again consider variable Q and the assignment condition matrix row given in TABLE 15 for variable Q. TABLE 15 is associated with the following user description (TABLE 14):

TABLE 14

An Example of User Description 110

```
If ( COND )
  Q := "Z"
else
```

TABLE 14-continued

An Example of User Description 110

```
  Q := b + c
endif
```

Thus, characters b and c represent logic variables and string "COND" is a condition.

TABLE 15

| Variable | Assignment Conditions | | | | | |
|---|---|---|---|---|---|---|
| | AL() | AD() | SL() | SD() | DC() | Z() |
| Q | 1 | (b+c)*COND | 0 | 0 | 0 | COND |

In general for a row of the assignment condition matrix for variable v where assignment condition Z(v) is not zero and asynchronous load assignment condition AL(v) is one, a three-state driver is generated by logic circuit generator 124. The data input line of the three-state driver is connected to assignment condition AD(v), the enable input line of the three-state driver is connect to the inverse of assignment condition Z(v). The value of variable v is the signal on the three-state driver's output line.

Figure 9A:
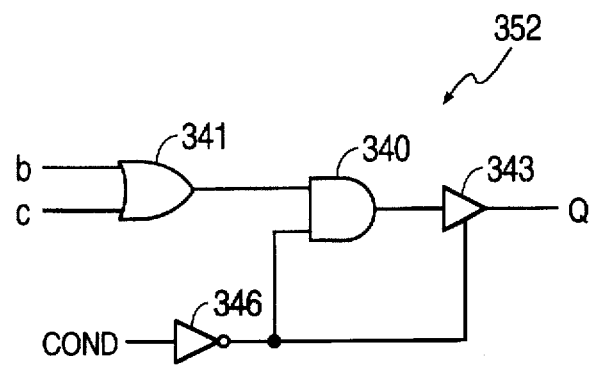
FIG. 9A is a logic circuit created by one embodiment of logic circuit generator 124 for the user description in Table 14.

In one embodiment, logic circuit 352 (FIG. 9A) is generated by logic circuit generator 124 for the row of the assignment condition matrix shown in TABLE 15. Since the value of assignment condition AL(Q) is "1", the value of variable Q is simply assignment condition AD(v) so that hardware is built to generate assignment condition AD(v). Specifically, OR gate 341, in response to input signals b and c, generates an output signal "b+c" which is a first input signal to AND gate 340. Output signal "not COND" from invertor 346 is a second input signal to AND gate 340. Thus, the output signal from AND gate 340 is assignment condition AD(Q). Further, since assignment condition Z(Q) is not zero, and asynchronous load assignment condition AL(Q) is one, a three-state driver 343 is generated by logic circuit generator 124. The data input line of the three-state driver 343 is connected to assignment condition AD(Q), which is the output signal of AND gate 340. Output signal "not COND" from invertor 346 also drives the enable input line of the three-state driver 343.

Figure 9B:
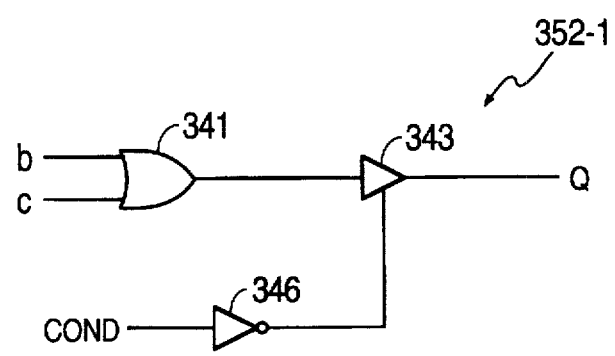
FIG. 9B is a logic circuit created by a preferred embodiment of logic circuit generator 124 of this invention for the user description in Table 14.

Thus, circuit 352 corresponds to the user description in TABLE 14 which was used to generate the row of the assignment condition matrix in TABLE 15. However, circuit 352 may be improved. A three-state hardware element does not use the value on its data input line whenever the signal on its enable input line is zero. Thus, the hardware generated to produce the signal on the data input line of three-state element 343, i.e., assignment condition AD(Q), is boolean minimized with assignment condition Z(Q) as a don't care condition by hardware generator 124B. Thus, when assignment condition AD(Q), i.e., "(not COND)*(b+c)" is boolean minimized with a don't care of assignment condition Z(Q), i.e., "COND", function "b+c" is the result. Circuit 352-1 (FIG. 9B) is the improved result that is preferably created by hardware generator 124B.

Thus, in one embodiment, when a row of the assignment condition matrix for variable v has assignment condition Z(v) and assignment condition AD(v) that are not zero, assignment condition AD(v) is boolean minimized with assignment condition Z(v) as a don't care condition. A logic circuit is created by hardware generator 124B to generate the function that results from the boolean minimization, i.e., a new assignment condition AD(v)', and the signal generated by that circuit drives the data input line of a three-state element. The "not" of assignment condition Z(v) drives the enable input line of the three-state element and the signal on the output line of the three state element is the value of variable v. Since in this embodiment function Z( ) is asynchronously driven, function Z( ) is in fact an asynchronous high impendance function AZ( ).

As explained above, when a row of the assignment condition matrix for variable v has a non-constant asynchronous data assignment condition AD(v) and a non-constant asynchronous load assignment condition AL(v), logic circuit generator 124 creates a latch with asynchronous data assignment condition AD(v) on the latch data input line and asynchronous load assignment condition AL(v) on the latch gate line. When a row of the assignment condition matrix for variable v has non-constant values for asynchronous data assignment condition AD(v), asynchronous load assignment condition AL(v) and high impendance assignment condition Z(v), two latches are required. The first latch is configured the same as when assignment condition Z(v) has a logic zero value. The output of the first latch drives the data input line of a three-state element. The data input line of the second latch is driven by assignment condition Z(v) and the gate input line of the second latch is driven by assignment condition AL(v). The output line of the second latch drives an inverter which in turn drives the date enable line of the three state element. To illustrate this example more completely, consider the user description in TABLE 16.

TABLE 16

An Example of a User Description 110

```
if(COND_1)
    if (COND)
        Q := "Z"
    else
        Q := b + c
    endif
else
endif
```

The row of the assignment condition matrix for variable Q is presented in TABLE 17.

TABLE 17

| Variable | Assignment Conditions | | | | | |
|---|---|---|---|---|---|---|
| | AL() | AD() | SL() | SD() | DC() | Z() |
| Q | COND_1 | COND_1*<br>COND*<br>(b+c) | 0 | 0 | 0 | COND_1*<br>COND |

In one embodiment, logic circuit 353 (FIG. 10A) is created by logic circuit generator 124 for the row of the assignment condition matrix shown in TABLE 15. Specifically, logic circuit 353 has the value of assignment condition AD(Q) connected to the input line of latch 342-1. The gate line of latch 342-1 is driven by the value of assignment condition AL(Q). The input line of three-state driver 343 is driven by the output signal of latch 342-1. The data enable line of three-state driver 343 is driven by the inverted output signal of latch 342-2. The input line of latch 342-2 is connected to the value of assignment condition Z(Q). The gate line of latch 342-2 is connected to the value of assignment condition AL(Q), i.e. "COND_1." Again, logic circuit 353 is a literal representation of the user description in TABLE 16.

However, as explained above, for a row of assignment condition matrix for variable Q with assignment conditions AL(Q) and AD(Q), the logic circuit generated for these assignment conditions is preferably the boolean minimization of assignment condition AD(Q) with the don't care condition of "not assignment condition AL(Q)." Also as explained above, when a row of the assignment condition matrix for variable Q where assignment condition Z(Q) and assignment condition AD(Q) are not zero, assignment condition AD(Q) is boolean minimized with assignment condition Z(Q) as a don't care condition.

Thus, assignment condition AD(Q) (TABLE 17) is boolean minimized with "(not assignment condition AL(Q)+ assignment condition Z(Q)" as a don't care condition. Specifically, the don't care condition "(not COND_1)+ (COND_1*COND)" is used to generate assignment condition AD(Q)', i.e., "b+c".

As described above, the data input line of second latch 342-2 is driven by assignment condition Z(Q) and gate input line 342-G of latch 342-2 is driven by assignment condition AL(Q) and preferably assignment condition Z(Q) is boolean minimized with the not of assignment condition AL(Q) as a don't care condition. The minimization gives an assignment condition Z(Q)' of "COND". Hence, after minimization the row for variable Q in the assignment condition matrix is as shown in TABLE 18.

TABLE 18

| Variable | Assignment Conditions | | | | | |
|---|---|---|---|---|---|---|
| | AL() | AD() | SL() | SD() | DC() | Z() |
| Q | COND_1 | b + c | 0 | 0 | 0 | COND |

Logic circuit 353-1 (FIG. 10B) is, created by logic circuit generator 124 for the row of the assignment condition matrix shown in TABLE 18. Specifically, logic circuit 353-1 has the value of assignment condition AD(Q) (TABLE 18) connected to the input line of latch 342-1. The gate line of latch 342-1 is driven by the value of assignment condition AL(Q) (TABLE 18). The input line of three-state driver 343 is driven by the output signal of latch 342-1. The data enable line of three-state driver 343 is driven by the inverted output signal of latch 342-2. The input line of latch 342-2 is connected to the value of assignment condition Z(Q) (TABLE 18). The gate line of latch 342-2 is connected to the value of assignment condition AL(Q), i.e. "COND_1."

Figure 10A:
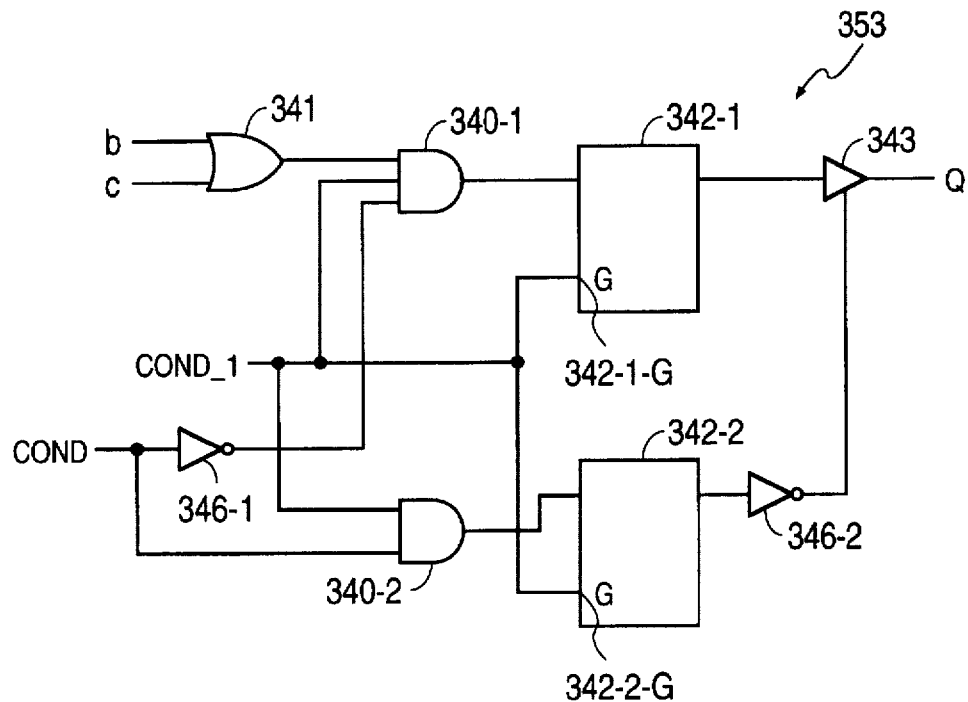
FIG. 10A is a logic circuit created by one embodiment of logic circuit generator 124 for the user description in Table 16.
Figure 10B:
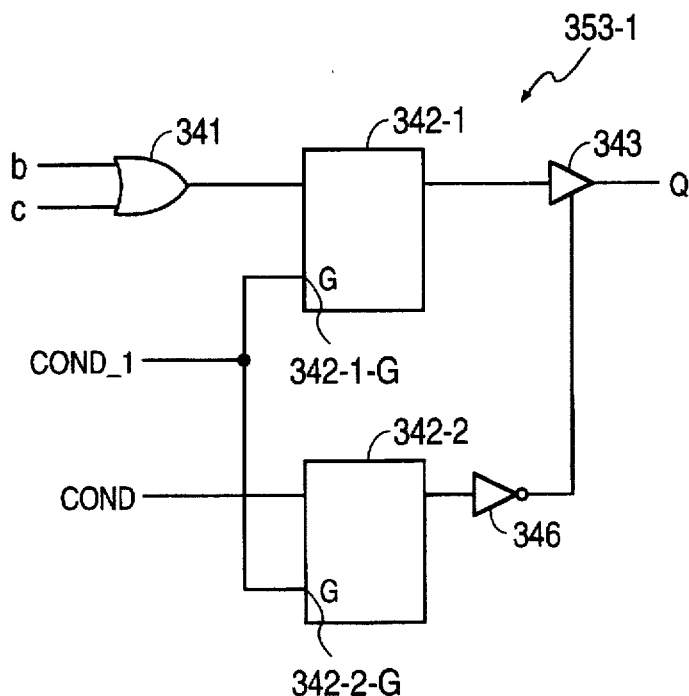
FIG. 10B is a logic circuit created by a preferred embodiment of logic circuit generator 124 of this invention for the user description in Table 16.

Comparison of FIGS. 10A and 10B shows that the boolean minimization has eliminated three logic nodes from circuit 353. Hence, as previously described, assignment conditions Z(v) and AD(v) for variables v are preferably boolean minimized with the not of assignment condition AL(v) whenever assignment condition AL(v) is other than a logic one. Assignment condition AD(v) is also boolean minimized with assignment condition z(v) as a don't care condition.

With respect to function DC(v), again consider variable Q and the assignment condition matrix row given in TABLE 20 for variable Q. TABLE 20 is associated with the user description in TABLE 19.

TABLE 19

An Example of User Description 110

```
If ( COND )
    Q := "X"
else
    Q := b + c
endif
```

Characters b and c represent logic variables and string "COND" is a condition.

TABLE 20

| Variable | Assignment Conditions | | | | | |
|---|---|---|---|---|---|---|
| | AL() | AD() | SL() | SD() | DC() | Z() |
| Q | 1 | (b+c)*COND | 0 | 0 | COND | 0 |

In this case, the hardware generated for variable Q is assignment condition AD(Q) optimized with assignment condition DC(Q) as a "don't care." Specifically, in one embodiment, a Karnaugh map, such as the one shown in TABLE 21, is used for the optimization.

TABLE 21

A Simple Karnaugh Optimization for Don't Care

| COND | BC | | | |
|---|---|---|---|---|
| | 00 | 01 | 11 | 10 |
| 0 | 0 | 1 | 1 | 1 |
| 1 | d | d | d | d |

Figure 11:
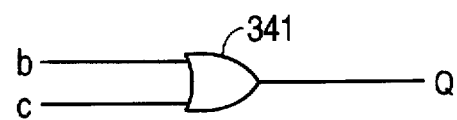
FIG. 11 is a logic circuit generated by logic circuit generator 124 of this invention for the user description in Table 19.

The Karnaugh map shows that the optimization is just "b+c". Hence, as shown in FIG. 11, the hardware generated is simply OR gate 341 with input signals b and c and output signal Q.

Other combinations of assignment conditions in a row of the assignment condition matrix for variable v where assignment conditions AL(v), AD(v), Z(v), and DC(v) are all non-zero and not a constant are possible. However, the hardware generated by logic circuit generator 124 follows directly from the above description. Assignment condition Z(v) is boolean minimized with the not of assignment condition AL(v) as a don't care condition to obtain assignment condition Z(v)'. Assignment condition AD(v) is boolean minimized with the logic OR function of (i) the not of assignment condition AL(v) as a don't care condition, (ii) assignment condition Z(v)' as a don't care condition and (iii) assignment condition DC(v) to yield assignment condition AD(v)'. The resulting row of the assignment condition matrix for variable v includes assignment conditions AL(v), AD(v)', DC(v) and Z(v)'. Logic circuit generator 124 generates a logic network for this resulting row as described above.

The other possible entries in a row of the assignment condition matrix include one of the synchronous hardware description functions. In general, for a row in the assignment condition matrix where assignment condition SL(v) is a logic one, assignment condition AL(v) is a logic zero, and assignment condition SD(v) is non-zero, a D-type flip-flop is built for variable v by hardware generator 124B. Assignment condition SD(v) is applied to the input line of the flip-flop and the clock edge is applied to the clock input terminal. The signal on the flip-flop output line is the value of the variable v.

With respect to function SD( ), again consider variable Q and the assignment condition matrix row given in TABLE 23 for variable Q for the user description in TABLE 22:

TABLE 22

An Example of User Description 110

If ( positive_edge(CLOCK) )
   Q := b + c
else

TABLE 22-continued

An Example of User Description 110 endif

Thus, characters b and c represent logic variables. As described above, the condition "positive_edge(CLOCK)" requires a synchronous function.

TABLE 23

| Variable | Assignment Conditions | | | | | |
|---|---|---|---|---|---|---|
| | AL() | AD() | SL() | SD() | DC() | Z() |
| Q | 0 | 0 | 1 | b+c | 0 | 0 |

When assignment condition AL(Q) is a logic zero and assignment condition SL(Q) is a logic one, the hardware generated for variable Q (TABLE 23) is a D-type flip-flop 344 (FIG. 12) and an OR gate 341. Signals b and c drive OR gate 341 which in turn drives the input line of D-type flip-flop 344. Clock terminal 344-CL of flip-flop 344 is driven by the clock signal, in this embodiment a positive clock edge, associated with the synchronous functions. The conditions in TABLE 23 are the simplest synchronous conditions. Other possible conditions are when either the asynchronous load assignment condition is non-zero or synchronous load assignment condition is not a logic one.

With respect to function SL( ), consider a variable Q and the assignment condition matrix row given in TABLE 25 for variable Q for the user description in TABLE 24:

TABLE 24

An Example of User Description 110

If ( positive_edge(CLOCK))
  If ( COND
    Q := b + c
  else
  endif
else
endif

Characters b and c represent logic variables and string "COND" is a condition.

TABLE 25

| Variable | Assignment Conditions | | | | | |
|---|---|---|---|---|---|---|
| | AL() | AD() | SL() | SD() | DC() | Z() |
| Q | 0 | 0 | COND | (b+c)*COND | 0 | 0 |

Figure 13:
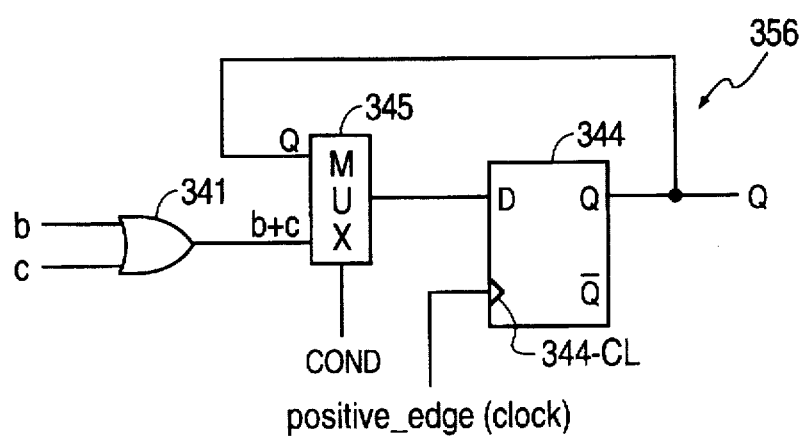
FIG. 13 is a logic circuit generated by logic circuit generator 124 of this invention for the user description in Table 24.

As described above, the logic circuit created to generate the value of variable Q with assignment condition SL(Q) is a D-type flip-flop 344 (FIG. 13). However, when assignment condition SL(Q) is not a constant, a multiplexer is added to the logic circuit. For variable Q, a feedback multiplexer 345 is added because in this case, signal b+c, i.e., the output signal of OR gate 341, is not passed to flip-flop 344 on the positive clock edge unless condition "COND" is true. Thus, signal b+c drives a first input terminal of multiplexer 345. The second input terminal of multiplexer 345 is tied to the D-type flip-flop 344 output line. The signal selection terminal of multiplexer 345 is driven by signal "COND". Multiplexer 345 is configured so that signal b+c is selected when signal "COND" is true. When signal "COND" is false, output signal Q is gated through flip-flop 344 by a positive clock edge. Thus, when assignment condition SL(Q) is not a constant, the multiplexer is controlled by assignment condition SL(Q) so that only when assignment condition SL(Q) is true on a clock edge the value on the flip-flop output line is assignment condition SD(Q). For all other clock edges, the value on the flip-flop output line stays at the value of variable Q.

As explained above, when a row of the assignment condition matrix for variable v has a logic one synchronous load assignment condition SL(v), logic circuit generator 124 creates a flip-flop with synchronous data assignment condition SD(v) on the flip-flop data input line and the clock edge on the flip-flop clock terminal. When a row of the assignment condition matrix for variable v has a logic one value for synchronous load assignment condition SL(v) and high impendance assignment condition Z(v) is non-constant, two flip-flops are required. The first flip-flop is configured the same as when assignment condition Z(v) has a logic zero value. The output signal of the first flip-flop drives the data input line of a three-state element. The data input line of the second flip-flop is driven by assignment condition Z(v) and the clock terminal of the second flip-flop is driven by the clock edge. The output line of the second flip-flop drives an invertor which in turn drives the data enable line of the three state element. In this case, high impendance function Z( ) is in fact synchronous high impendance function SZ( ) because the function takes on a value only on a clock edge.

To illustrate this example more completely, consider the user description in TABLE 26 which is the basis of the row of the assignment condition matrix illustrated in TABLE 27.

TABLE 26

An Example of User Description 110

If ( positive_edge(CLOCK))
  If ( COND )
    Q := "Z"
  else
    Q := b + c
  endif
else
endif.

Again, characters b and c represent logic variables and string "COND" is a condition.

TABLE 27

| Variable | Assignment Conditions | | | | | |
|---|---|---|---|---|---|---|
| | AL() | AD() | SL() | SD() | DC() | Z() |
| Q | 0 | 0 | 1 | (b+c)* COND | 0 | COND |

Figure 14A:
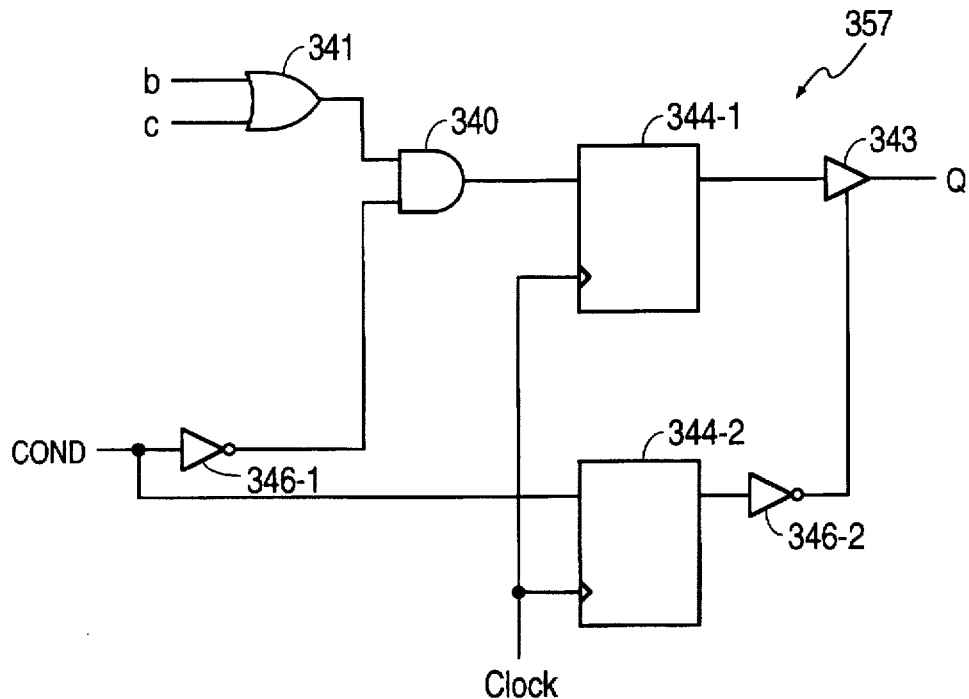
FIG. 14A is a logic circuit created by one embodiment of logic circuit generator 124 for the user description in Table 26.

As described above, when assignment condition SL(Q) is non-zero, a first flip-flop 344-1 (FIG. 14A) is built, as described above, so that assignment condition SD(Q) drives the input terminal of flip-flop 344-1. Similarly, since the assignment condition Z(Q) is non-zero and driven on a clock edge, the output signal of flip-flop 344-1 drives a three-state element 343. Also, an additional flip-flop 344-2 is required to generate the three-state enable signal. The data input line of flip-flop 344-2 is driven by assignment condition Z(Q). The clock input line of flip-flop 344-2 is connected to the clock signal associated with the synchronous function, and the inverted output signal of flip-flop 344-2 drives the enable line of three-state driver 343. Logic circuit 357 performs the operations specified by the user description in TABLE 27. However, logic circuit 357 may be further optimized.

Figure 14B:
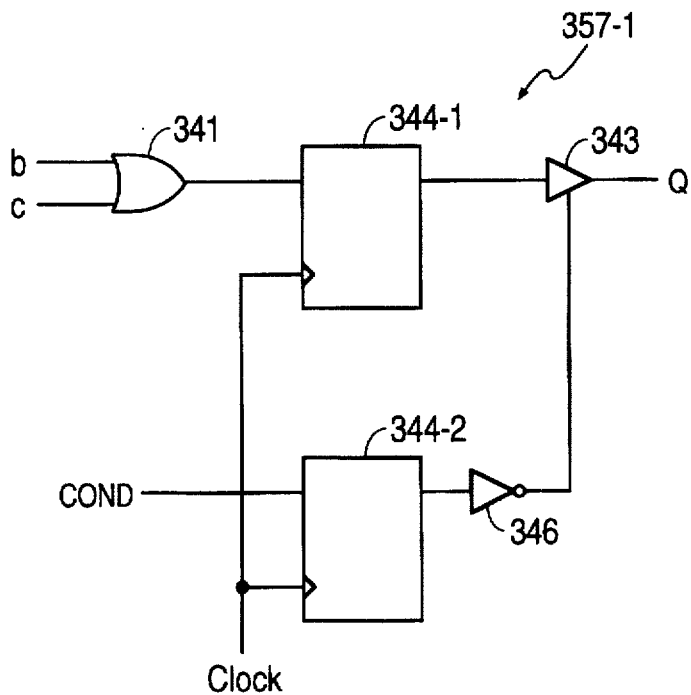
FIG. 14B is a logic circuit created by a preferred embodiment of logic circuit generator 124 of this invention for the user description in Table 26.

In a matter analogous to the asynchronous functions described above, assignment condition SD(Q) is boolean minimized with assignment condition Z(Q) as a don't care condition. This optimization results in the assignment condition SD(Q)' becoming"b+c." For the optimized assignment condition, logic circuit generator 124 produces logic circuit 357-1 (FIG. 14B).

With respect to function DC(v), again consider variable Q and the assignment condition matrix row given in TABLE 29 for variable Q as defined in the user description of TABLE 28:

TABLE 28

An Example of User Description 110

If ( positive_edge(CLOCK)
  If ( COND )
    Q := "X"
  else
    Q := b + c
  endif
else
endif.

TABLE 29

| Variable | Assignment Conditions | | | | | |
|---|---|---|---|---|---|---|
| | AL() | AD() | SL() | SD() | DC() | Z() |
| Q | 0 | 0 | 1 | (b+c)* COND | COND | 0 |

Figure 12:
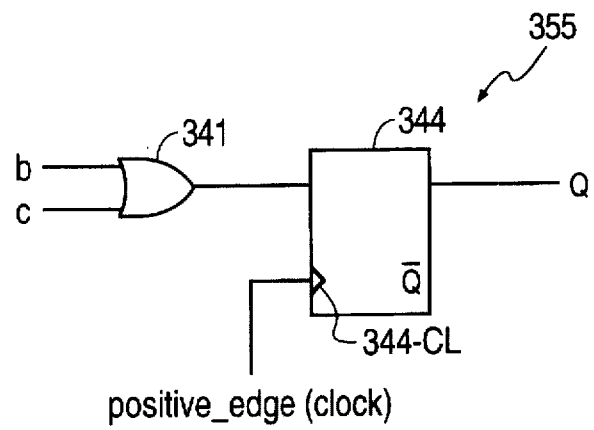
FIG. 12 is a logic circuit generated by logic circuit generator 124 of this invention for the user description in Table 22.
Figure 15:
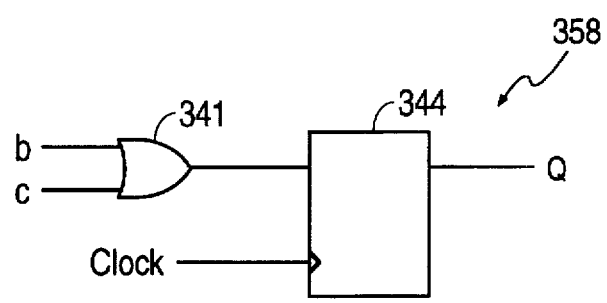
FIG. 15 is a logic circuit generated by logic circuit generator 124 of this invention for the user description in Table 28.

Again in a manner similar to the asynchronous functions described above, assignment condition SD(Q) is optimized with assignment condition DC(Q) as a don't care condition. The result of the optimization is that assignment condition SD(Q)' is "b+c". Thus, the logic circuit generated for the row of the assignment condition matrix in TABLE 29 is illustrated in FIG. 15. Since the circuit in FIG. 15 is the same as circuit 355 in FIG. 12, the description of FIG. 12 is incorporated herein by reference.

The previous examples demonstrated building logic circuits based upon a row in the assignment condition matrix that included either only synchronous or only asynchronous functions coupled with the don't care or high impendance functions. However, a row in the assignment condition matrix may contain assignment conditions for both synchronous and asynchronous functions.

Consider first a row in the assignment condition matrix for variable v which has non-zero entries for assignment conditions AL(v), SL(v) and SD(v). The assignment condition AD(v) is a logic zero. Since SL(v) and SD(v) are non-zero, a flip-flop is generated, as in the synchronous examples described above. However, the flip-flop has a clear-direct line. The clear-direct line is driven by the value of assignment condition AL(v).

As another example, consider a row in the assignment condition matrix for variable v which has non-zero entries for assignment conditions AL(v), AD(v), SL(v) and SD(v) where assignment condition AD(v) is a logic one. Again, since synchronous assignment conditions SL(v) and SD(v) are non-zero, a flip-flop is generated, as in the synchronous examples described above. However, in this situation the flip-flop has a set-direct line. The set-direct line is driven by assignment condition AL(v). If assignment condition AD(v) has an unknown value instead of a logic one, the flip-flop has both a set-direct terminal and an clear-direct terminal, as described more completely below. In this case, additional logic nodes may be generated so that the logic circuit performs the operations specified by the row of the assignment condition matrix.

Note that in these cases, the values of assignment conditions SL(v) and SD(v) are not important when assignment condition AL(v) is true. Thus, in one embodiment, assignment conditions SL(v) and SD(v) are boolean minimized with assignment condition AL(v) as don't care condition prior to logic circuit generation.

To further illustrate the logic circuit generated for a row in the assignment condition matrix having non-zero entries for both synchronous and asynchronous functions consider variable Q and the assignment condition matrix row given in TABLE 31 for variable Q as defined in the user description given in TABLE 30:

TABLE 30

An Example of User Description 110 if (COND)
    Q := 0
else
    if ( positive_edge(CLOCK) )
        Q := b + c
    else
    endif
endif.

Characters b and c represent logic variables and string "COND" is a condition.

TABLE 31

| Variable | Assignment Conditions | | | | | |
|---|---|---|---|---|---|---|
| | AL( ) | AD( ) | SL( ) | SD( ) | DC( ) | Z( ) |
| Q | COND | 0 | 1*$\overline{COND}$ | (b+c)*$\overline{COND}$ | 0 | 0 |

As explained above, preferably before hardware generation, assignment conditions SL(Q) and SD(Q) are boolean minimized with assignment condition AL(Q) as don't care condition. Hence, after minimization, assignment condition SL(Q)' has a logic one value and assignment condition SD(Q) has the value "b+c." Recall that in the example above when assignment condition SL(Q) had a non-constant value, a multiplexer was required. Thus, the minimization eliminated the need for this circuit element. Similarly, minimization of assignment condition SD(Q) eliminated the need for other logic nodes.

Figure 16:
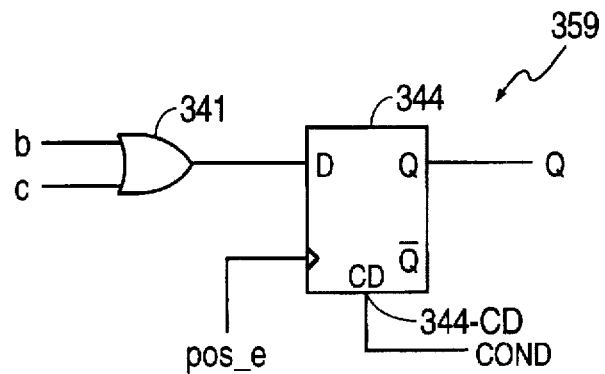
FIG. 16 is a logic circuit created by logic circuit generator 124 of this invention for the user description in Table 30.

Accordingly, the logic circuit generated for the row of the assignment condition matrix in TABLE 31 after the boolean minimization is a D-type flip-flop 344 and an OR gate 341 (FIG. 16). D-type flip-flop 344 has a clear direct terminal 344-CD such that when a true signal is applied to terminal 344-CD, the output signal of flip-flop 344 is a logic zero. Signals b and c drive OR gate 341 and the output signal of OR gate 341 in turn drives the input line of D-type flip-flop 344. Clock terminal 344-CL is driven by the clock edge, in this embodiment a positive clock edge, associated with the synchronous functions. Signal "COND", i.e., assignment condition AL(Q) drives clear-direct terminal 344-CD of flip-flop 344.

An even more complex configuration for variable Q is given by the assignment condition matrix row in TABLE 33 for the user description given in TABLE 32:

TABLE 32

An Example of User Description 110 if (COND)
    Q := s
else
    if ( positive_edge(CLOCK) )
        Q := b + c
    else
    endif
endif.

Characters b, c and s represent logic variables and string "COND" is a condition.

TABLE 33

| Variable | Assignment Conditions | | | | | |
|---|---|---|---|---|---|---|
| | AL( ) | AD( ) | SL( ) | SD( ) | DC( ) | Z( ) |
| Q | COND | s | 1*$\overline{COND}$ | (b+c)*$\overline{COND}$ | 0 | 0 |

Figure 17:
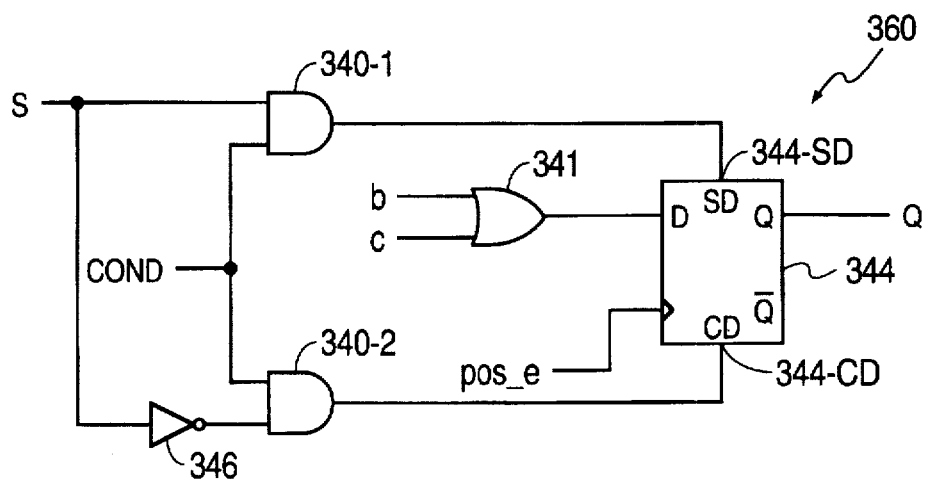
FIG. 17 is a logic circuit generated by logic circuit generator 124 of this invention for the user description in Table 32.

Again, assignment conditions SL(v) and SD(v) are boolean minimized using assignment condition AL(Q) as a don't care condition, as described in the preceding example for TABLES 30 and 31. Logic circuit 360 (FIG. 17) generated for variable Q again includes a D-type flip-flop 344 and an OR gate 341, but D-type flip-flop 344 has both a set-direct terminal 344-SD and a clear-direct terminal 344-CD. When a true signal is applied to clear-direct terminal 344-CD, the output signal of flip-flop 344 is a logic zero. Conversely, when a true signal is applied to set-direct terminal 344-SD, the output signal of flip-flop 344 is a logic one.

Signals b and c drive OR gate 341 and the output signal of OR gate 341 in turn drives the input line of D-type flip-flop 344. Clock terminal 344-CL is driven by the clock edge, in this embodiment a positive clock edge, associated with the synchronous functions. The remainder of the circuit depends on the value of variable s. In one embodiment, the value of variable s is assumed to be unknown, e.g., variable s is an input signal to the user's logic circuit. If condition "COND" is true and the value of variable s is a logic zero, the output signal from flip-flop must be a logic zero, i.e., an active signal must be applied to clear-direct terminal 344-CD. Conversely, if condition "COND" is true and the value of variable s is a logic one, the output signal from flip-flop must be a logic one, i.e., an active signal must be applied to set-direct terminal 344-SD of flip-flop 344. Thus, in one embodiment, two AND gates 340-1, 340-2 and an invertor 346 are generated to provide the appropriate signals to terminals 344-SD and 344-CD of flip-flop 344.

In each of the above examples, only a single row of the assignment condition matrix was considered. However, an assignment condition matrix may have one or more rows and a variable assigned a value by a row of the matrix may be subsequently used in an assignment condition for another variable. For example, in TABLE 7 above, the variable B is first assigned a value and then variable B is used in assigning a value to variable Q. In this situation, the logic circuit for each row is simply generated and then the output value of variable B is connected to the input value of variable B for the circuit that generates the variable Q. If the value of variable B is not generated by a logic circuit, the variable B is an input signal and so, in this case, the input value of variable B is obtained from an input pin.

Thus, in one embodiment, the activation conditions for edges exiting directive nodes representing directive statements are used to generate an assignment condition matrix. The assignment condition for a particular variable is determined by locating all the directive nodes were the variable is assigned a value and then combining the conditions under which that variable is assigned a value with a logic OR function. Since the assignment condition is a global attribute of the control flow graph, the assignment condition may become very complex.

Figure 18:
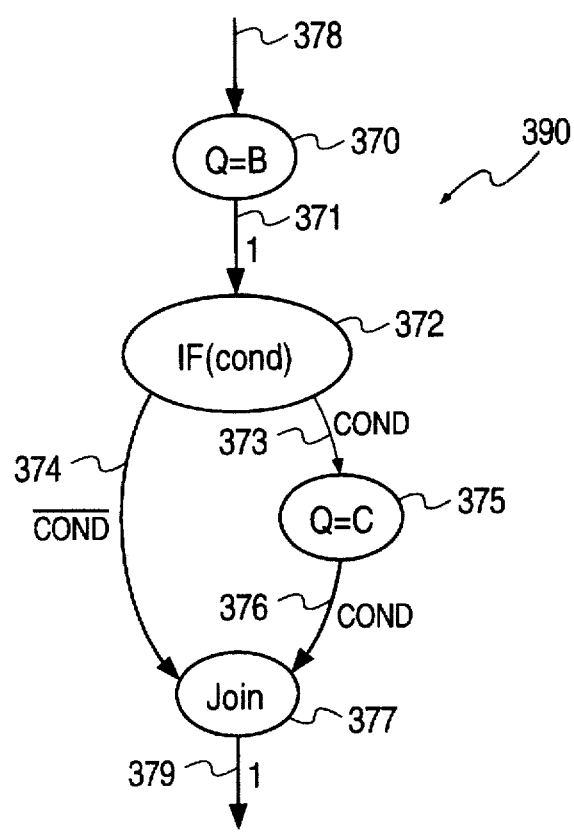
FIG. 18 is a control flow graph, created by graph generator 132 of this invention for the user description in Table 34.

In each of the above examples, all paths from the source to the sink of the control flow graph contain no more than one directive node which assigned a value to a particular variable. When a first directive node assigns a value to a variable that is over-ridden by a subsequent assignment at subsequent directive nodes, the activation condition used for the first node is the logic AND function of the first directive node's activation condition with the logic NOT function of the logic OR function of the activation conditions for all overriding assignments. To demonstrate this, consider the following user instructions (TABLE 34) which are illustrated in FIG. 18 as control flow graph 390.

TABLE 34

An Example of User Description 110

Q := B
if ( COND )
    Q := C;
else
endif.

The assignment to variable Q at node 370 (FIG. 18) is over-ridden by the assignment at node 375. Thus, the activation condition used at node 370 is modified as described above. The original activation condition is "1". In this example, there is only one overriding assignment, so that the logical OR is just the single activation condition "COND". The modified activation condition is:

"1" AND(not(COND))    (3)

Or, more simply:

NOT(COND)    (4)

Table 35 shows the assignment conditions for the user description in TABLE 34.

TABLE 35

| | Assignment Conditions | | | | | |
|---|---|---|---|---|---|---|
| Variable | AL( ) | AD( ) | SL( ) | SD( ) | DC( ) | Z( ) |
| Q | 1 | $(\overline{COND}*B)+$ $(COND*C)$ | 0 | 0 | 0 | 0 |

If the value of a variable is used before the variable is overridden, the logic for that use is built without considering the overriding assignments. The modification of activation conditions required by overriding assignments is not necessary in the mux condition embodiment, described below.

In another embodiment, as described above, mux conditions are generated by condition generator 133 (FIG. 3) for each edge in the control flow graph that feeds into a join node. The generation of assignment conditions and the associated creation of a logic circuit from the assignment condition matrix using mux conditions generally results in the most efficient logic circuits.

The generation of assignment conditions based upon mux conditions flows naturally from the control flow graph. The advantage of computing assignment conditions with the mux condition method is that the structure of the resulting logic matches the structure of the control flow graph. The logic resulting from the activation condition method is unstructured.

In this embodiment, as described more completely below, the assignment conditions for the six hardware functions are evaluated locally at each node in the control flow graph by logic circuit generator 124 (FIG. 2) rather than the more global approach of the activation condition method described above. Prior to consideration of generating the assignment condition matrix, consider the hardware representation of a mux condition for user description in TABLE 36:

TABLE 36

An Example of User Description 110

If ( COND )
    Q := B
else
    Q := C
endif.

Figure 19A:
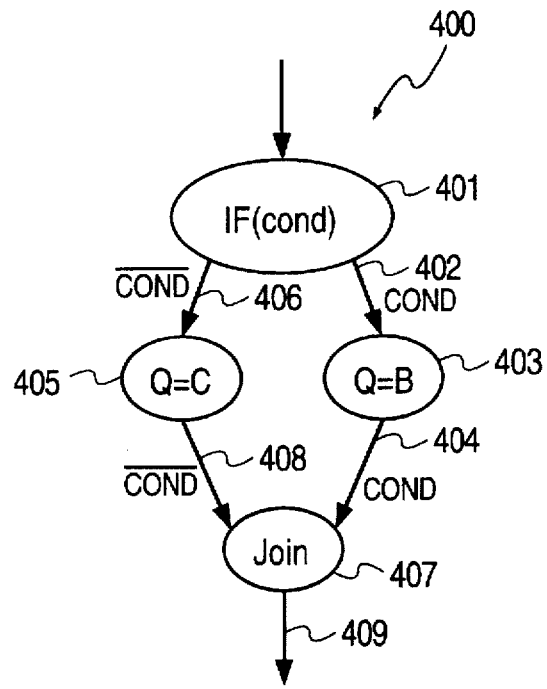
FIG. 19A is a control flow graph created by graph generator 132 of this invention for the user description in Table 36.

Control flow graph 400 (FIG. 19A) is generated by graph generator 132 (FIG. 3) for this user description. In this embodiment, condition generator 133 generates mux conditions for edges 404 and 408, which for this simple example are the same as the activation conditions described above.

Figure 19B:
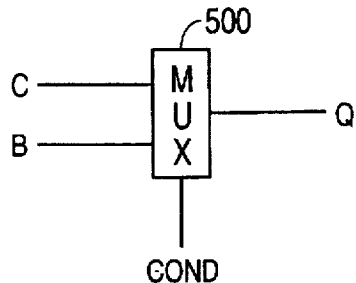
FIG. 19B is a block diagram of a multiplexer associated with one embodiment of the logic circuit generator 124 of this invention.

The hardware corresponding to control flow graph 400 is structure 500 (FIG. 19B). Signals B and C are input signals on the two input lines of structure 500. Condition "COND" is applied to input select line of structure 500. When condition "COND" is true, signal B is passed to the output line of structure 500 as signal Q. Conversely, when condition "COND" is false, signal C is passed to the output line of structure 500 as signal Q.

Thus, structure 500 is simply a multiplexer and hence, the name mux conditions.

Figure 20:
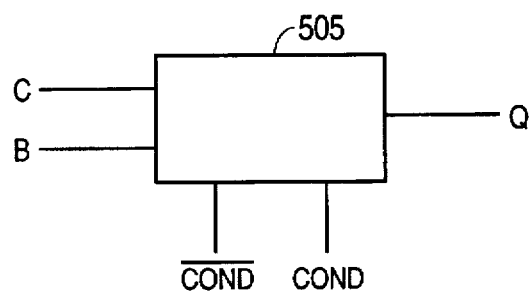
FIG. 20 is a block diagram of a selector associated with one embodiment of the logic circuit generator 124 of this invention.

However, in a more general representation, a selector 505 is generated to represent control flow graph 400. Specifically, the output signal of selector 505 is associated with edge 409 from join node 407. Selector 505 (FIG. 20) has two input lines. The first input line is driven by signal C for node 405 and the second input line is drive by signal B for node 403. Selector 505 also has two data input select lines. The first data input select line is driven by signal "COND", the mux condition for edge 404, and the second data input select line is driven by signal "not COND", the mux condition for edge 408. If signal "COND" is true, output signal Q of selector 505 is signal B. If signal "not COND" is true, output signal Q of selector 505 is signal C. Thus, output signal Q of selector 505 is $Q=B*COND+C*\overline{COND}.$    (6)

A somewhat more representative user description is presented in TABLE 37:

TABLE 37

An Example of User Description 110

```
If ( COND1 )
        If ( COND2)
                Q := B
        else
                Q := C
        endif
else
        Q := D
endif.
```

Control flow graph 410 (FIG. 21A) is generated by graph generator 133 (FIG. 3) for this user description. In this embodiment, condition generator 133 generates mux conditions for edges 413, 415, 417, and 419 (note that in this embodiment only the edges that enter a join node are actually considered). As defined above, the mux condition for an edge into a join node is computed by boolean minimizing the activation condition for that edge with the inverse of the activation condition of the edge leaving the join node as a don't care condition.

Figure 21A:
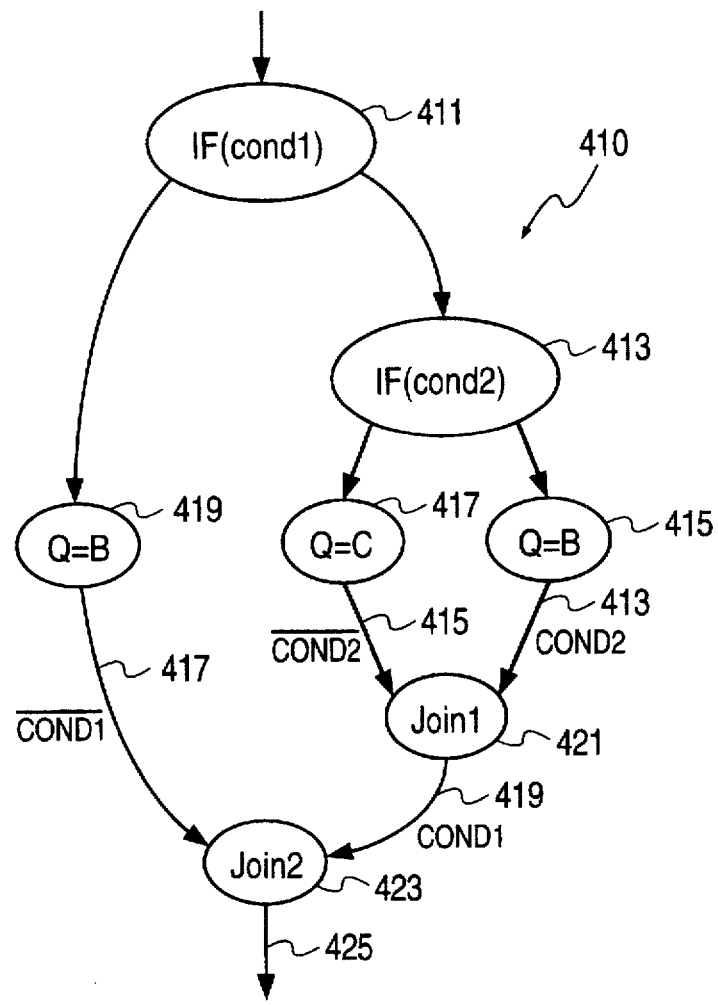
FIG. 21A is a control flow graph as created by graph generator 132 of this invention for the user description in Table 37.

For example, the activation condition for edge 413 into join node 421 is "COND1*COND2". The activation condition for edge 419 leaving join node 421 is "COND1". Thus, the mux condition for edge 413 is the boolean minimization of "COND1*COND2" with the don't care condition of "not COND1". The boolean minimization results in a mux condition of "COND2" for edge 413. FIG. 21A illustrates the other mux conditions for the edges in flow control graph 410.

Figure 21B:
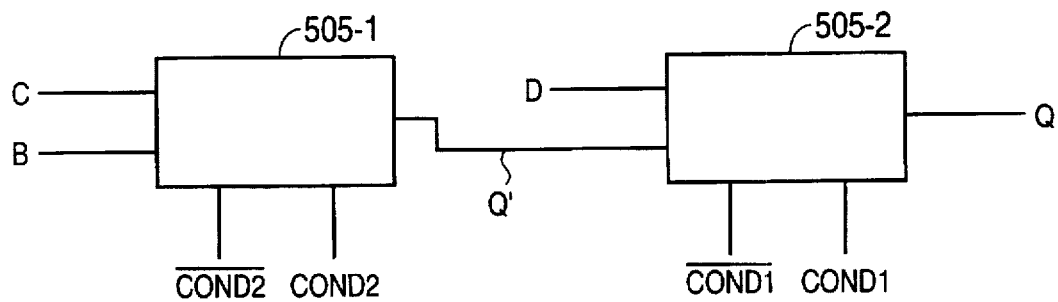
FIG. 21B illustrates use of selectors according to the principles of this invention to generate the value of the variable Q as defined in Table 37.

The hardware embodiment associated with FIG. 21A is illustrated in FIG. 21B. Signals B and C are input signals on the two input lines of selector 505-1 that is associated with edge 419 from join node 421. Condition "COND2", the mux condition for edge 413, is applied to one data input select line of selector 505-1 and condition "not COND2", the mux condition for edge 415, is applied to the other data input select line. When condition "COND2" is true, signal B, node 415, is passed to the output line of selector 505-1. Conversely, when condition "COND2" is false and therefore condition "not COND2" is true, signal C, node 417, is passed to the output line of selector 505-1. Thus, output signal Q' of selector 505-1 is:

$$Q'=B*COND2+C*\overline{COND2} \quad (7)$$

Output signal Q' of selector 505-1 is a first input signal to selector 505-2. The second input signal to selector 505-2 is signal D that is associated with edge 425 from node 423. Condition "COND1" is applied to a first input select line of selector 500-2. Condition "not COND1" is applied to a second input select line of selector 500-2. When condition "COND1" is true, output signal Q' of selector 500-1 is passed to the output line of selector 500-2 as signal Q. Conversely, when condition "COND1" is false, signal D is passed to the output line of multiplexer 500-2 as signal Q. Thus, output signal Q of selector 505-2 is:

$$Q=(B*COND2+C*\overline{COND2})*COND1+(D*\overline{COND1}) \quad (8)$$

In this embodiment, upon completion of operation of preprocessor 122, a control flow graph has been generated by graph generator 132 and conditions generator 133 has generated a mux condition for each edge of the graph that is an input edge to a join node. Logic circuit generator 124 processes the control flow graph sequentially from the source of the graph to the sink of the graph. Typically, the source of the control flow graph is the point where execution starts and the sink is the last point executed before the execution is completed.

Specifically, as described more completely below, at each join node a selector is defined for each asynchronous function, don't care function and high impendance function using the mux condition for the edges into that node. The output signal of the selector is associated with the edge leaving the join node. If the selector output signal includes a clock edge, also as explained below, the output of the selectors for the asynchronous functions are mapped to the synchronous functions. For the edges leading into each join node, one selector is used for each hardware function to process the selector outputs for that same hardware function that are associated with the edge into the join node. Thus, the selector output signal for a particular hardware function is sequentially cascaded join node to join node until the final join node is encountered, as shown below. At the last join node, the selector output is the assignment condition for that hardware function.

While the actual process used is straightforward, the description appears rather complex. Hence, an example motivating the actual use of selectors is first described and then the use of selectors is described more completely.

At each directive node where a logic variable is assigned a value, a row of the assignment condition matrix that is associated with the edge from the node is generated. The row is referred to as "a working assignment condition row" or simply "a working row". Upon encountering a join node, the working rows, that have been generated since either initiation of processing or since a prior join node, are processed and a row of the assignment condition matrix is generated. That row of the assignment condition is propagated through each subsequent join node as an input value to a selector. However, if the value of variable represented by the row is not affected in subsequent operations, the effect is one of simply carrying the completed row of the matrix through until the sink of the control flow graph is reached. Otherwise, the effect is as described above in reference to FIG. 21. However, as explained more completely below, several different situations must be considered in generating the assignment conditions for a particular variable.

Again, asynchronous hardware functions AL( ) and AD( ) are somewhat easier and so examples of the processing by logic circuit generator 124 for these functions are considered first. Consider the user description in TABLE 38. (TABLE 38 is the same as TABLE 36 so that control flow graph 400 (FIG. 19A) represents the user description in TABLE 38).

TABLE 38

An Example of User Description 110

```
If ( COND )
        Q := B
else
        Q := C
endif.
```

As explained above, a working row is generated for node 403 of control flow graph 400 (FIG. 19A) using the rules for the assignment condition for asynchronous functions AL( ) and AD( ) described above. The working row generated in the table for directive nodes is the same as the row generated in the assignment condition matrix for a user description which contains just the directive statement. Thus, the working row for node 403 is equal to the row generated by the HDL description:

Q:=B

A working row is also generated for node 405 and is the second row in TABLE 39. The working row in the table for a join node is built from a selector with input signals from the rows of the edges feeding into the join and the mux conditions on the edges. The third row in TABLE 39 represents join node 407.

TABLE 39

| Variable | Assignment Conditions | | | | | |
|---|---|---|---|---|---|---|
| | AL( ) | AD( ) | SL( ) | SD( ) | DC( ) | Z( ) |
| Q(Node 403) | 1 | B | 0 | 0 | 0 | 0 |
| Q(Node 405) | 1 | C | 0 | 0 | 0 | 0 |
| Q(Node 407) | 1 | COND*B+ COND*C | 0 | 0 | 0 | 0 |

The generation of a logic circuit using the mux condition method is similar to that previously described for the activation condition method. The row corresponding to the final join node of the graph is used for logic circuit generation.

The assignment conditions for high impedance function Z(v) also utilizes a selector. Consider the user description in TABLE 40.

TABLE 40

An Example of User Description 110

If ( COND )
    Q := "Z"
else
    Q := C
endif.

Figure 22A:
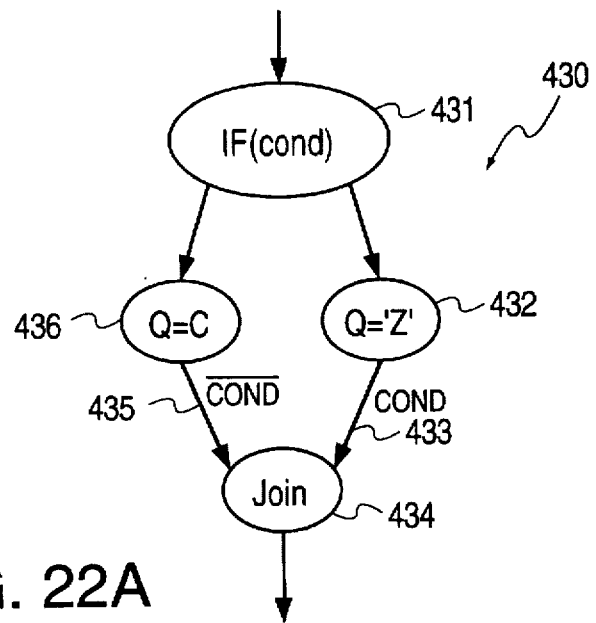
FIG. 22A is a control flow graph created by graph generator 132 of this invention for the user description in Table 40.

Control flow graph 430 (FIG. 22A) is generated by graph generator 132 (FIG. 3) for this user description. In this embodiment, condition generator 133 generates mux conditions for edges 433 and 435, which for this simple example are the same as the activation conditions described above.

Again, using the working rows for each node, the first two rows in TABLE 41 are generated.

TABLE 41

| Variable | Assignment Conditions | | | | | |
|---|---|---|---|---|---|---|
| | AL( ) | AD( ) | SL( ) | SD( ) | DC( ) | Z( ) |
| Q(Node 432) | 1 | 0 | 0 | 0 | 0 | 1 |
| Q(Node 436) | 1 | 0 | 0 | 0 | 0 | 0 |
| Q(Node 434) | 1 | COND*C | 0 | 0 | 0 | COND |

Figure 22B:
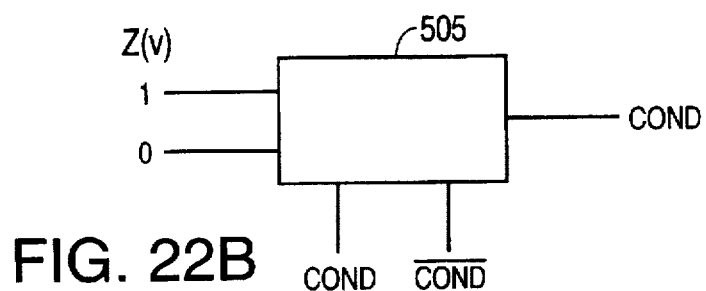
FIG. 22B illustrates the selector for the control flow graph of FIG. 22A and the high impendance hardware description function of this invention.

For node 432, variable Q is specified as being at a high impedance state. Thus, the value of Q when condition "COND" is false is unimportant, i.e., a don't care situation. Therefore, selector 505 (FIG. 22B) is used to generate the assignment condition for function Z(Q). The two logic states for function Z( ) are input signals to the selector. These input signals correspond to the entries in the column Z( ) for the first two rows in TABLE 41. Specially, a logic one signal is on the first input line of selector 505 and a logic zero is on the second input line of selector 505. Condition "COND" is on the first data input select line and condition "not COND" is on the second data input select line. The output signal of selector 505 is "COND" which is the assignment condition for function Z(Q) in the third row of TABLE 41.

Logic circuit generator 124 also determines the assignment conditions for synchronous functions SL( ) and SD( ) using selectors and mux conditions from the control flow graph. However, the generation of the assignment conditions is somewhat more complex. Consider the user description in TABLE 42.

TABLE 42

An Example of User Description 110

If ( positive_edge(CLOCK) )
    Q := B
else
endif.

Figure 23:
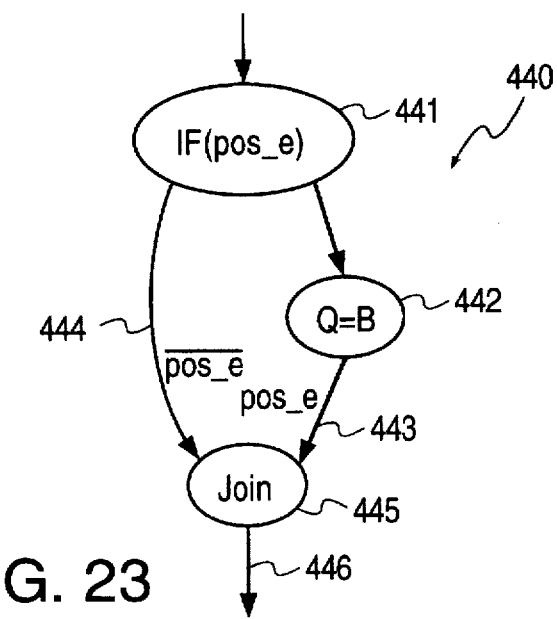
FIG. 23 is a control flow graph as created by graph generator 132 of this invention for the user example in Table 42.

Control flow graph 440 (FIG. 23) is generated by graph generator 132 (FIG. 3) for this user description. In this embodiment, condition generator 133 generates mux conditions for edges 443 and 444 which for this simple example are again the same as the activation conditions described above.

The propagation of assignment conditions through a join node fed by an edge with a mux condition of positive_edge (CLOCK) is different. Rather than building a selector for each assignment condition, assignment conditions are "mapped" from asynchronous to synchronous. For instance, the assignment condition for function SL( ) for the join node is set to the value of the assignment condition for function AL( ) for the edge which has the "pos_e"mux condition. Similarly, the assignment condition for function SD( ) comes from the assignment condition for function AD( ) for the edge which has the "pos_e" mux condition. After the mapping, the values of the assignment conditions for functions AL( ) and AD( ) are set to zero. The working row and the final assignment condition for the user description in TABLE 40 is illustrated in TABLE 43.

TABLE 43

| Variable | Assignment Conditions | | | | | |
|---|---|---|---|---|---|---|
| | AL( ) | AD( ) | SL( ) | SD( ) | DC( ) | Z( ) |
| Q(Node 442) | 1 | B | 0 | 0 | 0 | 0 |
| Q(Node 445) | 0 | 0 | 1 | B | 0 | 0 |

The hardware generated by logic circuit generator 124 for the last row in TABLE 43 is a D-type flip-flop with activation condition SD(Q), i.e.,"B" on the data input line and the positive clock edge drives the clock input terminal of the flip-flop. The signal on the flip-flop output line is the value of the variable Q.

In the previous examples, synchronous and asynchronous function were considered in isolation. However, as with activation conditions, both synchronous and asynchronous functions may be encountered with mux conditions. Consider the user description in TABLE 44.

TABLE 44

Figure 24:
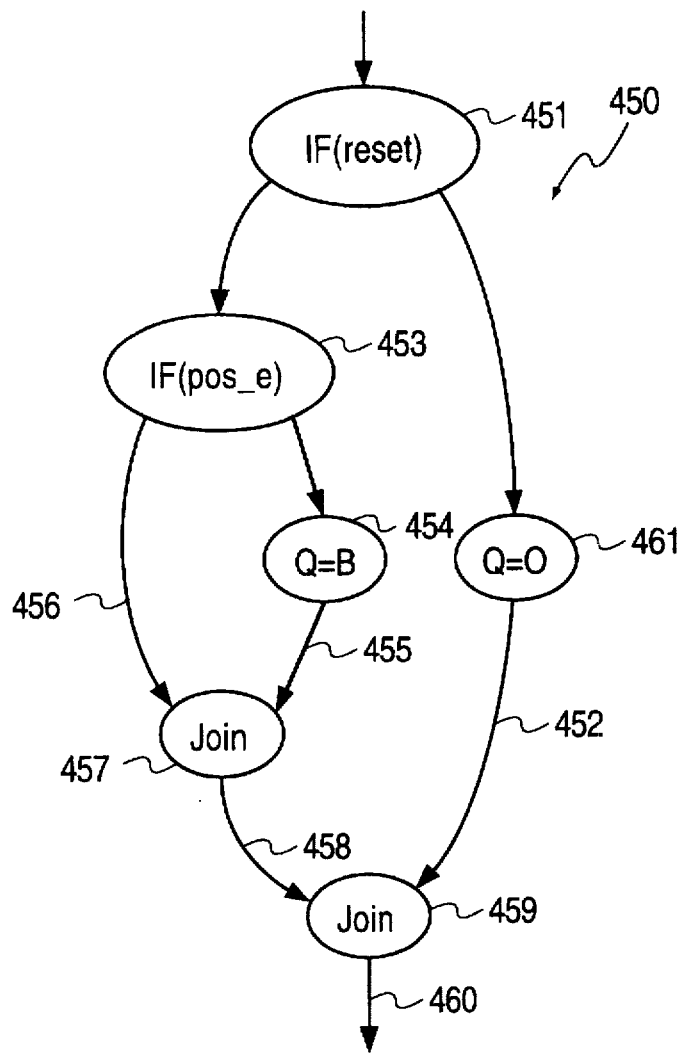
FIG. 24 is a control flow graph as created by graph generator 132 of this invention for the user description in Table 44.

An Example of User Description 110 if (RESET)
    Q := 0
Else
    if (positive_edge(CLOCK))
        Q := B
    Else
    Endif
Endif Control flow graph 450 (FIG. 24) is generated by graph generator 132 and condition generator 133 for this user description. The rows in the assignment condition matrix are computed as illustrated in TABLE 45.

TABLE 45

| Variable | Assignment Conditions | | | | | |
|---|---|---|---|---|---|---|
| | AL( ) | AD( ) | SL( ) | SD( ) | DC( ) | Z( ) |
| Q(Node 461) | 1 | 0 | 0 | 0 | 0 | 0 |
| Q(Node 454) | 1 | B | 0 | 0 | 0 | 0 |
| Q(Node 457) | 0 | 0 | 1 | B | 0 | 0 |
| Q(Node 459) | RESET | 0 | RESET | RESET*B | 0 | 0 |

The third line of TABLE 45 is generated by mapping the second line as described above. The last line is the selector output associated with the first and third lines of TABLE 45. Specifically, the input signals to the selector are the entries in the column and the signals on the control input lines are the mux conditions for edges 458, 452 leading into join node 459.

As described above, preferably, the assignment conditions in the last row of TABLE 45 are boolean minimized prior to logic circuit generation. In this example, activation condition SD(Q(Node 459)) is boolean minimized with activation condition AL(Q(Node 459)) as a don't care condition. The resulting assignment condition SD(Q)' is "B". Similarly, when activation condition SL(Q (node 459)) is boolean minimized with activation condition AL(Q (node 459)) as a don't care condition, the assignment condition SL(Q)' is "1". Therefore, as explained previously for a row having asynchronous and synchronous non-zero assignment conditions, a flip-flop with a clear direct terminal is generated for the row of the assignment condition matrix.

The previous examples demonstrated the operation of each of the components in synthesizer 120 of this invention. The operation of graph generator 132 and condition generator 133 in preprocessor 122 and logic circuit generator 124 are described more completely using user description 110 in TABLE 46.

TABLE 46

| An Example of User Description 110 |
|---|
| 1   if (reset) |
| 2     Q := 0 |
| 3   else |
| 4     if positive_edge(clock) |
| 5       if (normal) |
| 6          Q := input1 |
| 7       else |
| 8          if (abort) |
| 9             Q := "Z" |
| 10            goto DONE |
| 11          else |
| 12             Q := input1 + input2 |
| 13          endif |
| 14      endif |
| 15      DONE:    — point where "goto" goes to. |
| 16    else |
| 17    endif |
| 18   endif |

Figure 25:
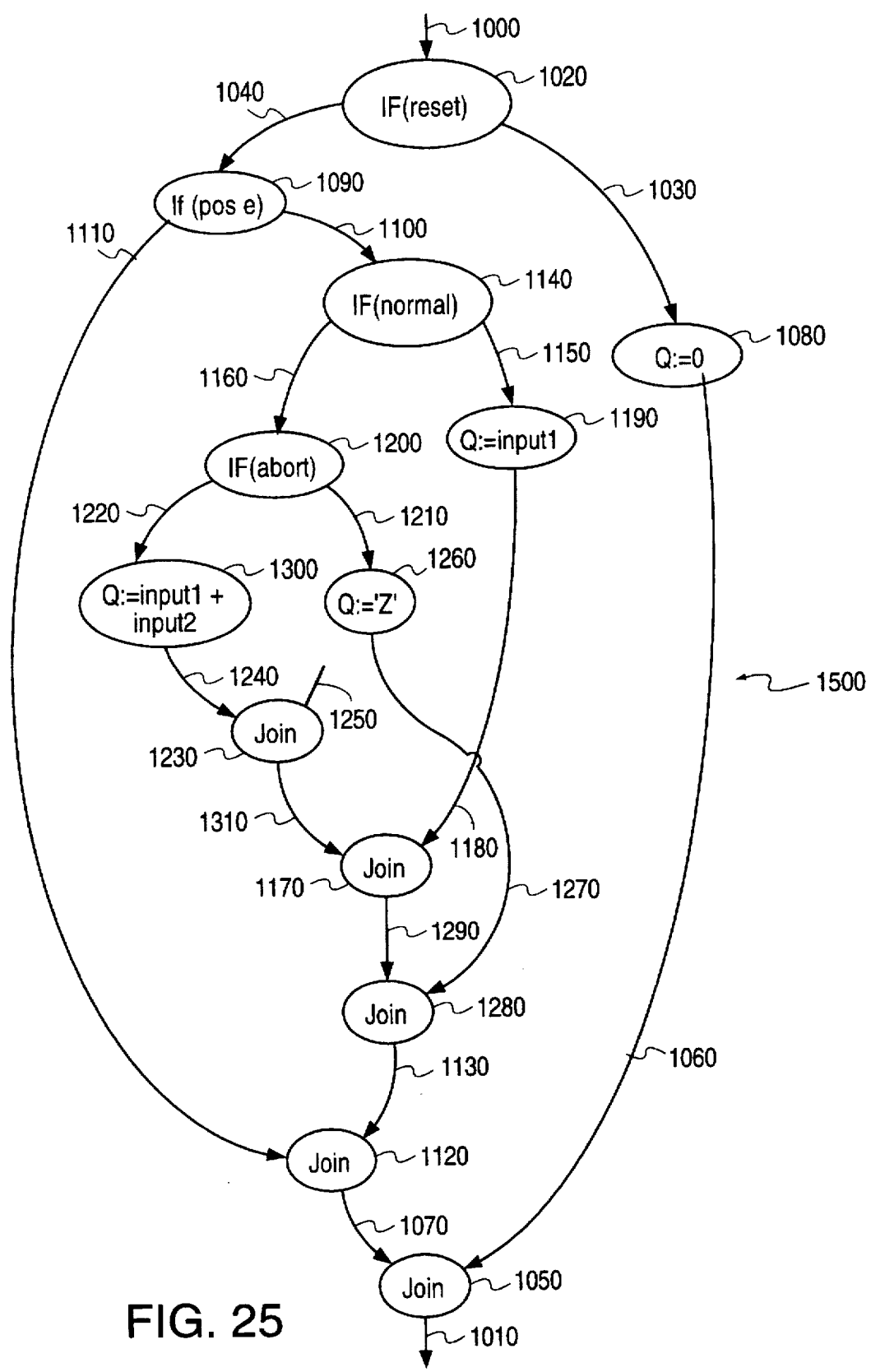

Line 10 in TABLE 46 demonstrates one of the novel features of this invention. Line 10 directs the processing to jump out of the if statement of line 8 and go to line 15. Therefore, processing not only jumps out of the if statement that starts at line 8 but also the if statement that starts at line 5. FIG. 25 illustrates the flow control graph 1500 which corresponds to the user description in TABLE 46. The generation of the flow control graph 1500 is described more completely below with respect to the operation of graph generator 132.

Initially, as described above, user description 110 TABLE 46 and FIG. 2) is processed by parsing means 131 and the lines of the parsed user description are provided to graph generator 132. TABLE 47 illustrates one embodiment of graph generator 132. A more detailed description of synthesizer 120 of this invention is provided in Microfiche Appendix A which forms a part of this disclosure and which is incorporated herein by reference in its entirety.

TABLE 47

| Graph Generator 132 |
|---|
| 1   MAKE_CFLOW_GRAPH( hdl_description ) { |
| 2     DEFINE graph = a new, initially empty control-flow graph. |
| 3     DEFINE source = a new control-flow edge to be the source of the control-flow graph. |
| 4     DEFINE sink = a new control-flow edge to be the sink of the control-flow graph. |
| 5     MAKE_CFLOW_PART( source, sink, hdl_description ) |
| 6     RETURN graph |
| 7   } |
| 8   MAKE_CFLOW_PART(source, sink, hdl_part ) { |
| 9      DEFINE current_edge = source; |
| 10     FOREACH ( line in hdl_part ) { |
| 11       IF ( line is an operation ) { |
| 12         DEFINE new_node = a new control-flow node that represents the operation |
| 13         hook current_edge to input of new_node |
| 14         DEFINE current_edge = a new control-flow edge |
| 15         hook new current_edge to output of new_node |
| 16       } |
| 17       IF ( line is an "if" ) { |
| 18         DEFINE split_node = a new control-flow node that represents the "if" |
| 19         hook current_edge to input of split_node |
| 20         DEFINE then_source = a new control-flow edge |
| 21         DEFINE else_source = a new control flow edge |
| 22         hook then_source and else_source to output of split_node |
| 23         DEFINE join_node = a new control-flow node that represents the "endif" of the current if. |
| 24         DEFINE then_sink = a new control-flow edge |
| 25         DEFINE else_sink = a new control-flow edge |
| 26         hook then_sink and else_sink to input of join_node |
| 27         MAKE_CFLOW_PART ( then_source, then_sink, statements in then branch of if) |
| 28         MAKE_CFLOW_PART ( else_source, else_sink, statements in else branch of if |
| 29         advance scanning of lines to the statement after the "endif" |
| 30         DEFINE current_edge = a new control-flow edge |
| 31         hook new current_edge to output of join_node |
| 32       } |
| 33       IF ( line is a "goto" ) { |
| 34         DEFINE goto_join = a new control-flow node which is inserted at the point in the graph where goto goes. |
| 35         hook current_edge to input of goto_join |
| 36         DEFINE current_edge = a new control-flow edge |
| 37       } |
| 38   } |
| 39     merge current_edge into sink OR edge created by processing of GOTO statement |
| 40     RETURN |
| 41   } |

As illustrated in TABLE 47, graph generator 132 includes two major processes. The first process is referred to as process MAKE_CFLOW_GRAPH (lines 1–7) which generates the flow control graph. Initially, a structure is defined that is a new and initially empty control flow graph. Next, a new flow control edge is defined as the source for the control flow graph and similarly a new control flow edge is defined as the sink of the control flow graph. Process MAKE_

CFLOW_GRAPH then uses process MAKE_CFLOW_PART (lines 8-41) to generate the graph.

Process MAKE_CFLOW_PART is provided the source, sink and lines of the parsed HDL description to process. In process MAKE_CFLOW_PART, initially the current edge is defined as the source, and then each line in the HDL description provided to the process is sequentially processed. Each line is examined to determine whether the line is an operation, i.e., a directive statement as defined above, or a flow control statement, i.e., an "if" statement, or a "GOTO" statement. The operations performed by process MAKE_CFLOW_PART depend upon whether the operation is a directive statement or a flow control statement, and further whether the flow control statement is an "if" statement or a "GOTO" statement.

If the line in the user description represents an operation, a new node is defined for the control flow graph that represents the operation. The current edge is attached to the input of the new node and then the current edge is redefined as a new control flow edge. The new flow control edge is hooked onto the output of the new node.

If the line in the user description is an "if" flow control statement, a split node is defined as a new control flow node that represents the "if" statement and the current edge is hooked to the input of the split node. Subsequently, two new edges are defined which are the "then" source edge and the "else" source edge. Both the "then" source and "else" source edges are hooked to the output of the split node. A new flow control node is created and defined as the join node, which represents the "endif" statement of the current "if" statement. Subsequently, two new control flow edges are defined as the "then" sink edge and the "else" sink edge. Both of these edges are hooked to the input of the join node.

This particular process is recursive in that the process MAKE_CFLOW_PART is then called with the source and sink as the "then" source and "then" sink edges and the statements in the "then" branch of the "if" statement. Accordingly, the process creates nodes and edges for each statement within the "then" part of the "if" statement.

Subsequently, process MAKE_CFLOW_PART is again called to construct the control flow graph for the statements in the else portion of the if statement. Since this processing has handled all of the user statements in the if statement, the scanning is advanced to the line at the end of the current "endif". A new control flow edge is defined as the current edge, and the new edge is hooked onto the output of the join node. This completes the processing if the flow control statement is an "if" statement.

The last flow control statement processed in process MAKE_CFLOW_PART is the "GOTO" statement. In this sequence, the "GOTO" join node is a new flow control node that is inserted at the point of the graph where the "GOTO" is directed. Specifically, a join node is created with the label from the GOTO statement. As subsequent statements are processed, each statement is checked to ascertain whether it contains the label. When the label is detected, the current edge at that time is hooked to the input of the GOTO join node. The current edge at the time of creation of the join node is hooked to the input of the "GOTO" edge and a new flow control edge is defined as the current edge.

When all of the statements have been processed by one of the three subprocesses within process MAKE_CFLOW_PART, the current edge is merged into the sink. Processing returns to processor 122 which subsequently calls condition generator 133.

The generation of a control flow graph by graph generator 132 is more completely described by considering the generation of graph 1500 in FIG. 25 for the user description in TABLE 46. Upon entry to graph generator 132, line 3 (TABLE 47) first creates source edge 1000 and then line 4 creates sink edge 1010. Process MAKE_CFLOW_PART at line 5 is called with the arguments source edge 1000, sink edge 1010 and lines 1 through 18 (TABLE 46) of the user description.

The first operation in the process MAKE_CFLOW_PART, i.e., line 9 (TABLE 47), defines the current edge as source edge 1000. Line 10 then initiates processing of line 1 of TABLE 46. Since line 1 of TABLE 46 is an "if" statement, processing proceeds to line 17 and subsequently line 18 defines a newly created node 1020 (FIG. 25) as a split node. Line 19 then hooks edge 1000 to node 1020.

Line 20 creates new edge 1030 and defines edge 1030 as the "then" source edge. Line 21 creates another new edge 1040 and defines edge 1040 as the "else" source edge. Line 22 hooks edges 1030 and 1040 to node 1020. Line 23 defines a newly created node 1050 as a join node and then lines 24 and 25 respectively define newly created edges 1060, 1070 as the "then" sink and "else" sink edges, respectively. Line 26 hooks edges 1060 and 1070 to node 1050. Line 27 calls process MAKE_CFLOW_PART with arguments edge 1030, edge 1060, and line 2 of TABLE 46.

Upon this entry to process MAKE_CFLOW_PART at line 8 (TABLE 47), line 9 defines the current edge as edge 1030 and line 10 starts processing on line 2 (TABLE 46) which is a directive statement. Processing goes to line 11 and subsequently line 12 creates node 1080 as a new node. Line 13 hooks edge 1030 to node 1080. Line 14 creates a new edge that will become edge 1060 and defines it as the current edge. Line 15 hooks the edge that will become 1060 to node 1080. Processing then proceeds to line 39 which merges the current edge into edge 1060 and then processing returns to line 28 where process MAKE_CFLOW_PART is again called with the arguments edge 1040, edge 1070, and lines 4 through 17 (TABLE 46) of user description 110.

Upon this entry to process MAKE_CFLOW_PART at line 8 (TABLE 47), the current edge is defined as edge 1040, and processing starts at line 4 of TABLE 46. Since line 4 is an "if" statement, processing proceeds to line 17 (TABLE 47), and line 18 creates a new node 1090 which is defined as a split node. Line 19 hooks edge 1040 to node 1090 and then lines 20 and 21 respectively create edge 1100, which is defined as the "then" source edge, and edge 1110, which is defined as the "else" source edge. Line 22 hooks edges 1100 and 1110 to node 1090. Line 23 defines a new node 1120 as the join node. Line 24 defines a new edge 1130 as the "then" sink edge and line 25 defines a newly created edge that will become edge 1110 as the "else" sink edge. Line 26 hooks edges 1130 and the edge that will become edge 1110 to node 1120 and then makes a call at line 27 to process MAKE_CFLOW_PART at line 8 with arguments edge 1100, edge 1130, and lines 5 through 15 of the user description in TABLE 46.

Upon this entry to process MAKE_CFLOW_PART, the current edge is defined as edge 1100 at line 9 (TABLE 47) and processing starts with line 5 in TABLE 46. Again, since this is another "if" statement, processing proceeds to line 17 and subsequently to line 18 where a new node 1140 is created and defined as a split node. Line 19 hooks edge 1100 to node 1140 and then lines 20 and 21 respectively create edges 1150 and 1160 as the "then" source and the "else" source edges. Line 22 hooks edges 1150 and 1160 to node 1140. Line 23 creates a node 1170 which is defined as the join node. Line 24 creates edge 1180 which is defined as the "then" sink edge. Line 25 creates edge 1310 which is defined as the "else" sink edge. Line 26 hooks edges 1180 and 1310 to node 1170.

Line 27 calls process MAKE_CFLOW_PART with arguments edge 1150, edge 1180, and line 6 (TABLE 46) of the user description. Upon this entry to the process at line 8 (TABLE 47), the current edge is defined as edge 1150 by line 9, and since this is a directive statement, processing goes to line 11 and in turn to line 12 that defines a new node 1190. Line 13 hooks edge 1150 to node 1190, and line 14 creates a new flow control edge that will become edge 1180 which is defined as the current edge. Line 15 hooks the current edge that will become edge 1180 to the output of node 1190. Processing then goes to line 39 which merges the current edge into sink edge 1180 so that edge 1180 is connected to node 1190. Line 40 returns processing to line 28 which calls process MAKE_CFLOW_PART at line 8 with arguments edge 1160, edge 1310, and lines 8 through 13 of the user description in TABLE 46.

Upon entry of the process at line 8 (TABLE 47), line 9 defines the current edge as edge 1160 and line 10 starts processing of line 8 (TABLE 46) which is an "if" statement, so that processing again jumps to line 17. Line 18 defines a newly created node 1200 as a split node and line 19 hooks edge 1160 to node 1200. Line 20 creates a new flow control edge 1210 as the "then" source edge and line 21 defines another new control flow edge 1220 as the "else" source edge. Line 22 hooks edges 1220 and 1210 to node 1200. Line 23 defines a new control flow node 1230 as a join node. Line 24 defines a new flow control edge 1250 as the "then" sink edge, and line 25 defines another new control flow edge 1240 as the "else" sink edge. Line 26 hooks edges 1240 and 1250 to the input of join node 1230. Line 27 makes yet another call to process MAKE_CFLOW_PART at line 8 with arguments edge 1210 as the source, edge 1250 as the sink, and lines 9 and 10 in TABLE 46 of the user description.

Upon this entry to process MAKE_FLOW_PART, line 9 (TABLE 47) defines the current edge as edge 1210, and line 10 processes line 9 in TABLE 46, which is an operation so that line 11 is accessed. Line 12 creates a new flow control node 1260 and line 13 hooks edge 1210 to the input of node 1260. A new flow control edge 1270 is defined as the current edge and line 15 hooks edge 1270 to the output of node 1260. Processing then returns to line 10 which brings in the "GOTO" statement (Line 10, TABLE 46) so that processing goes to line 33 (TABLE 47) and subsequently line 34 defines a new flow control node 1280 which is defined as the "GOTO" join node. Node 1280 and edge 1290, which is also created, are positioned between node 1170 and edge 1130, using the process previously described. Line 35 hooks edge 1270 to the input of node 1280. Line 36 defines a new control flow edge that will become edge 1250. Since this is all the statements that have been passed, processing passes to line 39 which merges the edge that will become edge 1250 with the sink which is edge 1250 and returns processing to line 28 which calls process MAKE_CFLOW_PART with edge 1220 as the source, edge 1240 as the sink, and line 12 of TABLE 46.

Upon this entry at line 8 (TABLE 47) to process MAKE_CFLOW_PART, the current edge is defined as edge 1220 and line 10 starts processing with line 12 in TABLE 46. Since this is a directive node, processing goes to line 11 (TABLE 47) and subsequently line 12 defines a new control flow node 1300 that represents the operation in line 12 of TABLE 46. Line 13 hooks edge 1220 to the input of node 1300. Line 14 defines a new control flow edge which will become edge 1240 and hooks the new edge to the output of node 1300. Processing then transfers to line 39, which merges the current edge, i.e. the edge from node 1300, into the sink node which was previously defined as edge 1240.

Processing returns to line 29 which advances scanning of the lines in TABLE 46 to line 14. Line 30 defines a new edge that will become edge 1310. Line 31 hooks the edge that will become edge 1310 to the output of join node 1230, and then processing goes to line 39. Line 39 merges the current edge into the sink which was defined as edge 1310, and processing returns to line 29. Line 29 advances the lines being processed through line 1 of TABLE 46.

Line 30 (TABLE 47) defines the current edge as a newly created edge that will become edge 1290. Line 31 hooks the edge that will become edge 1290 to join node 1170, and processing transfers to line 39 that merges the new current edge into the edge created by processing of the "GOTO" statement to form edge 1290. Processing then returns to line 28 which in turn calls process MAKE_CFLOW_PART with the edge 1110 as the source and the edge connected to node 1120 that will become edge 1110 as the sink and no lines of HDL for processing. Subsequently, processing transfers directly to line 39 which merges edge 1110 with the edge that was to become edge 1110 and subsequently processing is returned to line 29.

Line 29 advances through the HDL, in TABLE 46 to line 15. Line 30 (TABLE 47) defines the current edge as a newly created edge that will become edge 1070, and line 31 hooks the edge that will become edge 1070 to the output of node 1120. Line 39 merges the current edge with edge 1070, and processing is returned to line 29.

Line 29 advances through the remaining parsed HDL statements and subsequently line 30 defines a newly created edge that will become edge 1010. Line 31 hooks the edge that will become edge 1010 to the output of node 1050 and subsequently line 39 merges the current edge into edge 1010. Finally, line 6 returns the completed graph and this completes the processing of the control flow graph.

In this embodiment, condition generator 133 (FIG. 3A) includes two processes. A first process GET_ACTIVATION_OF_EDGE (TABLE 48) generates the activation conditions for each edge from a node and a second process GET_MUXCOND_OF_EDGE (TABLE 49) uses the activation condition to generate a MUX condition for each edge from a node.

TABLE 48

| A First Process in Condition Generator 133 |
| --- |

```
 1  GET_ACTIVATION_OF_EDGE( the_edge ) {
 2      IF ( the_edge is the source of the graph ) {
 3          RETURN 1;
 4      }
 5      DEFINE input_node = the node which outputs
                to the_edge
 6      IF ( input_node is an operation ) {
 7          DEFINE input_edge = the input edge to
                input_node
 8          DEFINE input_activation =
                GET_ACTIVATION_OF_EDGE(
                input_edge )
 9          RETURN input_activation
10      }
11      IF ( input_node is a join ) {
12          FOREACH ( input edge of input_node ) {
13              DEFINE input_edge = the
                    current input edge
14              DEFINE input_activation =
                    GET_ACTIVATION_OF_
                    EDGE(input_edge)
15              save input_activation for later use
16          }
17          DEFINE return_value = Logical OR of all
                saved input_activations
```

TABLE 48-continued

A First Process in Condition Generator 133

| 18 | | RETURN return_value |
| --- | --- | --- |
| 24 | | |
| 19 | } | |
| 20 | IF ( input_node is a split ) { | |
| 21 | | DEFINE input_edge = the input edge to input_node |
| 22 | | DEFINE input_activation = GET_ACTIVATION_OF_ EDGE( input_edge ) |
| 23 | | IF ( the_edge represents the "then" part of the split ) { |
| 24 | | DEFINE return_value = logical AND of input_activation with the "condition" of the split. |
| 25 | | } |
| 26 | | IF ( the_edge represents the "else" part of the split ) { |
| 27 | | DEFINE return_value = logical AND of input_activation with the complement of the "condition" of the split. |
| 28 | | } |
| 29 | | |
| 30 | | RETURN return_value |
| 31 | } | |
| 32 | } | |

TABLE 49

A Second Process in Condition Generator 133

| 1 | GET_MUXCOND_OF_EDGE( the_edge ) { |
| --- | --- |
| 2 | DEFINE edge_activation = the activation condition of the_edge |
| 3 | DEFINE join_node = the join node which has the_edge as input |
| 4 | DEFINE output_edge = the output edge of the join node |
| 5 | DEFINE output_activation = the activation condition of output_edge |
| 6 | DEFINE mux_cond = boolean optimization of edge_activation using the complement of output_activation as a "don't care". |
| 7 | RETURN mux_cond |
| 8 | } |

In process GET_ACTIVATION_OF_EDGE (TABLE 48) three different sets of operations are performed depending upon the type of node driving the edge passed in the call to the process. If the input node is an operation node, i.e., a node for a directive statement, process GET_ ACTIVATION_OF_EDGE defines the input edge as the input edge to that node and then calls the process GET_ ACTIVATION_OF_EDGE for the input edge to that node to ascertain the input activation condition. The process returns the value of the input edge activation condition.

If the input node for the edge in the call to the process GET_ACTIVATION_OF_EDGE is a join node, for each edge into the node, process GET_ACTIVATION_OF_ EDGE is called to determine the activation condition for each input edge and the resulting value is saved for later use. After each edge into the join node has been processed and the activation condition determined, the value returned for the edge in the original call to process GET_ ACTIVATION_OF_EDGE is the logic OR function of all the saved input activation conditions.

Finally, if the input node GET_ACTIVATION_OF_ EDGE is a split node, process GET_ACTIVATION_OF_ EDGE is called to obtain the activation condition for the edge into the split node. If the edge used in the call to the process GET_ACTIVATION_OF_EDGE is associated with the "then" part of the "if" statement split, the return value is defined as the logical AND function of the activation condition for the edge into the split node with the condition of the split. Conversely, if the edge passed in the call to the process GET_ACTIVATION_OF_EDGE represents the "else" part of the split, the return value is defined as the logical AND function of the activation condition for the edge into the split node with the complement of the condition of the split. When the activation condition for an edge is determined, the condition is saved for use in subsequent processing.

To further demonstrate the operation of process GET_ ACTIVATION_OF_EDGE in condition generator 133, the process will be applied to control flow graph 1500 (FIG. 25) that was generated by control flow graph generator 132. Initially, process GET_ACTIVATION_OF_EDGE is called with edge 1010. Line 5 defines the input node as join node 1050 which drives edge 1010. Since the input node is join node 1050, processing proceeds to line 11 and the input edge is defined as edge 1060 to join node 1050. Line 14 defines the input activation for edge 1060 as process GET_ ACTIVATION_OF_EDGE for edge 1060. Therefore, processing starts at line 5 again for edge 1060. Line 5 defines the input node for edge 1060 as node 1080. Since node 1080 is an operation node, processing transfers to line 6 and subsequently line 7 defines the input edge as edge 1030 to node 1080. Line 8 defines the input activation for edge 1030 as the process GET_ACTIVATION_OF_EDGE for edge 1030.

Accordingly, processing transfers to line 5 for edge 1030. Line 5 defines the input node for edge 1030 as split node 1020 so that processing transfers to line 20. Line 21 defines the input edge to split node 1020 as edge 1000 and line 22 defines the input activation for edge 1000 as process GET_ ACTIVATION_OF_EDGE for edge 1000.

Thus, processing transfers again to line 5 for edge 1000. Since edge 1000 is the source of the graph, lines 2 and 3 return the value of 1 for edge 1000. Since edge 1030 represents the "then" portion of the "if" split, processing transfers to line 24 which defines the return value as the logical AND of the logic value "1" with the condition of the split "reset". Thus, the return value in line 29 is "reset" so that the activation condition for edge 1030 is "reset". Processing transfers to line 9 with the input activation condition set equal to "reset" and line 9 returns "reset" as the activation condition for edge 1060. The value of the activation condition for edge 1060 is saved for later use and processing returns to line 12 for edge 1070 to node 1050.

Line 22 defines the input edge as edge 1070 and line 14 defines input activation as the process GET_ ACTIVATION_OF_EDGE for edge 1070. The subsequent processing through process GET_ACTIVATION_OF_ EDGE recursively cycles through TABLE 48and so only the lines where the process is called to determine an assignment condition for an edge and the subsequent return value are described. In view of the above discussion and TABLE 48, the intermediate steps will be apparent to those skilled in the art.

Hence, processing continues to cycle through process GET_ACTIVATION_OF_EDGE and at line 14, process GET_ACTIVATION_OF_EDGE is called for edge 1130 and after further processing, at line 14 again, process GET_ ACTIVATION_OF_EDGE is called for edge 1270 and subsequently after additional processing line 18 calls process GET_ACTIVATION_OF_EDGE for edge 1210. After additional processing, line 22 sequentially calls process GET_ACTIVATION_OF_EDGE for edges 1160, 1100, 1040, and 1000. When edge 1000 is reached the activation condition was previously calculated as 1. Line 27 returns a value of "1 AND (not reset)", or simply "not reset". After further processing, line 30 returns the activation condition of edge 1040 as "not reset". Subsequently line 24 returns the value of "(not reset)*(pos_e)" and line 30 returns the activation condition of edge 1100 as "(not reset)*(pos_e)". Again, after further processing line 27 has the return value defined as "(not reset)*(pos_e)*(not normal)" and subsequently line 30 returns the activation condition of edge 1160 as "(not reset)*(pos_e)*(not normal)".

Again looping back through the process, line 24 defines a return value of "(not reset)*(pos_e)*(not normal)*(abort)". Subsequently, line 30 returns the activation condition of edge 1210 as "(not reset)*(pos_e)*(not normal)*(abort)". Line 9 returns the activation condition of edge 1270 as "(not reset)*(pos_e)*(not normal)*(abort)". This completes one path into join node 1280, but to complete the activation conditions the other path into join node 1280 is processed by line 12.

Thus, line 13 calls process GET_ACTIVATION_OF_EDGE for edge 1290, and after further processing line 13 calls process GET_ACTIVATION_OF_EDGE for edge 1180. Subsequently line 8 calls process GET_ACTIVATION_OF_EDGE for edge 1150 and line 22 calls GET_ACTIVATION_OF_EDGE for edge 1100. The activation condition of edge 1100 was previously calculated as "(not reset)*(pos_e)". Subsequently, line 24 returns the value of "(not reset)*(pos_e)*(normal)" and line 30 returns activation condition of edge 1150 as "(not reset*(pos_e)*(normal)". After further processing, line 9 returns the activation condition of edge 1180 as "(not reset)*(pos_e)*(normal)".

The remaining branch into join node 1170 must be processed to complete the conditions for edge 1290. After further processing line 14 calls process GET_ACTIVATION_OF_EDGE with edge 1310. Hence, processing returns to line 12 and in turn line 23 again calls process GET_ACTIVATION_OF_EDGE for edge 1240. After further processing, line 8 calls process GET_ACTIVATION_OF_EDGE for edge 1220 and subsequently line 22 calls process GET_ACTIVATION_OF_EDGE for edge 1160.

The activation condition for edge 1160 was previously calculated and, as described above, the condition was "(not reset)*(pos_e)*(not normal)". Subsequently, line 27 defines a return value and line 30 returns the value for the activation condition of edge 1220 as "(not reset)*(pos_e)*(not normal)*(not abort)". After further processing line 9 returns the activation condition of edge 1240 as "(not reset)*(pos_e)*(not normal)*(not abort)". Line 17 returns a value that is equal to the activation condition for edge 1240 because edge 1250 is never reached. Consequently, line 18 returns the activation condition for edge 1310 as "(not reset)*(pos_e)*(not normal)*(not abort)".

Processing then returns to the prior call of process GET_ACTIVATION_OF_EDGE which continues at line 17 by calculating the return value of the logic OR function of the activation condition for edge 1180 with the activation condition for edge 1310. The return value is "(not reset)*(pos_e)*(normal)+(not reset)*(pos_e)*(not normal)*(not abort)". Subsequently, line 18 returns the activation condition of edge 1290 as "(not reset)*(pos_e)*(normal)+(not reset)*(pos_e)*(not normal)*(not abort)."

Processing then returns to the prior call of process GET_ACTIVATION_OF_EDGE which continues at line 17 by calculating the return value of the logic OR function of the activation condition for edge 1270 with the activation condition for edge 1290. The return value is "(not reset)*(pos_e)*(not normal)*(abort)+(not reset)*(pos_e)*(normal)+(not reset)*(pos_e)*(not normal)*(not abort)," which is just "(not reset)*(pos_e)." Subsequently, line 18 returns the activation condition of edge 1130 as "(not reset)*(pos_e)." This completes processing in this call to process GET_ACTIVATION_OF_EDGE To complete the processing for join node 1120, the activation conditions for edges 1110 and 1040 must still be determined. Hence, processing returns to line 12 and subsequently line 14 calls process GET_ACTIVATION_OF_EDGE for edge 1110. In turn, line 22 calls process GET_ACTIVATION_OF_EDGE for edge 1040. However, the activation condition for edge 1040 was previously calculated as "(not reset)." Thus, line 27 defines the return value as "(not reset)*(not pos_e)" and line 30 returns the activation condition of edge 1110 as "(not reset)*(not pos_e)."

Processing then returns to the prior call of process GET_ACTIVATION_OF_EDGE which continues at line 17 by defining the return value as the logic OR function of the activation condition for edge 1130 with the activation condition for edge 1110. The return value is "(not reset)*(pos_e)+(not reset)*(not pos_e)," which is "(not reset)". Subsequently, line 18 returns the activation condition of edge 1070 as "(not reset)."

Processing then returns to the prior call of process GET_ACTIVATION_OF_EDGE which continues at line 17 by defining the return value as the logic OR function of the activation condition for edge 1060 with the activation condition for edge 1070. The return value is "reset+(not reset)" or 1. Subsequently, line 18 returns the activation condition of edge 1010 as 1 which completes the processing that generates the activation conditions in conditions generator 133. In one embodiment, each edge and its activation condition are stored in a table for use in subsequent processing.

The second process GET_MUXCOND_OF_EDGE (TABLE 49) gets the mux condition for the control flow edge passed to the process. As previously, described, a mux condition is only defined for edges that are input edges to a join node. Initially, the edge activation is set equal to as the activation condition for the edge passed to this process. A join node is set equal to the join node that has the edge passed to this process as an input edge. The output edge is set equal to the output edge from the join node. The output activation is then set equal to the activation condition for the output edge. Finally, the mux condition is the boolean optimization of the edge activation using the complement of output activation as a "don't care" condition.

Initially, process GET_MUXCOND_CF_EDGE is called for edge 1060. Line 2 sets edge activation to "reset" and line 4 sets output edge to edge 1010. Thus, line 5 sets output activation to "1". Line 6 determines the mux condition as the boolean minimization of "reset" with a don't care condition of "0". The mux condition returned for edge 1060 is "reset." The edge and its mux condition are stored in a table for subsequent processing.

Process GET_MUXCOND_OF_EDGE is next called for edge 1070. Line 2 sets edge activation to "not reset" and line 4 sets output edge to edge 1010. Thus, line 5 sets output activation to "1". Line 6 determines the mux condition as the boolean minimization of "not reset" with a don't care condition of "0". The mux condition returned for edge 1070 is "not reset." The edge and its mux condition are stored in a table for subsequent processing.

For join node 1120, process GET_MUXCOND_OF_EDGE is first called for edge 1130. Line 2 sets edge activation to "(not reset)*(pos_e)" and line 4 sets output edge to edge 1070. Thus, line 5 sets output activation to "not reset". Line 6 determines the mux condition as the boolean minimization of "(not reset)*(pos_e)" with a don't care condition of "reset". The mux condition returned for edge 1130 is "pos_e." The edge and its mux condition are stored in a table for subsequent processing.

For join node 1120, process GET_MUXCOND_OF_EDGE is next called for edge 1110. Line 2 sets edge activation to "(not reset)*(not pos_e)" and line 4 sets output edge to edge 1070. Line 5 sets output activation to "not reset". Line 6 determines the mux condition as the boolean minimization of "(not reset)*(not pos_e)" with a don't care condition of "reset". The mux condition returned for edge 1110 is "not pos_e." The edge and its mux condition are stored in a table for subsequent processing.

For join node 1280, process GET_MUXCOND_OF_EDGE is first called for edge 1270. Line 2 sets edge activation to "(not reset)*(pos_e)*(not normal)*(abort)" and line 4 sets output edge to edge 1130. Line 5 sets output activation to "(not reset)*(pos_e)". Thus, line 6 determines the mux condition as the boolean minimization of "(not reset)*(pos_e)*(not normal)*(abort)" with a don't care condition of "reset+(not pos_e)". The mux condition returned for edge 1270 is "(not normal)*(abort)." The edge and its mux condition are stored in a table for subsequent processing.

For join node 1280, process GET_MUXCOND_OF_EDGE is next called for edge 1290. Line 2 sets edge activation to "(not reset)*(pos_e)*(normal)+(not reset)*(pos_e)*(not normal)*(not abort)" and line 4 sets output edge to edge 1130. Line 5 sets output activation to "(not reset)*(pos_e)". Thus, line 6 determines the mux condition as the boolean minimization of "(not reset)*(pos_e)*(normal)+(not reset)*(pos_e)*(not normal)*(not abort)" with a don't care condition of "reset +(not pos_e)". The mux condition returned for edge 1290 is "(normal)+(not normal)*(not abort)." The edge and its mux condition are stored in a table for subsequent processing.

For join node 1170, process GET_MUXCOND_OF_EDGE is first called for edge 1180. Line 2 sets edge activation to "(not reset)*(pos_e)*(normal)" and line 4 sets output edge to edge 1290. Line 5 sets output activation to "(not reset)*(pos_e)*(normal)+(not reset)*(pos_e)*(not normal)*(not abort)". Line 6 determines the mux condition as the boolean minimization of "(not reset)*(pos_e)*(normal)" with a don't care condition of "reset+(not pos_e)+(not normal)*abort". Thus, the mux condition returned for edge 1180 is "normal." The edge and its mux condition are stored in a table for subsequent processing.

For join node 1170, process GET_MUXCOND_OF_EDGE is next called for edge 1310. Line 2 sets edge activation to "(not reset)*(pos_e)*(not normal)*(not abort)" and line 4 sets output edge to edge 1290. Line 5 sets output activation to "(not reset)*(pos_e)*(normal)+(not reset)*(pos_e)*(not normal)*(not abort)". Thus, line 6 determines the mux condition as the boolean minimization of "(not reset)*(pos_e)*(not normal)*not abort" with a don't care condition of "reset+(not pos_e)+(not normal)* abort". The mux condition returned for edge 1310 is "not normal." The edge and its mux condition are stored in a table for subsequent processing.

Notice that the mux conditions are not determined for join node 1230. Recall edge 1250 is not used and so has an activation condition of "0." Thus, edge 1240 is effectively the same as edge 1310 because no other flow control path is added through join 1230.

The completion of process GET_MUXCOND_OF_EDGE concludes the operation of preprocessor 122 (FIG. 2) and so logic circuit generator 124 uses the mux conditions and control flow graph 1500 (FIG. 24) to generate assignment conditions for each variable in graph 1500 that is assigned a value. After the assignment condition matrix is generated for each such variable, generator 124 creates a logic circuit for each row of the assignment condition matrix and interconnects the logic circuits as needed to create final logic circuit 130 that performs the operations specified in user description 110. One embodiment of assignment condition generator 124A of generator 124, called process GET_ASICONDS_AT_EDGE, is presented in TABLE 50.

TABLE 50

Assignment Condition Generator 124A in Generator 124

```
1   GET_ASICONDS_AT_EDGE( the_edge ) {
2       IF ( the_edge is the source of the graph ) {
3           RETURN 0;
4       }
5       DEFINE input_node = the node which outputs to
                the_edge
6       IF ( input_node is an operation ) {
7           IF ( variable of assignment condition is
                    assigned ) {
8               DEFINE return_value = appropriate
                        assignment condition for the
                        value assigned.
9               RETURN return_value
10          }
11          IF ( variable of assignment condition is not
                    assigned ) {
12              DEFINE input_edge = the input edge to
                        input_node
13              DEFINE return_value =
                        GET_ASICONDS_AT_EDGE(
                        input_edge )
14              RETURN return_value
15          }
16      }
17      IF ( input_node is a join which does not depend
                on a clock edge ) {
18          FOREACH ( input edge of input_node ) {
19              DEFINE input_edge = the the current
                        input edge
20              DEFINE input_muxcond = mux condition
                        of input_edge
21              DEFINE input_asicond =
                        GET_ASICONDS_AT_EDGE(
                        input_edge )
22              DEFINE intermediate_value = logical
                        AND of input_muxcond and
                        input_asicond
23              save intermediate_value for later use
24          }
25          DEFINE return_value = Logical OR of all
                    saved intermediate_values
26          RETURN return_value
27      }
28      IF ( input_node is a join which does depend on a
                clock edge ) {
29          DEFINE input_edge = the input edge with
                    pos_edge
30          DEFINE input_asiconds =
                        GET_ASICONDS_AT_EDGE( input_
                        edge )
31          DEFINE synchronous_asiconds( return_value ) =
                        asynchronous_asiconds( input_asiconds
32          DEFINE asynchronous asiconds( return_value
                    = zero
33          RETURN return_value
```

TABLE 50-continued

| Assignment Condition Generator 124A in Generator 124 |
| --- |
| 34   } |
| 35   IF ( input_node is a join with only 1 input |
| 36         DEFINE input_edge = the input edge to input_node |
| 37         DEFINE return_value = GET_ASICONDS_AT_EDGE( input_edge ) |
| 38         RETURN return_value |
| 39   } |
| 40   IF ( input_node is a split ) { |
| 41         DEFINE input_edge = the input edge to input_node |
| 42         DEFINE return_value = GET_ASICONDS_AT_EDGE( input_edge |
| 43         RETURN return_value |
| 44   } |
| 45 } |

In this embodiment, a working row, as described above, is created for each edge of control flow graph 1500. Thus, process GET_ASICONDS_AT_EDGE is called a total of eighteen times. Each time, process GET_ASICONDS_AT_EDGE is called with a different edge of control flow graph 1500 as the argument and the value returned by the process is the working row or an assignment condition row as explained more completely below.

In process GET_ASICONDS_AT_EDGE, the edge passed in the call to the process is checked to determine whether the edge is the source of the control flow graph. If the edge is the source a value of "0" is returned for the set of assignment conditions. Otherwise, input node is set equal to the node that drives the edge. The subsequent operations depend upon whether the input node is (i) an operation, i.e., represents a directive statement in user description 110, (ii) a join node which does not depend on a clock edge, (iii) a join node which depends on a clock node, (iv) a join node with only one input edge, or (v) a split node. If the input node is an operation and if the variable is assigned a value in the input node, the return value for the assignment conditions are the appropriate assignment condition for the value assigned in the node. Conversely, if the variable is not assigned a value in the input node, the assignment conditions for that variable for the edge into the input node are assigned to the edge in the call this process, i.e., the assignment condition for variables not assigned a value in the node are simply passed from the node input edge to the node output edge.

If the input node is a join which is independent of a clock edge, for each input edge to the input node, the input edge is redefined as the current input edge. The input mux condition is set equal to the mux condition for the input edge. The input assignment condition for each hardware description function is set equal to the assignment condition for that hardware description function for the input edge. The intermediate value of the mux conditions is the logic AND function of the input mux condition and the input assignment condition for the hardware description function. The intermediate value of the mux conditions is saved for later used. This sequence of steps is repeated until all edges into the join node are processed. Then, the assignment condition for each hardware function for the edge in the call to process GET_ASICONDS_AT_EDGE is the logic OR function of all the saved intermediate values for that function.

If the input node is a join which depends on a clock edge, the input edge to the input node that does not depend on the clock edge, i.e., the edge with the condition "not clock edge", is ignored. Only the input edge that depends upon the clock edge is used. The input edge is defined as the input edge that includes "pos_e" in the mux condition. The input assignment condition for each hardware description function is set equal to the assignment condition for that hardware description function for the input edge. Each synchronous hardware description function assignment condition is then set equal to the corresponding asynchronous hardware description function input assignment condition and included in the return value for the edge in the call to process GET_ASICONDS_AT_EDGE. Subsequently, the asynchronous hardware description function assignment conditions are set to zero and included in the return value for the edge in the call to process GET_ASICONDS_AT_EDGE.

If the input node is either a join node with only one input edge or a split node, the input edge is redefined as the edge into the original input node. The assignment conditions for the input edge are returned as the assignment conditions for the edge in the call to process GET_ASICONDS_AT_EDGE.

In control flow graph 1500 (FIG. 25) only the variable Q is assigned a value. Thus, the following detailed description of the operation of process GET_ASICONDS_AT_EDGE only propagates assignment conditions for variable Q. However, process GET_ASICONDS_AT_EDGE can be used to propagate assignment conditions for many variables simultaneously. Also, for control flow graph 1500 the following hardware description functions are used:

AL( ) Asynchronous load

AD( ) Asynchronous data

AZ( ) Asynchronous three-state (when signal goes asynchronously to high impendance)

SL( ) Synchronous load

SD( ) Synchronous data

SZ( ) Synchronous three-state (when signal goes synchronously to high impendance)

In the more general case, the hardware description functions would include don't care function DC( ).

Initially, process GET_ASICONDS_AT_EDGE is called for edge 1000. Since edge 1000 is the source for control flow graph, line 3 (TABLE 50) returns the assignment conditions in TABLE 51 for edge 1000.

TABLE 51

| Assignment Conditions for Edge 1000 in Process GET_ASICONDS_AT_EDGE |
| --- |
| AL = 0 |
| AD = 0 |
| AZ = 0 |
| SL = 0 |
| SD = 0 |
| SZ = 0 |

Next process GET_ASICONDS_AT_EDGE is called for edge 1040. Since edge 1040 is from a split node 1020 that is defined as the input node (TABLE 50, line 5) processing goes to line 41. Line 41 sets the input edge equal to edge 1000. Line 42 sets the return value equal to the assignment conditions for edge 1000. Line 43 returns the assignment conditions in TABLE 52 for edge 1040.

TABLE 52

Assignment Conditions for Edge 1040
in Process GET_ASICONDS_AT_EDGE

AL = 0
AD = 0
AZ = 0
SL = 0
SD = 0
SZ = 0

Next process GET_ASICONDS_AT_EDGE is called for edge 1110. Since edge 1110 is from a split node 1090 that is defined as the input node (TABLE 50, line 5) processing goes to line 41. Line 41 sets the input edge equal to edge 1040. Line 42 sets the return value equal to the assignment conditions for edge 1040. Line 43 returns the assignment conditions in TABLE 53 for edge 1110.

TABLE 53

Assignment Conditions for Edge 1110
in Process GET_ASICONDS_AT_EDGE

AL = 0
AD = 0
AZ = 0
SL = 0
SD = 0
SZ = 0

Next process GET_ASICONDS_AT_EDGE is called for edge 1100. Since edge 1100 is from a split node 1090 that is defined as the input node (TABLE 50, line 5) processing goes to line 41. Line 41 sets the input edge equal to edge 1040. Line 42 sets the return value equal to the assignment conditions for edge 1040. Line 43 returns the assignment conditions in TABLE 54 for edge 1100.

TABLE 54

Assignment Conditions for Edge 1110
in Process GET_ASICONDS_AT_EDGE

AL = 0
AD = 0
AZ = 0
SL = 0
SD = 0
SZ = 0

Next process GET_ASICONDS_AT_EDGE is called for edge 1160. Since edge 1160 is from a split node 1140 that is defined as the input node (TABLE 50, line 5) processing goes to line 41. Line 41 sets the input edge equal to edge 1100. Line 42 sets the return value equal to the assignment conditions for edge 1100. Line 43 returns the assignment conditions in TABLE 55 for edge 1160.

TABLE 55

Assignment Conditions for Edge 1160
in Process GET_ASICONDS_AT_EDGE

AL = 0
AD = 0
AZ = 0
SL = 0
SD = 0
SZ = 0

Next process GET_ASICONDS_AT_EDGE is called for edge 1220. Since edge 1220 is from a split node 1200 that is defined as the input node (TABLE 50, line 5) processing goes to line 41. Line 41 sets the input edge equal to edge 1160. Line 42 sets the return value equal to the assignment conditions for edge 1160. Line 43 returns the assignment conditions in TABLE 56 for edge 1220.

TABLE 56

Assignment Conditions for Edge 1220
in Process GET_ASICONDS_AT_EDGE

AL = 0
AD = 0
AZ = 0
SL = 0
SD = 0
SZ = 0

Next process GET_ASICONDS_AT_EDGE is called for edge 1240. Since edge 1240 is from an operations node 1300 that is defined as the input node (TABLE 50, line 5) processing goes to line 6. Since the variable Q is assigned a value in node 1300, lines 7–9 define assignment conditions for functions AL( ) and AD( ). The assignment conditions in TABLE 57 are returned for edge 1240.

TABLE 57

Assignment Conditions for Edge 1240
in Process GET_ASICONDS_AT_EDGE

AL = 1
AD = input1 + input2
AZ = 0
SL = 0
SD = 0
SZ = 0

Next process GET_ASICONDS_AT_EDGE is called for edge 1310. Since edge 1310 is from join node 1230 that is defined as the input node (TABLE 50, line 5) processing goes to line 35. Line 36 sets the input edge equal to edge 1240. Line 37 sets the return value equal to the assignment conditions for edge 1240. Line 38 returns the assignment conditions in TABLE 58 for edge 1310.

TABLE 58

Assignment Conditions for Edge 1310
in Process GET_ASICONDS_AT_EDGE

AL = 1
AD = input1 + input2
AZ = 0
SL = 0
SD = 0
SZ = 0

To determine the assignment conditions at edge 1290, the assignment conditions for edges 1150 and 1180 must be determined. Thus, process GET_ASICONDS_AT_EDGE is called for edge 1150. Since edge 1150 is from a split node 1140 that is defined as the input node (TABLE 50, line 5) processing goes to line 41. Line 41 gets the input edge equal to edge 1100. Line 42 sets the return value equal to the assignment conditions for edge 1100. Line 43 returns the assignment conditions in TABLE 59 for edge 1150.

TABLE 59

| Assignment Conditions for Edge 1150 in Process GET_ASICONDS_AT_EDGE |
| --- |
| AL = 0 |
| AD = 0 |
| AZ = 0 |
| SL = 0 |
| SD = 0 |
| SZ = 0 |

Next process GET_ASICONDS_AT_EDGE is called for edge 1180. Since edge 1180 is from an operations node 1190 that is defined as the input node (TABLE 50, line 5) processing goes to line 6. Since the variable Q is assigned a value in node 1190, lines 7–9 define assignment conditions for functions AL( ) and AD( ). The assignment conditions in TABLE 60 are returned for edge 1180.

TABLE 60

| Assignment Conditions for Edge 1180 in Process GET_ASICONDS_AT_EDGE |
| --- |
| AL = 1 |
| AD = input1 |
| AZ = 0 |
| SL = 0 |
| SD = 0 |
| SZ = 0 |

Now sufficient information exists to process edge 1290 and so process GET_ASICONDS_AT_EDGE is called for edge 1290. Since the mux conditions for edges into node 1170 are independent of a clock edge processing goes to line 17 (TABLE 50) after line 5 defines the input node as node 1170. Line 18 first selects edge 1310 as an input edge for node 1170 and line 19 defines the input edge as edge 1310. Line 20 defines the input mux condition as "not normal." Line 21 defines the input assignment conditions as those for edge 1310 (TABLE 58). Line 22 forms the logic AND function of mux condition "not normal" and the assignment conditions in TABLE 58 and line 23 saves as intermediate values the assignment conditions in TABLE 61. Processing then returns to line 18.

TABLE 61

| Intermediate Value Assignment Conditions for Edge 1290 |
| --- |
| AL = (not normal) |
| AD = (input1 + input2)*(not normal) |
| AZ = 0 |
| SL = 0 |
| SD = 0 |
| SZ = 0 |

Line 18 next selects edge 1180 as an input edge for node 1170 and line 19 defines the input edge as edge 1180. Line 20 defines the input mux condition as "normal." Line 21 defines the input assignment conditions as those for edge 1180 (TABLE 60). Line 22 forms the logic AND function of mux condition "normal" and the assignment conditions in TABLE 60 and line 23 saves as intermediate values the assignment conditions in TABLE 62.

TABLE 62

| Intermediate Value Assignment Conditions for Edge 1290 |
| --- |
| AL = (normal) |
| AD = (input1)*(normal) |
| AZ = 0 |
| SL = 0 |
| SD = 0 |
| SZ = 0 |

Since edge 1180 is the last input edge for node 1170, processing goes to line 25 that defines the return value for each assignment condition as the logic OR function of the assignments conditions in TABLES 61 and 62 so that line 26 returns the assignment conditions in TABLE 63 for edge 1290.

TABLE 63

| Assignment Conditions for Edge 1290 in Process GET_ASICONDS_AT_EDGE |
| --- |
| AL = (not normal)+(normal) = 1 |
| AD = ((input1+input2)*(not normal))+((input1)*(normal)) |
| AZ = 0 |
| SL = 0 |
| SD = 0 |
| SZ = 0 |

To determine the assignment conditions at edge 1130, the assignment conditions for edges 1210 and 1270 must be determined. Thus, process GET_ASICONDS_AT_EDGE is called for edge 1210. Since edge 1210 is from a split node 1200 that is defined as the input node (TABLE 50, line 5) processing goes to line 41. Line 41 sets the input edge equal to edge 1160. Line 42 sets the return value equal to the assignment conditions for edge 1160. Line 43 returns the assignment conditions in TABLE 64 for edge 1210.

TABLE 64

| Assignment Conditions for Edge 1210 in Process GET_ASICONDS_AT_EDGE |
| --- |
| AL = 0 |
| AD = 0 |
| AZ = 0 |
| SL = 0 |
| SD = 0 |
| SZ = 0 |

Next process GET_ASICONDS_AT_EDGE is called for edge 1270. Since edge 1270 is from an operations node 1260 that is defined as the input node (TABLE 50, line 5) processing goes to line 6. Since the variable Q is assigned a value in node 1260, lines 7–9 define assignment conditions for functions AL( ), AD( ) and AZ( ). The assignment conditions in TABLE 65 are returned for edge 1270.

TABLE 65

| Assignment Conditions for Edge 1270 in Process GET_ASICONDS_AT_EDGE |
| --- |
| AL = 1 |
| AD = 0 |
| AZ = 1 |
| SL = 0 |
| SD = 0 |
| SZ = 0 |

Now sufficient information exists to process edge 1130 and so process GET_ASICONDS_AT_EDGE is called for edge 1130. Since the mux conditions for both edges into node 1280 are independent of a clock edge, processing proceeds line 17 (TABLE 50) after line 5 defines the input node as node 1280. Line 18 first selects edge 1290 as an input edge for node 1280 and line 19 defines the input edge as edge 1290. Line 20 defines the input mux condition as "(normal)+(not normal)*(not abort)." Line 21 defines the input assignment conditions as those for edge 1290 (TABLE 61). Line 22 forms the logic AND function of mux condition "(normal)+(not normal)*(not abort)" and the assignment conditions in TABLE 61 and line 23 saves as intermediate values the assignment conditions in TABLE 66. Processing then returns to line 18.

TABLE 66

Intermediate Value Assignment Conditions
for Edge 1130
AL = (normal) + (not normal)*(not abort)
AD = ((normal)+(not normal)*(not
    abort))*(((input1+input2)*(not
    normal))+((input1)*(normal))) =
    ((input1+input2)*(not normal)*(not
    abort)) +((input1)*(normal))
AZ = 0
SL = 0
SD = 0
SZ = 0

Line 18 next selects edge 1270 as an input edge for node 1280 and line 19 defines the input edge as edge 1270. Line 20 defines the input mux condition as "(not normal)*(abort)." Line 21 defines the input assignment conditions as those for edge 1270 (TABLE 65). Line 22 forms the logic AND function of mux condition "(not normal)*(abort)" and the assignment conditions in TABLE 65 and line 23 saves as intermediate values the assignment conditions in TABLE 67.

TABLE 67

Intermediate Value Assignment Conditions
for Edge 1130
AL = (not normal)*(abort)
AD = 0
AZ = (not normal)*(abort)
SL = 0
SD = 0
SZ = 0

Since edge 1270 is the last input edge for node 1280, processing goes to line 25 that defines the return value for each assignment conditions as the logic OR function of the assignments conditions in TABLES 66 and 67 so that line 26 returns the assignment conditions in TABLE 68 for edge 1130.

TABLE 68

Assignment Conditions for Edge 1130
in Process GET_ASICONDS_AT_EDGE
AL = (normal)+((not normal)*(not
    abort))+((not normal)*(abort)) = 1
AD = ((input1+input2)*(not normal)*(not
    abort))+ ((input1) * (normal))
AZ = (not normal)*(abort)
SL = 0
SD = 0
SZ = 0

Sufficient information exists to process edge 1070 because both edges leading into join node 1120 were previously processed by process GET_ASICONDS_AT_ EDGE and so process GET_ASICONDS_AT_EDGE is called for edge 1070. Since the mux condition for one of the edges, edge 1130, into node 1120 is dependent on a clock edge, the mapping previously described is performed. Hence, processing proceeds to line 28 (TABLE 50) after line 5 defines the input node as node 1120. Line 29 defines the input edge as edge 1130 because the mux condition for edge 1130 includes "pos_e." Line 30 defines the input assignment conditions as those for edge 1130 (TABLE 68). Line 31 maps the asynchronous assignment conditions to the synchronous assignment conditions and line 32 sets the asynchronous assignment conditions to zero. Hence, line 33 returns the assignment conditions in TABLE 69 for edge 1070.

TABLE 69

Assignment Conditions for Edge 1070
in Process GET_ASICONDS_AT_EDGE
AL = 0
AD = 0
AZ = 0
SL = 1
SD = ((input1+input2)*(not normal)*(not
    abort))+ ((input1)*(normal))
SZ = (not normal)*(abort)

To determine the assignment conditions at edge 1010, the assignment conditions for edges 1030 and 1060 must be determined. Thus, process GET_ASICONDS_AT_EDGE is called for edge 1030. Since edge 1030 is from a split node 1020 that is defined as the input node (TABLE 50, line 5) processing goes to line 41. Line 41 sets the input edge equal to edge 1000. Line 42 sets the return value equal to the assignment conditions for edge 1000. Line 43 returns the assignment conditions in TABLE 70 for edge 1030.

TABLE 70

Assignment Conditions for Edge 1030
in Process GET_ASICONDS_AT_EDGE
AL = 0
AD = 0
AZ = 0
SL = 0
SD = 0
SZ = 0

Next process GET_ASICONDS_AT_EDGE is called for edge 1060. Since edge 1060 is from an operation node 1080 processing goes to line 6. Since the variable Q is assigned a value in node 1080, lines 7–9 define assignment conditions for function AL( ) and AD( ). The assignment conditions in TABLE 71 are returned for edge 1060.

TABLE 71

Assignment Conditions for Edge 1060
in Process GET_ASICONDS_AT_EDGE
AL = 1
AD = 0
AZ = 0
SL = 0
SD = 0
SZ = 0

Now sufficient information exists to process edge 1010 and so process GET_ASICONDS_AT_EDGE is called for edge 1010. Since the mux conditions for both edges into node 1050 are independent of a clock edge processing proceeds to line 17 (TABLE 50) after line 5 defines the input node as node 1050. Line 18 first selects edge 1070 as an input edge for node 1050 and line 19 defines the input edge as edge 1070. Line 20 defines the input mux condition as "(not reset)." Line 21 defines the input assignment conditions as those for edge 1070 (TABLE 69). Line 22 forms the logic AND of mux condition "(not reset)" and the assignment conditions in TABLE 69 and line 23 saves as intermediate values the assignment conditions in TABLE 72. Processing then returns to line 18.

TABLE 72

| Intermediate Value Assignment Conditions for Edge 1010 |
|---|
| AL = 0 |
| AD = 0 |
| AZ = 0 |
| SL = (not reset) |
| SD = (not reset)*(((input1+input2)*(not normal)*(not abort))+((input1)*(normal))) |
| SZ = (not reset)*(not normal)*(abort) |

Line 18 next selects edge 1060 as an input edge for node 1050 and line 19 defines the input edge as edge 1060. Line 20 defines the input mux condition as "(reset)." Line 21 defines the input assignment conditions as those for edge 1060 (TABLE 71). Line 22 forms the logic AND function of mux condition "(reset)" and the assignment conditions in TABLE 71. Line 23 saves as intermediate values the assignment conditions in TABLE 73.

TABLE 73

| Intermediate Value Assignment Conditions for Edge 1060 |
|---|
| AL = reset |
| AD = 0 |
| AZ = 0 |
| SL = 0 |
| SD = 0 |
| SZ = 0 |

Since edge 1060 is the last input edge for node 1050, processing goes to line 25 that defines the return value for each assignment conditions as the logic OR function of the asssignments conditions in TABLES 72 and 73 so that line 26 returns the assignment conditions in TABLE 74 for edge 1010.

TABLE 74

| Assignment Conditions for Edge 1010 in Process GET_ASICONDS_AT_EDGE |
|---|
| AL = reset |
| AD = 0 |
| AZ = 0 |
| SL = (not reset) |
| SD = (not reset)*(((input1+input2)*(not normal)*(not abort))+((input1)*(normal))) |
| SZ = (not reset)*(not normal)*(abort) |

Since the processing of edge 1010 completes the processing of the edges in control flow graph 1500, the final assignment conditions for edge 1010 (TABLE 74) are used by hardware generator 124B in logic circuit generator 124. As described above, since assignment condition AL(Q) and SL(Q) are non-zero, at least a flip-flop 344-1 (FIG. 26) with a clear direct terminal is required. Since assignment condition SZ(Q) is also non-zero, two flip-flops 344-1, 344-2 are required. However, prior to constructing the actual logic circuit, each of the boolean minimization described above are performed. First assignment condition AD(Q) is minimized with NOT assignment condition AL(Q) as a don't care condition. Since condition AD(Q) is zero, the result, assignment condition AD(Q)', is zero. Similarly, when assignment condition AD(Q)' is minimized with assignment condition AZ(Q) as a don't care condition, the result is again zero. Thus, the first flip-flop does not require a set direct terminal because the optimized assignment condition AD(Q)" is zero.

Similarly, since assignment condition AZ(Q) is zero, the minimization of assignment condition AZ(Q) with NOT assignment condition AL(Q) as a don't care condition gives the optimized assignment condition AZ(Q)' as a value of zero. Thus, a set-direct pin is not required on the second flip-flop associated with assignment condition SZ(Q). Thus, assignment condition AL(Q) drives the clear-direct terminal of flip-flops 344-1, 344-2.

Next assignment condition SL(Q) is boolean minimized with assignment condition AL(Q) as a don't care conditions. Optimized assignment condition SL(Q)' has the value of 1. Thus, the feedback multiplexer used when the assignment condition for function SL( ) is not a constant is not required.

Figure 26:
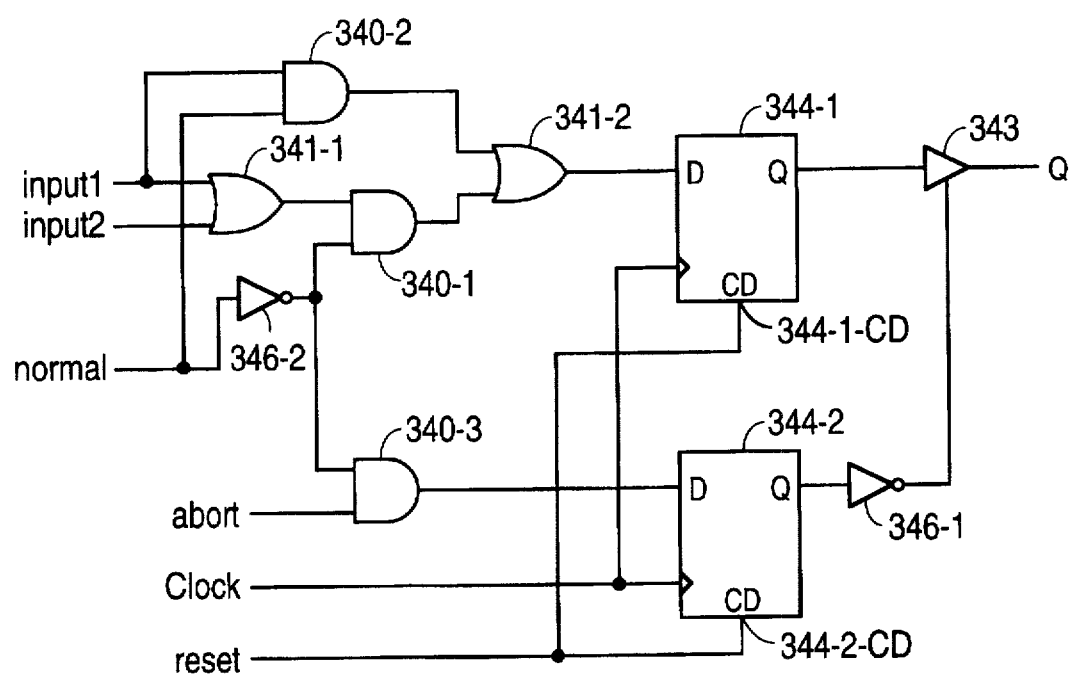
FIG. 26 illustrates a logic circuit created by logic circuit generator 124 for the user description in Table 46.

Boolean minimization of assignment condition SD(Q) with assignment condition AL(Q) as a don't care condition and boolean minimization of the result with assignment condition SZ(Q) as a don't care condition gives assignment condition SD(Q)" with a value of "((input1+input2)*(not normal))+((input1)*(normal))". Thus, logic is built to generate assignment condition SD(Q)" as shown in FIG. 26 and the output signal from OR gate 341-2 drives the input line of flip-flop 344-1.

Finally, assignment condition SZ(Q) is boolean minimized with assignment condition AL(Q) as a don't care condition and boolean minimization of the result with NOT assignment condition SL(Q) as a don't care condition gives assignment condition SZ(Q)" with a value of "(not normal)*(abort)." Again, logic elements are used to generate assignment condition SZ(Q)" and the output signal of AND gate 340-3 drives the data input line of flip-flop. Thus, synthesizer 120 has changed user description in TABLE 46 that contains only operational results into two complex logic elements and the associated logic nodes shown in FIG. 26.

Figure 27A:
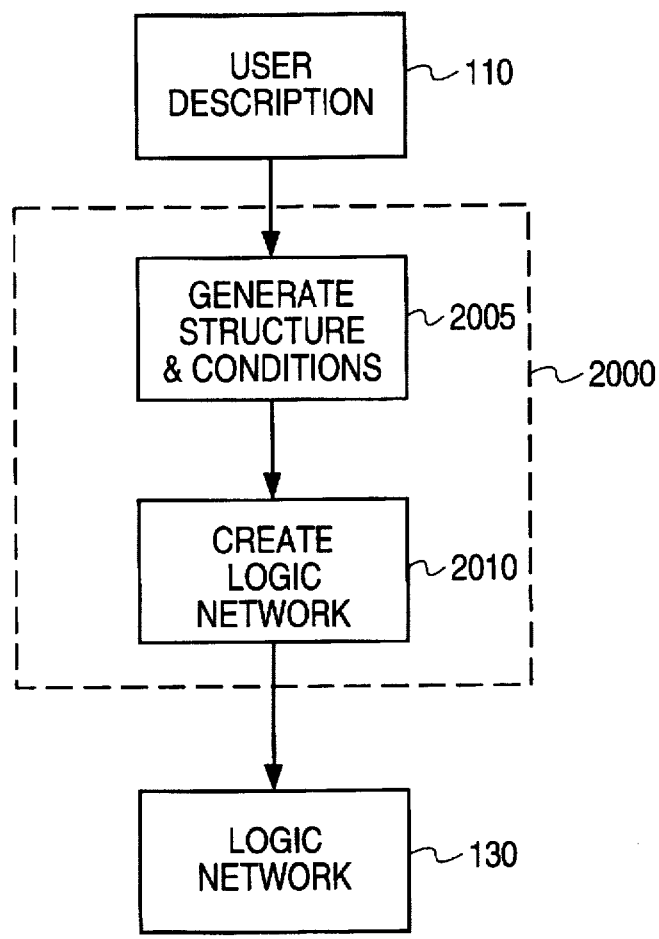
FIGS. 27A, 27B, and 27C are block diagrams of one embodiment of the method of this invention.

According to the principles of this invention, a method 2000 (FIG. 27A) is provided for generating a logic network using a hardware independent description means. In this method, a user description 110 specifying only signals and the circumstances under which the signals are obtained is used to generate a logic network, e.g., a net list of logic elements such as logic gates, high impedance drivers, level sensitive latches and, edge sensitive flip-flops along with the interconnections of the logic elements, that generates the signals specified in the user description.

In one embodiment, method 2000 includes two steps 2005, 2010. In first step 2005, the signals and circumstances under which the signals are generated are converted to a structure having nodes interconnected by edges. A condition that indicates the condition under which the edge is traversed is generated for selected edges in the structure. In second step 2010, the structure and the conditions created in the first step are used to create a logic network 130 that generates the signals specified in user description 110.

As described more completely above and incorporated herein by reference, user description 110 is a sequence of statements that specify how the desired digital hardware operates. Specifically, user description 110 describes values assigned to logic variables and the circumstances under which those values are assigned wherein each logic variable assigned a value represents a signal. Specification of any specific logic element, such as a flip-flop, or any connections between logic elements to generate the desired signals is not required in user description 110.

Consequently, in method 2000 of this invention, logic network 130 is not created as in the prior art where the choice of logic components for the synthesis was stated at least partially explicitly in the user description, but rather where the choice of logic components is implied by the signals specified in description 110. Such descriptions are easier to produce, understand, and maintain than the typical prior art description so that the user realizes significant savings in the cost of designing digital hardware.

Figure 27B:
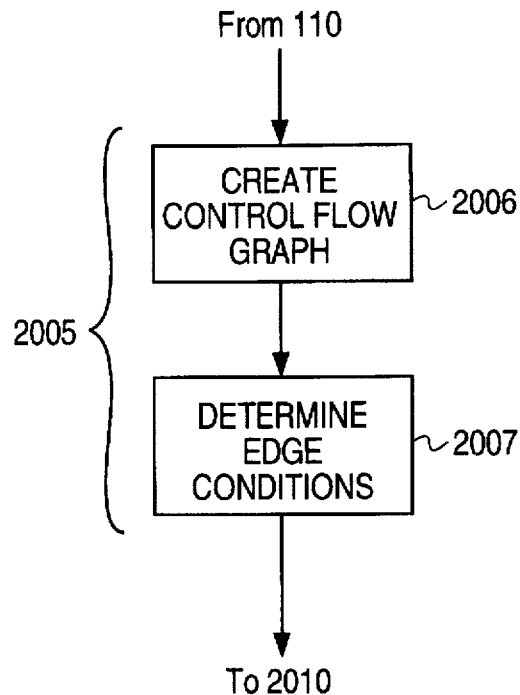

In one embodiment, first step 2005 includes (i) a step 2006 (FIG. 27B) creating a control flow graph having nodes and edges, and in particular split nodes, join nodes, and operation nodes. The control flow graph may include edges that go from one node in the graph to any other subsequent node in the graph. The ability to jump from one node to any subsequent node in the graph represents a significant enhancement in the capability of the control flow graph to represent a wide variety of user descriptions.

After generation of the control flow graph, step 2007 within first step 2005 determines edge conditions for edges in the control flow graph. Specifically, for each edge in the control flow graph, the conditions that must be satisfied to reach that edge in the graph are determined and assigned to the edge. The condition generated is an "activation condition" in one embodiment and a "mux condition" in another embodiment as previously described and incorporated herein by reference.

Figure 27C:
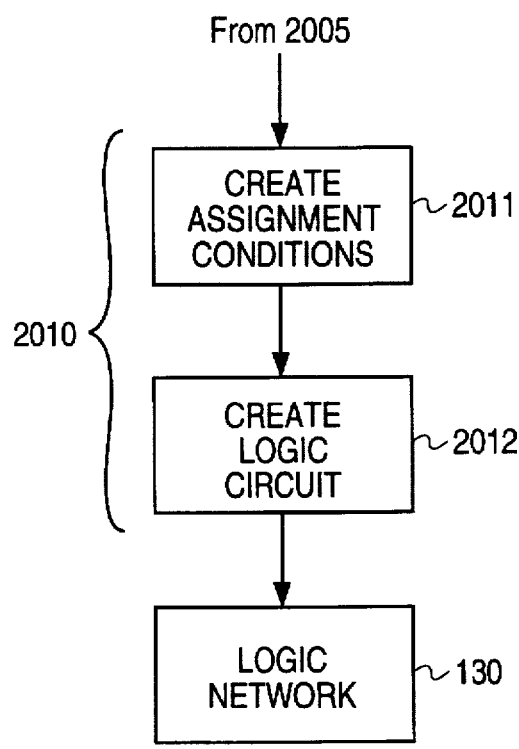

In second step 2010 of the method, the edge activation conditions, or alternatively the mux conditions, and information associated with the nodes of the control flow graph are used to create logic network 130. In one embodiment, a set of assignment conditions for each variable assigned a value in the control flow graph, i.e., each signal specified by the user are created in step 2011 (FIG. 27C). The assignment conditions for a set of hardware description functions, are subsequently used in step 2012 to create a logic network 130 that generates the signals represented by the logic variables in the control flow graph.

Hence, according to the principles of this invention, in method 2000, a logic circuit for each variable that is assigned a value in user description 110, i.e., each signal specified by the user is created and the logic circuits are interconnected to form logic network 130 that generates the specified signals under the conditions specified by the user. In one embodiment, an assignment condition for each function in a set of functions is determined for each variable that is assigned a value in the user description. The previous discussion of assignment conditions and hardware description functions are incorporated herein by reference.

As previously explained, in one embodiment the set of functions includes a group of asynchronous functions and a group of synchronous functions. If the assignment conditions for the group of synchronous functions from step 2011 are all zero, the asynchronous functions and assignment conditions are used in step 2012 to create logic circuits that include logic nodes such as AND and OR gates and invertors as well as complex logic elements such as three-state drivers and level sensitive latches. The predetermined set of assignment conditions used to create specific logic circuits for the asynchronous signals was described above and is incorporated herein by reference. Similarly, if the assignment conditions for the group of asynchronous functions from step 2011 are all zero, the synchronous functions and assignment conditions are used to create logic circuits that include logic nodes such as AND and OR gates and invertors as well as complex logic elements such as three-state drivers and edge-triggered flip-flops. When the assignment conditions from step 2011 include non-zero assignment conditions for both the synchronous and asynchronous functions, logic circuits are created in step 2012 that may include logic nodes such as AND and OR gates and invertors as well as complex logic elements such as three-state drivers, and edge-triggered flip-flops. Also, in this case, the edge-triggered flip-flops may include a clear-direct terminal and a set-direct terminal. Again, the predetermined set of conditions used to generate specific logic circuits was described above and is incorporated herein by reference.

Hence, in this method a logic circuit is synthesized based upon the information provided by the assignment conditions. However, the assignment conditions are boolean minimized in step 2011 prior to creation of the logic circuit as described above and incorporated herein by reference. As explained, above the assignment conditions, in one embodiment, are the boolean minimized values of a set hardware description functions. In this method, the hardware description functions, the hardware created for the various values, and the boolean optimizations, as described above and incorporated herein by reference, are utilized in the logic network generating step.

The various embodiments of the structure and method of this invention that are described above are illustrative only of the principles of this invention and are not intended to limit the scope of the invention to the particular embodiments described. In view of this disclosure, those skilled-in-the-art can define other flow control styles, other edge conditions, other hardware description functions, other combinations of assignment conditions, other logic elements that may be created, other minimization techniques other than boolean logic, circuits other than digital circuits, and running in a non-computer environment, and use these alternative features to create logic networks according to the principles of this invention.

We claim:

1. A method for converting a hardware independent user description of a logic circuit, that includes flow control statements, and directive statements that define levels of logic signals, into logic circuit hardware components comprising:

converting a flow control statement and a directive statement in the user description for a logic signal Q into an assignment condition for at least one of a plurality of functions including an asynchronous load function AL( ), an asynchronous data function AD( ), and a high impendance function Z( ); and generating a hardware element using said assignment condition, wherein a type of said hardware element and a configuration of said hardware element is dependent upon the assignment condition.

2. A method for converting a hardware independent user description of a logic circuit, that includes flow control statements, and directive statements that define levels of logic signals, into logic circuit hardware components as in claim 1 wherein said plurality of functions further comprises a synchronous load function SL( ), and a synchronous data function SD( ).

3. A method for converting a hardware independent user description of a logic circuit, that includes flow control statements, and directive statements that define levels of logic signals, into logic circuit hardware components as in claim 2 wherein said plurality of functions further comprises a don't care function DC( ).

4. A method for converting a hardware independent user description of a logic circuit, that includes flow control statements, and directive statements that define levels of logic signals, into logic circuit hardware components as in claim 1 wherein said plurality of functions further comprises a don't care function DC( ).

5. A method for converting a hardware independent user description of a logic circuit, that includes flow control statements, and directive statements that define levels of logic signals, into logic circuit hardware components as in claim 1 further comprising;

boolean minimizing said assignment condition with a complement of another assignment condition as a don't care condition prior to performing said generating a hardware element.

6. A method for converting a hardware independent user description of a logic circuit, that includes flow control statements, and directive statements that define levels of logic signals, into logic circuit hardware components as in claim 1 further comprising:

boolean minimizing said assignment condition with another assignment condition as a don't care condition to obtain a new assignment condition when both said assignment conditions are not zero.

7. A method for converting a hardware independent user description of a logic circuit, that includes flow control statements, and directive statements that define levels of logic signals, into logic circuit hardware components as in claim 6 further comprising:

boolean minimizing said new assignment condition with a complement of yet another assignment condition as a don't care condition when said yet another assignment condition is not a constant to obtain a second new assignment condition.

8. A method for converting a hardware independent user description of a logic circuit, that includes flow control statements, and directive statements that define levels of logic signals, into logic circuit hardware components comprising:

converting a flow control statement and a directive statement in the user description for a logic signal Q into an assignment condition for at least one of a plurality of functions including a synchronous load function SL( ), a synchronous data function SD( ), and a high impendance function Z( ); and generating a hardware element using said assignment condition, wherein a type of said hardware element and a configuration of said hardware element is dependent upon the assignment condition.

9. A method for converting a hardware independent user description of a logic circuit, that includes flow control statements, and directive statements that define levels of logic signals, into logic circuit hardware components as in claim 8 wherein said plurality of functions further comprises an asynchronous load function A( ), and an asynchronous data function AD( ).

10. A method for converting a hardware independent user description of a logic circuit, that includes flow control statements, and directive statements that define levels of logic signals, into logic circuit hardware components as in claim 9 wherein said plurality of functions further comprises a don't care function DC( ).

11. A method for converting a hardware independent user description of a logic circuit, that includes flow control statements, and directive statements that define levels of logic signals, into logic circuit hardware components as in claim 8 wherein said plurality of functions further comprises a don't care function DC( ).

12. A method for converting a hardware independent user description of a logic circuit, that includes flow control statements, and directive statements that define levels of logic signals, into logic circuit hardware components as in claim 8 further comprising;

boolean minimizing said assignment condition with a complement of another assignment condition as a don't care condition prior to performing said generating a hardware element.

13. A method for converting a hardware independent user description of a logic circuit, that includes flow control statements, and directive statements that define levels of logic signals, into logic circuit hardware components as in claim 8 further comprising:

boolean minimizing said assignment condition with another assignment condition as a don't care condition to obtain a new assignment condition when both said assignment conditions are not zero.

14. A method for converting a hardware independent user description of a logic circuit, that includes flow control statements, and directive statements that define levels of logic signals, into logic circuit hardware components as in claim 13 further comprising:

boolean minimizing said new assignment condition with a complement of yet another assignment condition as a don't care condition when said yet another assignment condition is not a constant to obtain a second new assignment condition.

* * * * *